United States Patent
Lee et al.

(10) Patent No.: US 12,224,334 B2
(45) Date of Patent: *Feb. 11, 2025

(54) SEMICONDUCTOR DEVICE WITH GATE DIELECTRIC FORMED USING SELECTIVE DEPOSITION

(71) Applicants: TAIWAN SEMICONDUCTOR MANUFACTURING CO., LTD., Hsinchu (TW); NATIONAL TAIWAN UNIVERSITY, Taipei (TW); NATIONAL TAIWAN NORMAL UNIVERSITY, Taipei (TW)

(72) Inventors: Tung-Ying Lee, Hsinchu (TW); Tse-An Chen, Taoyuan (TW); Tzu-Chung Wang, Hsinchu (TW); Miin-Jang Chen, Taipei (TW); Yu-Tung Yin, Taipei (TW); Meng-Chien Yang, Taoyuan (TW)

(73) Assignees: TAIWAN SEMICONDUCTOR MANUFACTURING CO., LTD., Hsinchu (TW); NATIONAL TAIWAN UNIVERSITY, Hsinchu (TW); NATIONAL TAIWAN NORMAL UNIVERSITY, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,636

(22) Filed: May 26, 2023

(65) Prior Publication Data

US 2023/0317820 A1  Oct. 5, 2023

Related U.S. Application Data

(63) Continuation of application No. 17/586,083, filed on Jan. 27, 2022, now Pat. No. 11,699,739, which is a
(Continued)

(51) Int. Cl.
*H01L 21/28* (2006.01)
*H01L 21/02* (2006.01)
(Continued)

(52) U.S. Cl.
CPC .... *H01L 29/6653* (2013.01); *H01L 21/02603* (2013.01); *H01L 21/28141* (2013.01);
(Continued)

(58) Field of Classification Search
CPC ......... H01L 21/02603; H01L 21/28141; H01L 21/823431; H01L 21/823821;
(Continued)

(56) References Cited

U.S. PATENT DOCUMENTS 9,711,608 B1 7/2017 Duriez et al.
10,211,307 B2 2/2019 Ching et al.
(Continued)

FOREIGN PATENT DOCUMENTS

CN 107464840 A 12/2017
CN 109273362 A 1/2019

OTHER PUBLICATIONS

Yuxing Li et al., "A Ferroelectric Thin Film Transistor Based on Annealing-Free HfZrO Film", IEEE Journal of the Electron Devices Society, vol. 5, No. 5, Sep. 2017, pp. 378-383.

*Primary Examiner* — David C Spalla
(74) *Attorney, Agent, or Firm* — Maschoff Brennan

(57) ABSTRACT

A semiconductor device includes a plurality of semiconductor layers arranged one above another, and source/drain epitaxial regions on opposite sides of the plurality of semiconductor layers. The semiconductor device further includes a gate structure surrounding each of the plurality of semiconductor layers. The gate structure includes interfacial layers respectively over the plurality of semiconductor layers, a high-k dielectric layer over the interfacial layers, and
(Continued)

a gate metal over the high-k dielectric layer. The gate structure further includes gate spacers spacing apart the gate structure from the source/drain epitaxial regions. A top position of the high-k dielectric layer is lower than top positions of the gate spacers.

20 Claims, 53 Drawing Sheets

Related U.S. Application Data continuation of application No. 16/844,809, filed on Apr. 9, 2020, now Pat. No. 11,245,024.

(51) Int. Cl.
*H01L 29/06* (2006.01)
*H01L 29/423* (2006.01)
*H01L 29/66* (2006.01)
*H01L 29/78* (2006.01)
*H01L 29/786* (2006.01)

(52) U.S. Cl.
CPC .... *H01L 29/0673* (2013.01); *H01L 29/42392* (2013.01); *H01L 29/66545* (2013.01); *H01L 29/66742* (2013.01); *H01L 29/66795* (2013.01); *H01L 29/7851* (2013.01); *H01L 29/78696* (2013.01)

(58) Field of Classification Search
CPC ............... H01L 21/845; H01L 27/0886; H01L 27/0924; H01L 27/1211; H01L 29/0653; H01L 29/0665; H01L 29/0669; H01L 29/0673; H01L 29/41791; H01L 29/42392; H01L 29/66439; H01L 29/6653; H01L 29/66553; H01L 29/66545; H01L 29/6656; H01L 29/66742; H01L 29/66795; H01L 29/775; H01L 29/785; H01L 29/7851; H01L 29/7853; H01L 29/7855; H01L 29/78696; H01L 2029/7858
See application file for complete search history.

(56) References Cited

U.S. PATENT DOCUMENTS

| | | | |
|---|---|---|---|
| 10,269,965 | B1 | 4/2019 | Chen et al. |
| 11,245,024 | B2* | 2/2022 | Lee .................. H01L 29/66795 |
| 2005/0020020 | A1 | 1/2005 | Collaert et al. |
| 2015/0137271 | A1 | 5/2015 | Cai et al. |
| 2017/0053915 | A1 | 2/2017 | Ando et al. |
| 2018/0182868 | A1 | 6/2018 | Chan et al. |
| 2018/0337266 | A1* | 11/2018 | Ohtou ................. H01L 29/7855 |
| 2019/0067418 | A1* | 2/2019 | Yang ................. H01L 29/78618 |
| 2019/0164817 | A1 | 5/2019 | Khaderbad et al. |
| 2020/0058770 | A1 | 2/2020 | Colinge et al. |
| 2020/0119003 | A1 | 4/2020 | Mistkawi et al. |
| 2020/0335346 | A1 | 10/2020 | Ouyang et al. |
| 2021/0013111 | A1 | 1/2021 | Smith et al. |

* cited by examiner

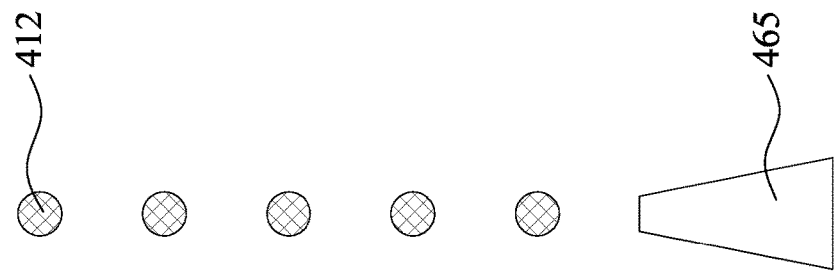
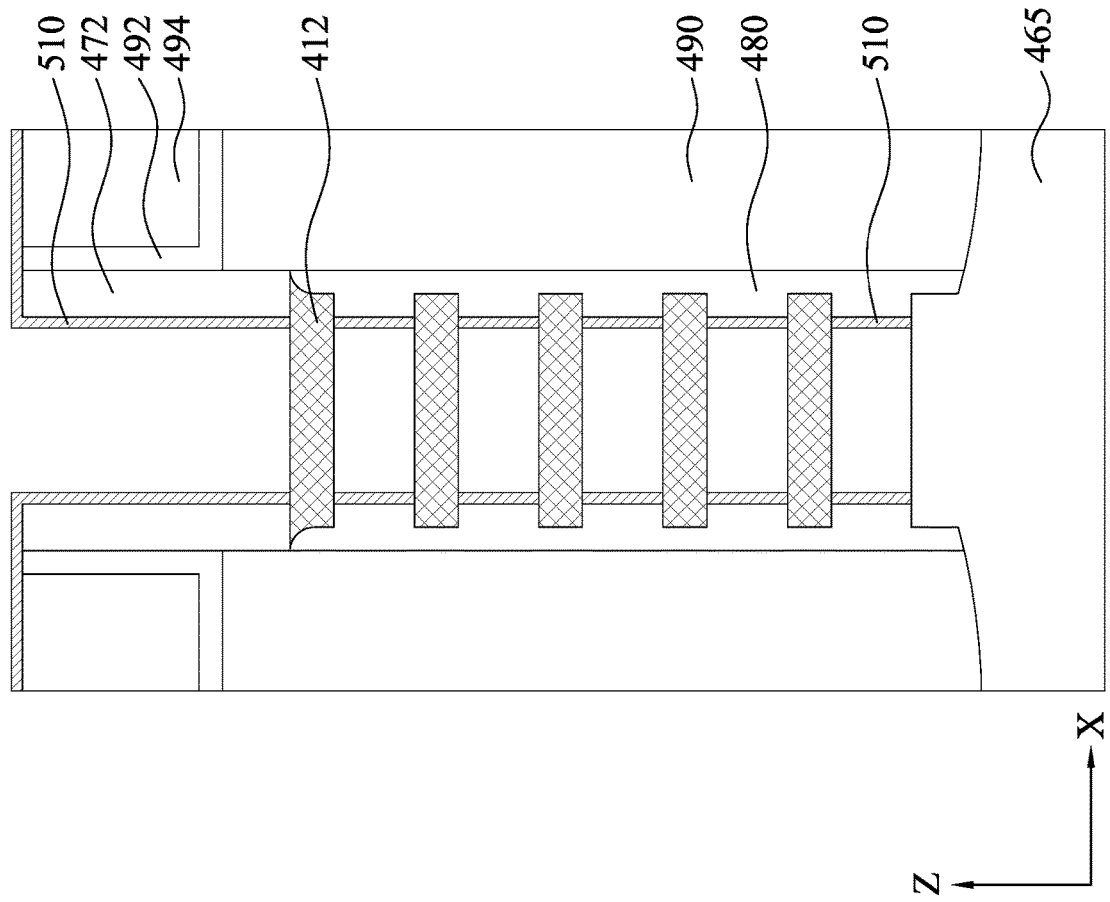
Fig. 39A
Fig. 39B

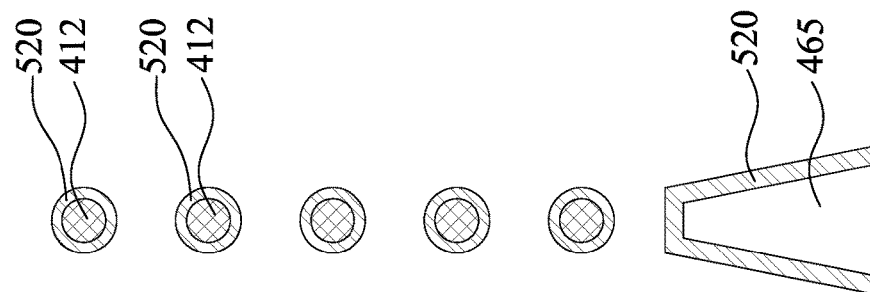
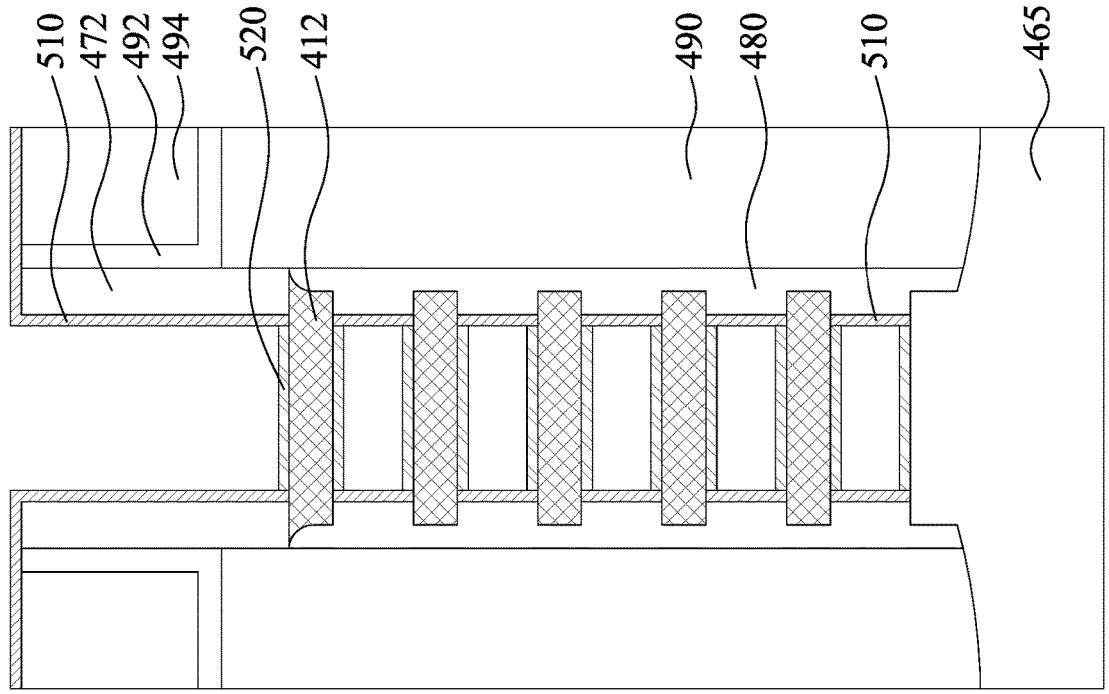
Fig. 40A
Fig. 40B

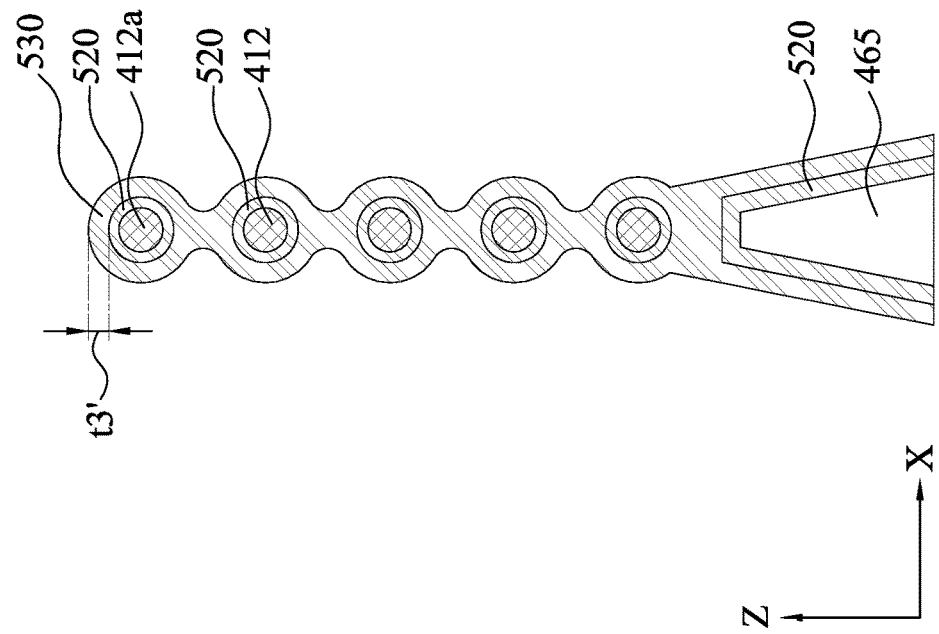
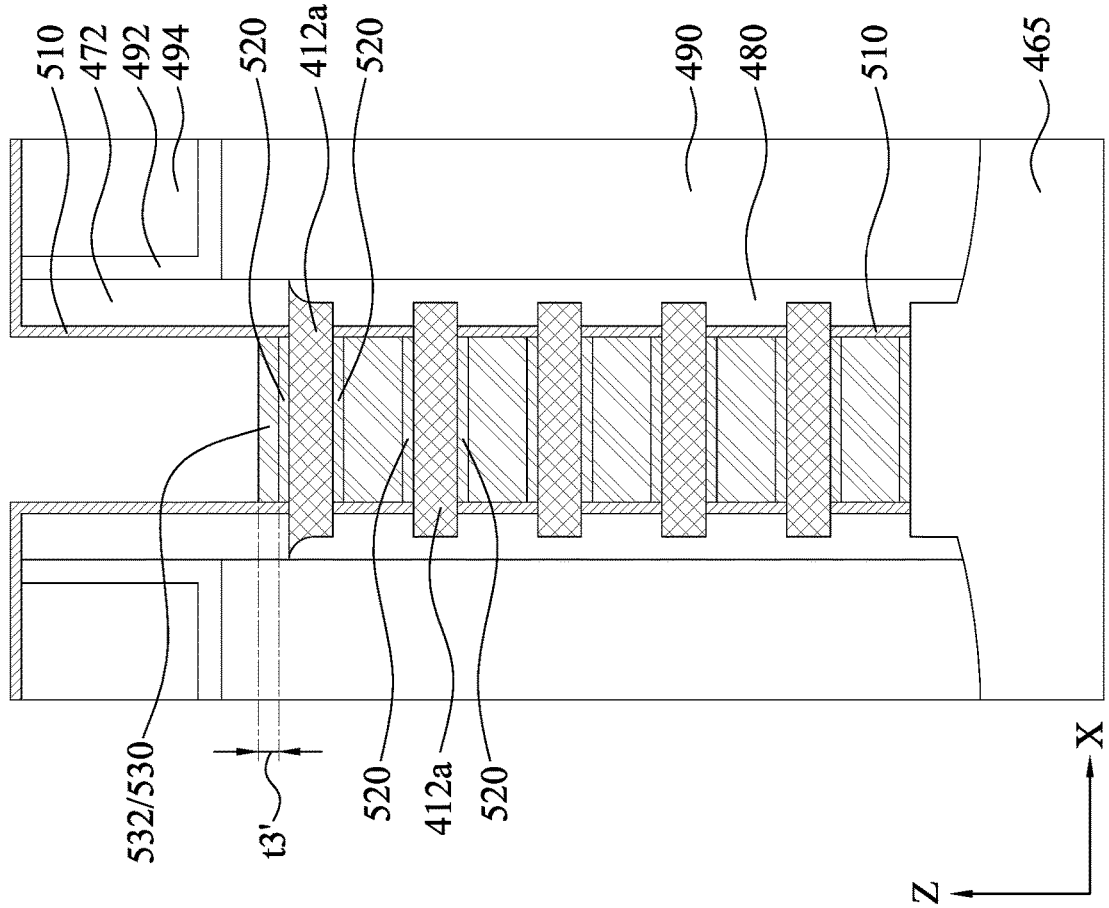
Fig. 42A
Fig. 42B

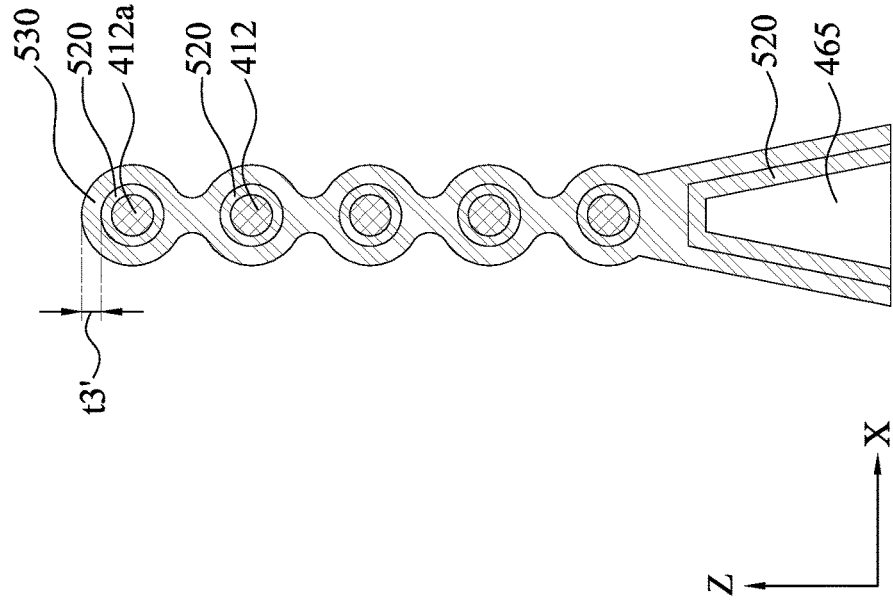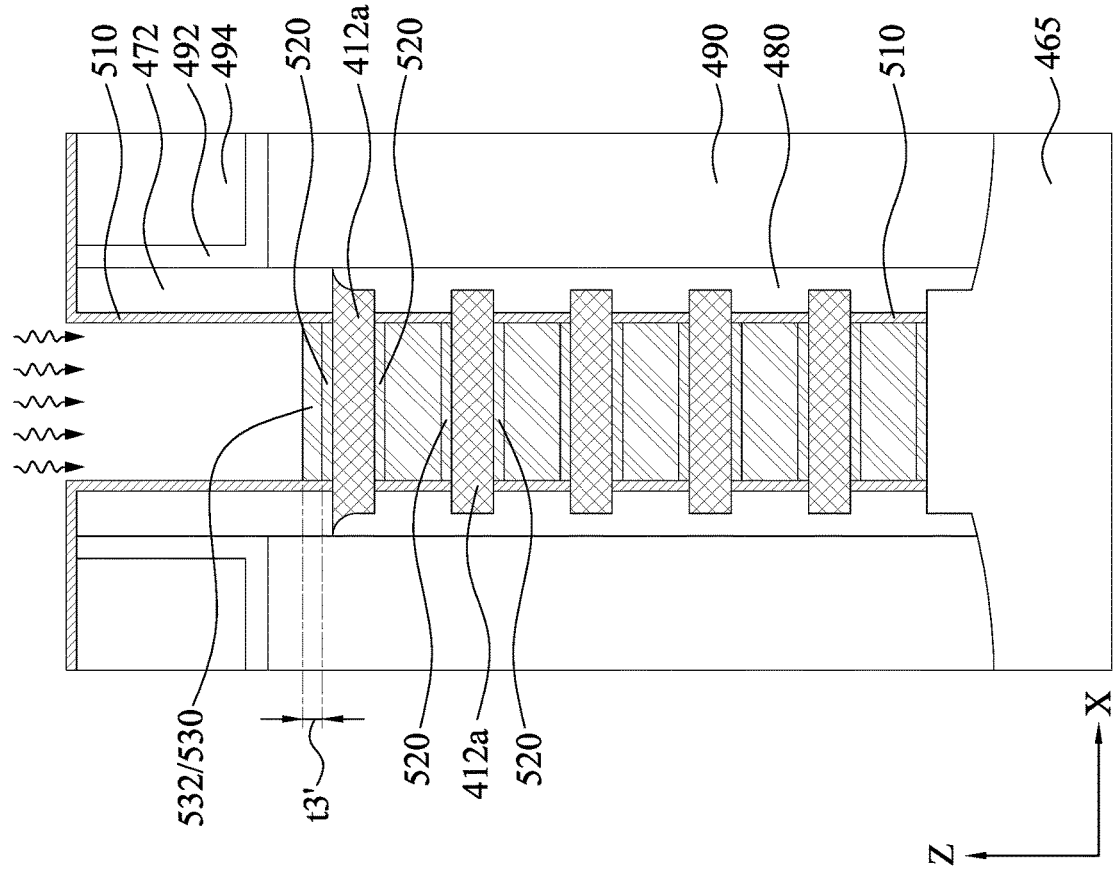

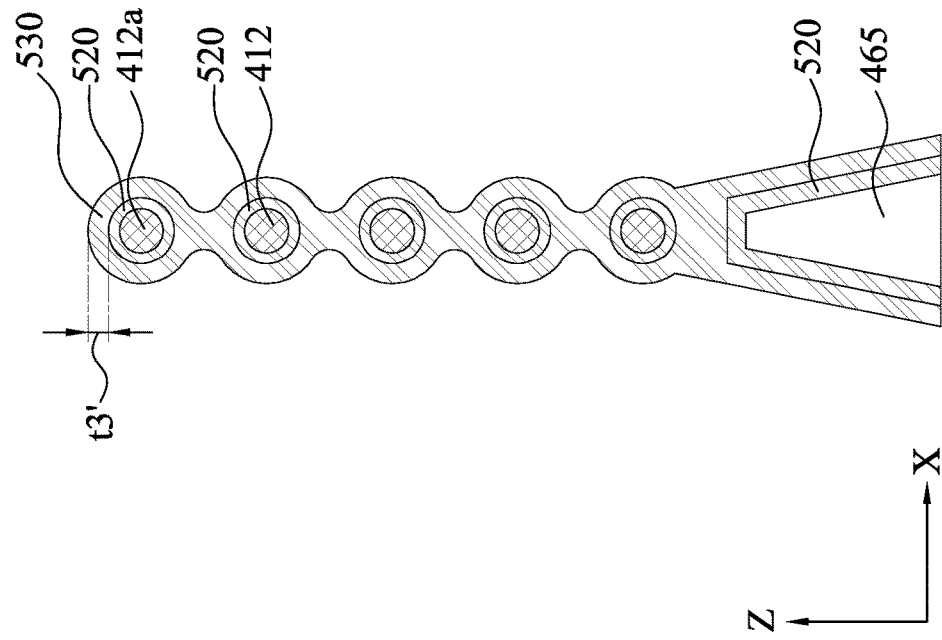
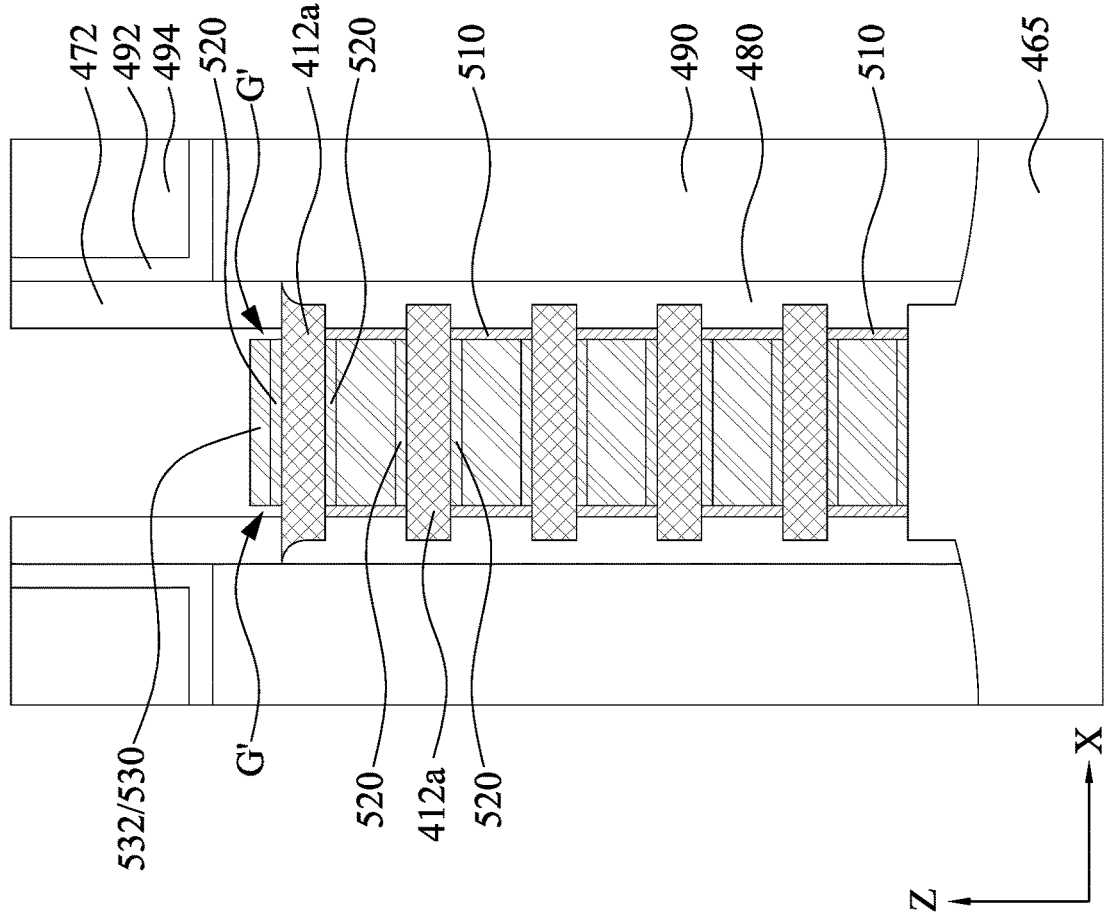
Fig. 44A
Fig. 44B

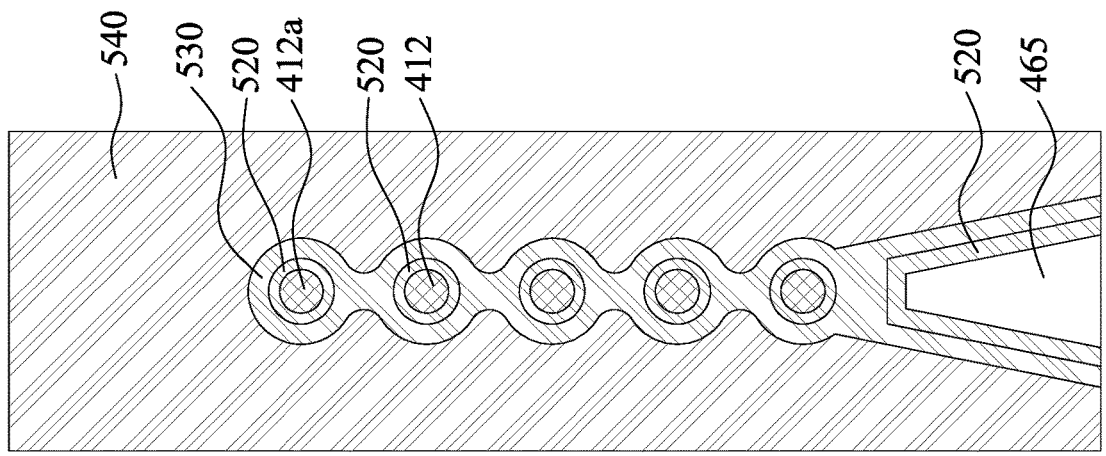
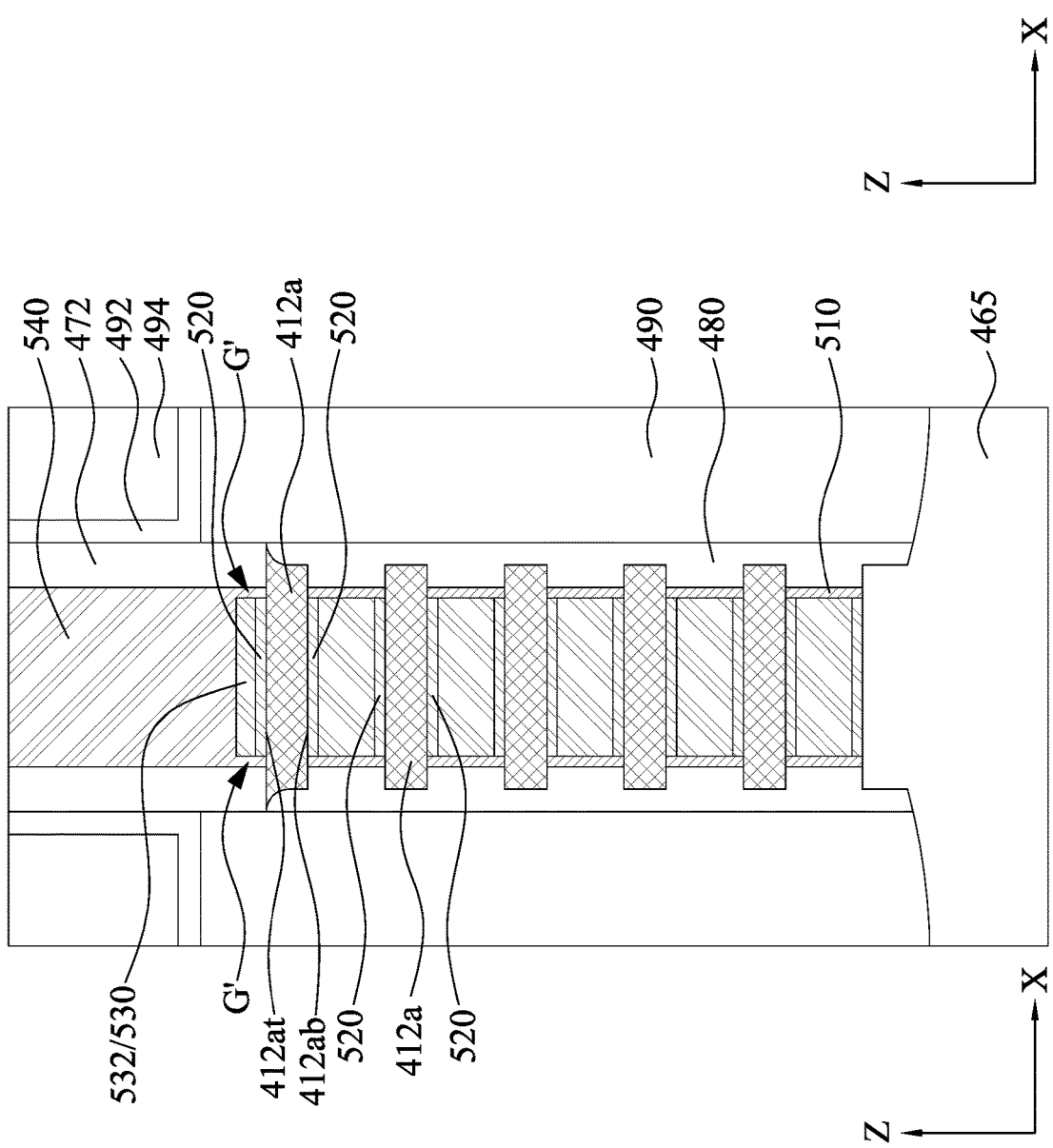

SEMICONDUCTOR DEVICE WITH GATE DIELECTRIC FORMED USING SELECTIVE DEPOSITION

RELATED APPLICATIONS

The present application is a Continuation application of U.S. application Ser. No. 17/586,083, filed on Jan. 27, 2022, which is a Continuation application of U.S. application Ser. No. 16/844,809, filed on Apr. 9, 2020, now U.S. Pat. No. 11,245,024, issued on Feb. 8, 2022, all of which are herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 39A to FIG. 46B are various cross-sectional views of a GAA device at different stages of fabrication, according to some embodiments of the disclosure.

DETAILED DESCRIPTION

Figure 1:
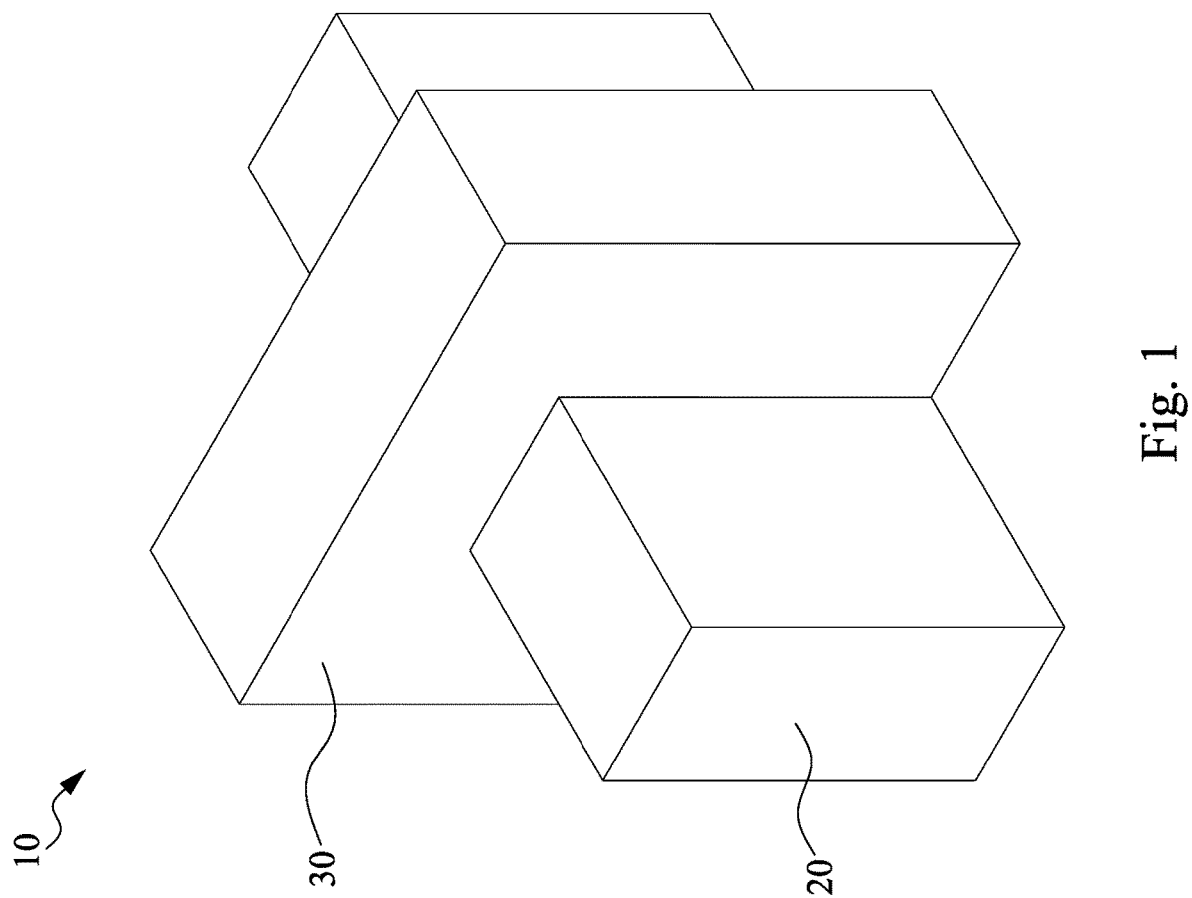
FIG. 1 is a perspective view of a FinFET device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, "around", "about" or "substantially" shall generally mean within 20 percent, preferably within 10 percent, and more preferably within 5 percent of a given value or range. Numerical quantities given herein are approximate, meaning that the term "around", "about" or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. The use of FinFET devices has been gaining popularity in the semiconductor industry.

Referring to FIG. 1, a perspective view of a FinFET device 10 according to some embodiments of the disclosure is illustrated. The FinFET device 10 is a non-planar multi-gate transistor that is built on a substrate. A thin silicon "fin-like" structure 20 (referred to as fin 20) forms the body of the FinFET device 10. A gate 30 of the FinFET device 10 is wrapped around this fin 20. A source and a drain of the FinFET device 10 are formed in extensions of the fin 20 on opposite sides of the gate 30. The portion of the fin 20 covered by the gate 30 serves as a channel. The effective channel length of the FinFET device 10 is determined by the dimensions of the fin 20.

Figure 2:
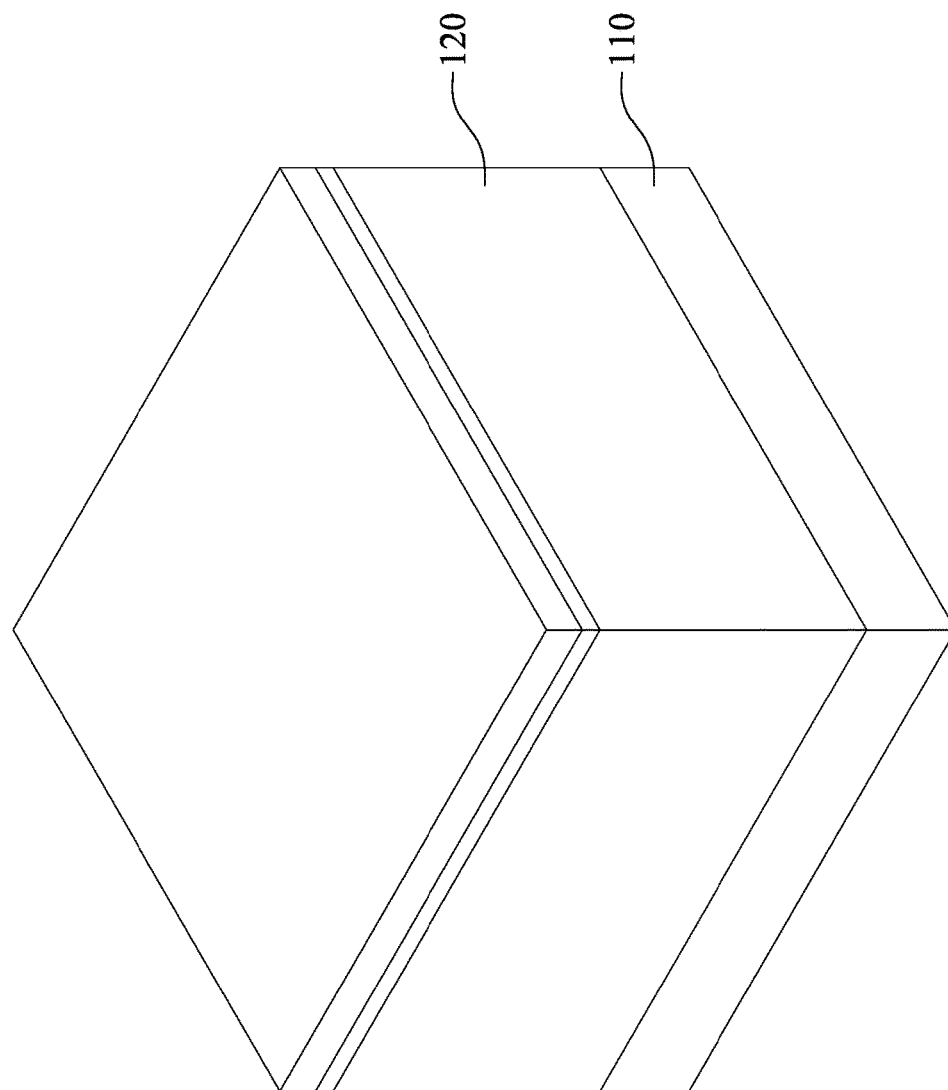
FIG. 2 to FIG. 12 are various oblique views of a FinFET device at different stages of fabrication, according to some embodiments of the disclosure.

Reference is made to FIG. 2 to FIG. 12, which are various oblique views of a FinFET device at different stages of fabrication, according to some embodiments of the disclosure. Referring to FIG. 2, in some embodiments, the substrate 110 includes a semiconductor material, such as silicon (Si). A semiconductor layer 120 is formed on the substrate 110. In some embodiments, the semiconductor layer 120 includes a crystal silicon material. It is understood that the semiconductor layer 120 may include other suitable materials in alternative embodiments. An implantation process is performed on the semiconductor layer 120 to implant a plurality of dopant ions to the semiconductor layer 120. In some embodiments, the dopant ions include an N-type material in an embodiment, for example arsenic (As) or phosphorous (P). In some other embodiments, the dopant ions may include a P-type material, for example boron (B), and the doping concentration levels may be different.

Figure 3:
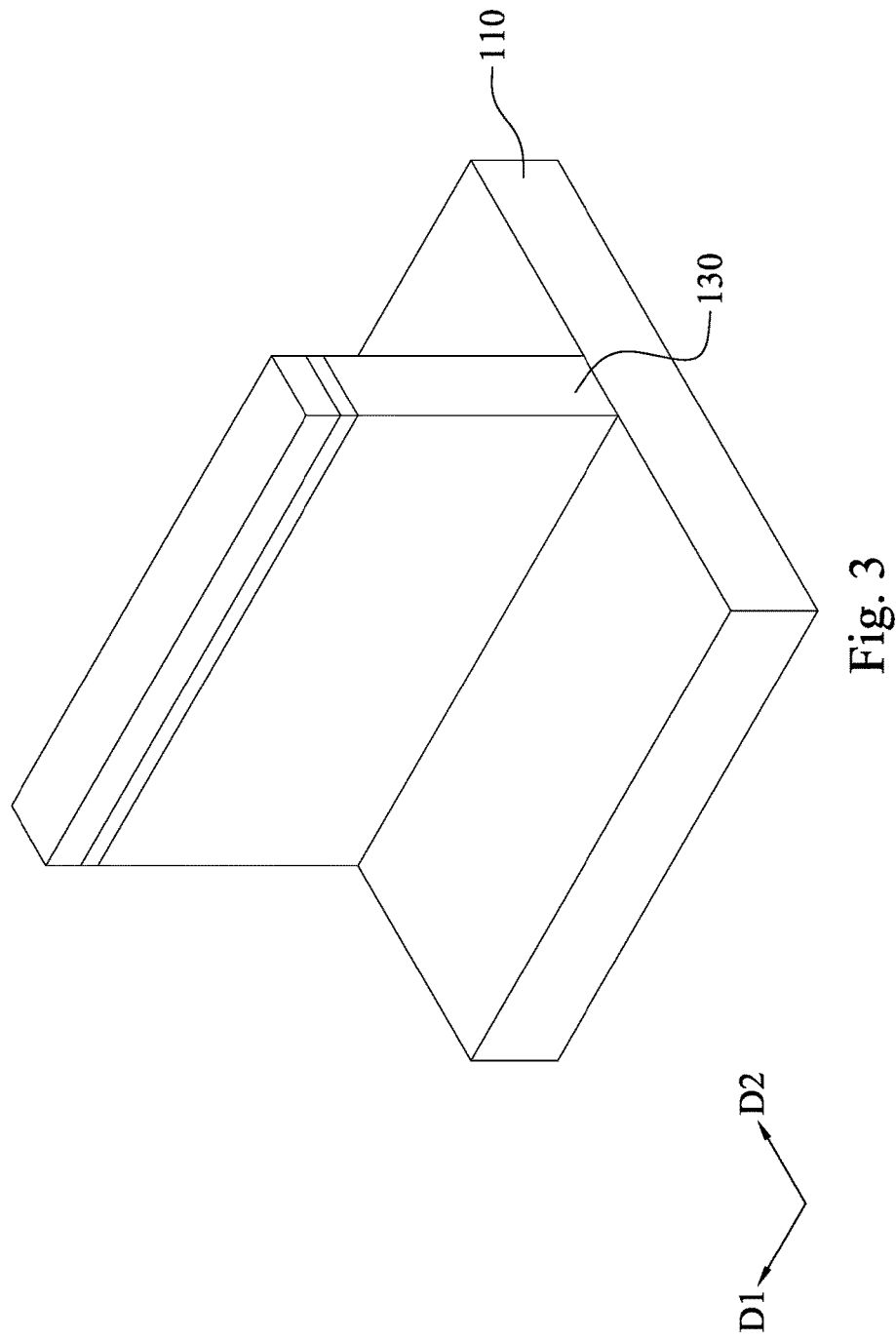

Referring to FIG. 3, the semiconductor layer 120 is patterned to form a fin structure 130. The fin structure 130 extends in an elongate manner along a first direction D1. As discussed previously, the fin structure 130 will serve as a conductive channel for the FinFET device 100. The fin structure 130 has a fin width measured in a second direction D2. Though there is only one fin structure 130 illustrated in the figures, the number of the fin structure 130 can be two or more.

Figure 4:
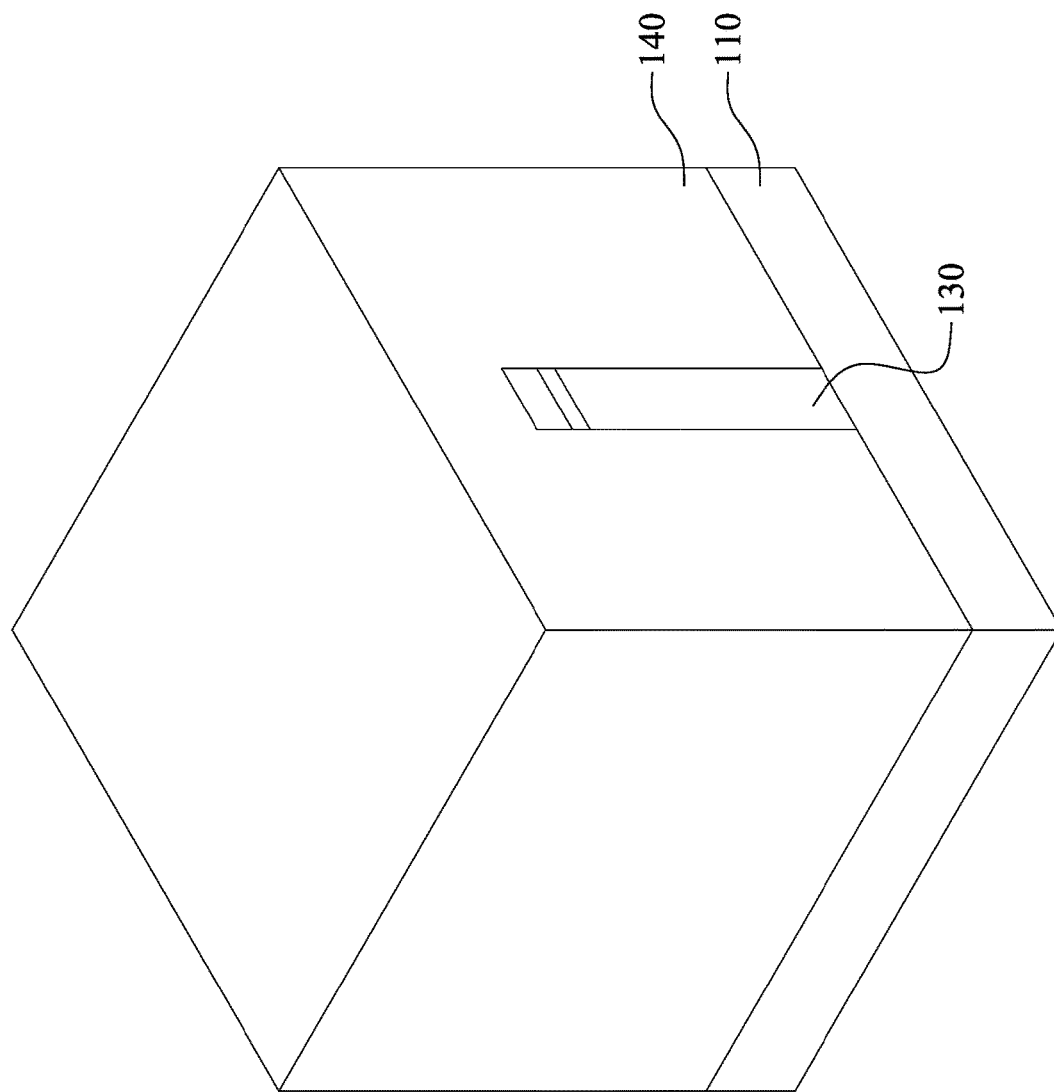

Referring to FIG. 4, an insulating layer 140 is formed to cover fin structure 130 over the substrate 110. In some embodiments, the insulating layer 140 is made of silicon oxide, silicon nitride, silicon oxynitride, fluoride-doped silicate glass (FSG), or other low-k dielectric materials (e.g., having a dielectric constant lower than, for example, about 3.9). The insulating layer 140 may be formed by using a high-density-plasma (HDP) CVD process or flowable CVD, although other deposition processes may be used in other embodiments.

Figure 5:
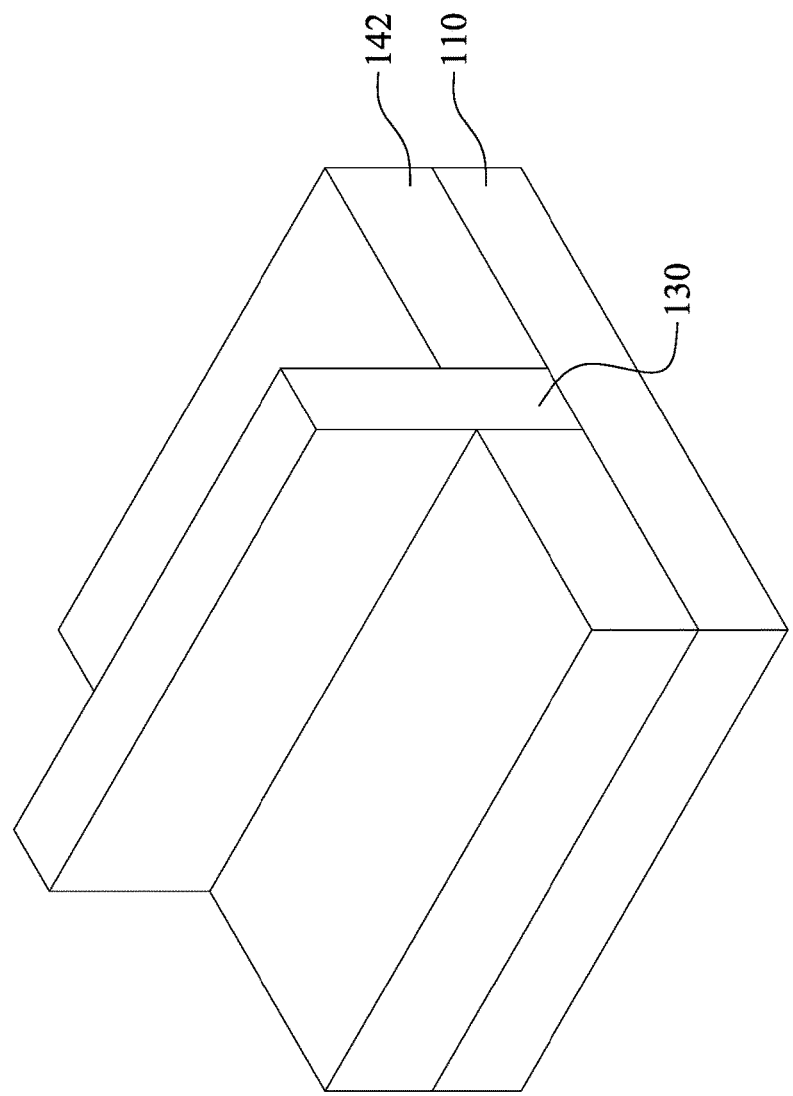

After the insulating layer 140 is formed, a chemical mechanical polishing (CMP) process is performed to expose the top surfaces of fin structure 130 and the insulating layer 140 is then recessed to expose sidewalls of fin structure 130, as shown in FIG. 5. The insulating layer 140 may be recessed by a wet etching process or a dry etching process. The remaining insulating layer 140 laterally surrounds the bottom portion of the fin structure 130 and can be referred to as a shallow trench isolation (STI) structure 142.

Figure 6:
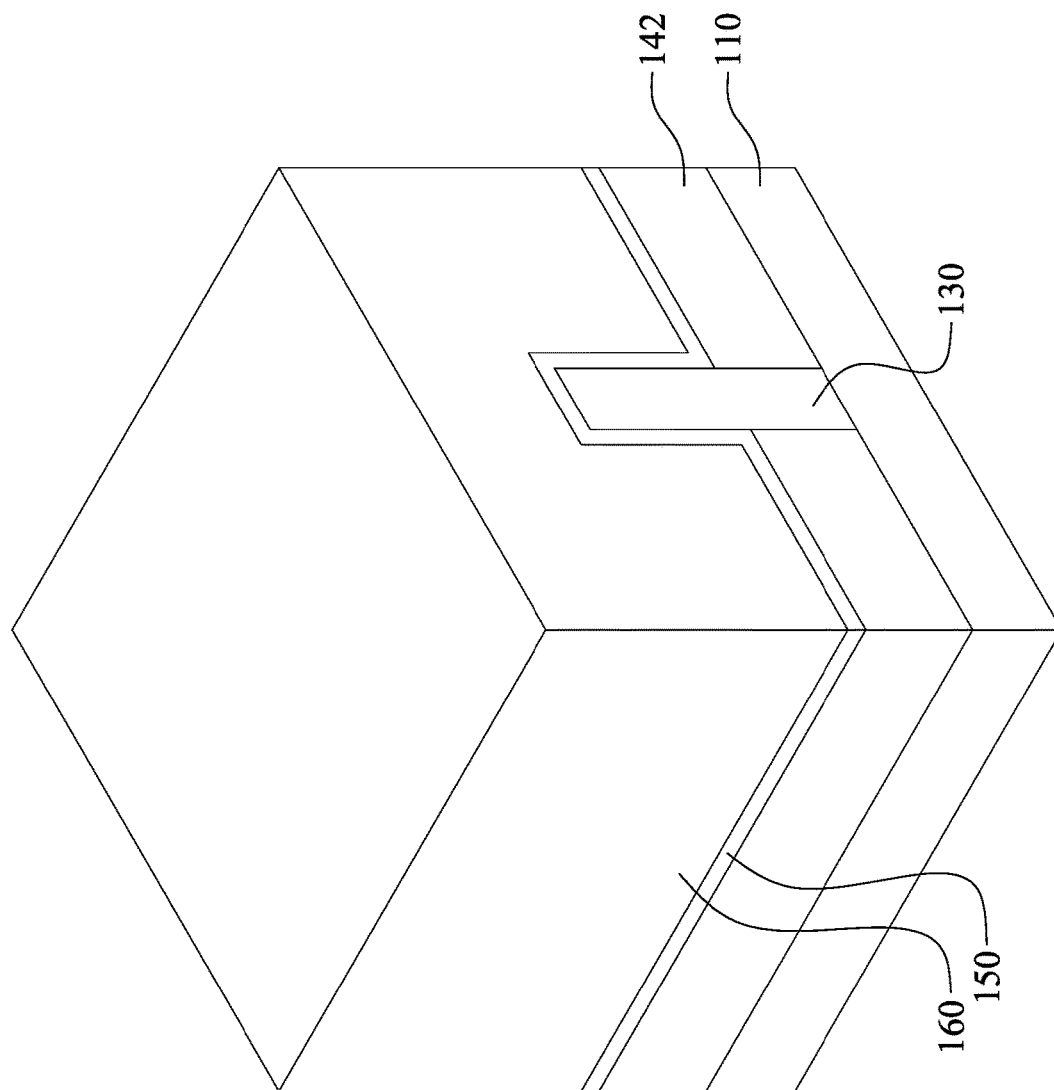

Referring to FIG. 6, a sacrificial gate dielectric layer 150 is conformally formed on the fin structure 130 and the STI structures 142, and a sacrificial gate material layer 160 is formed on the sacrificial gate dielectric layer 150. The sacrificial gate dielectric layer 150 and the sacrificial gate material layer 160 may each be formed using a deposition process, for example chemical vapor deposition (CVD), physical vapor deposition (PVD), atomic layer deposition (ALD), combinations thereof, or another suitable process. In some embodiments, the sacrificial gate dielectric layer 150 is made of, for example, silicon oxide. The sacrificial gate material layer 160 is made of, for example, poly silicon.

Figure 7:
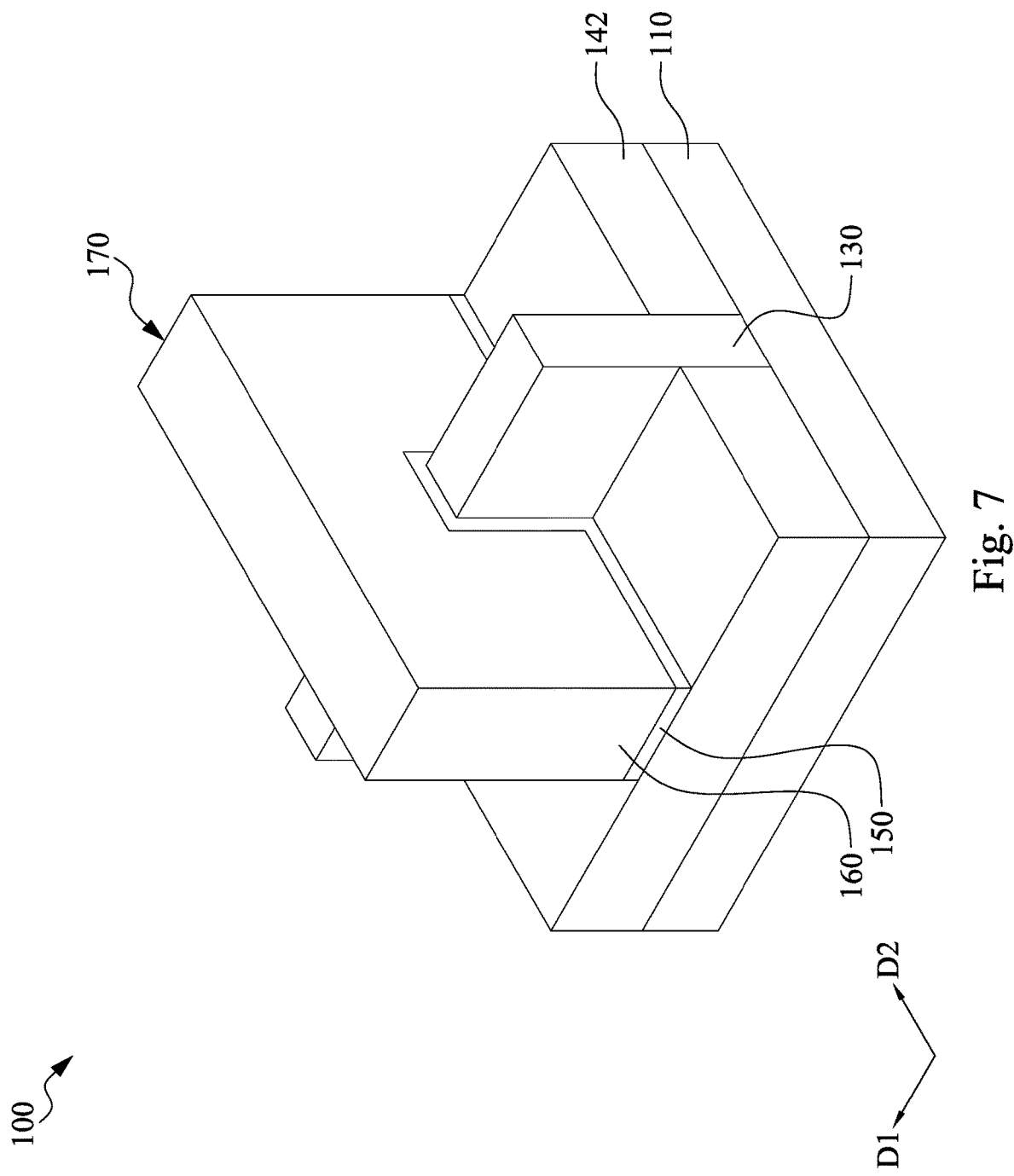

Referring to FIG. 7, the sacrificial gate dielectric layer 150 and the sacrificial gate material layer 160 undergo a patterning process to form a sacrificial gate structure 170. The sacrificial gate structure 170 extends in an elongate manner along the second direction D2. The sacrificial gate structure 170 wraps around a portion of the fin structure 130. The portion of the fin structure 130 being wrapped around by the sacrificial gate structure 170 constitutes a conductive channel region. The sacrificial gate structure 170 has a width that is measured in the first direction D1.

Figure 8:
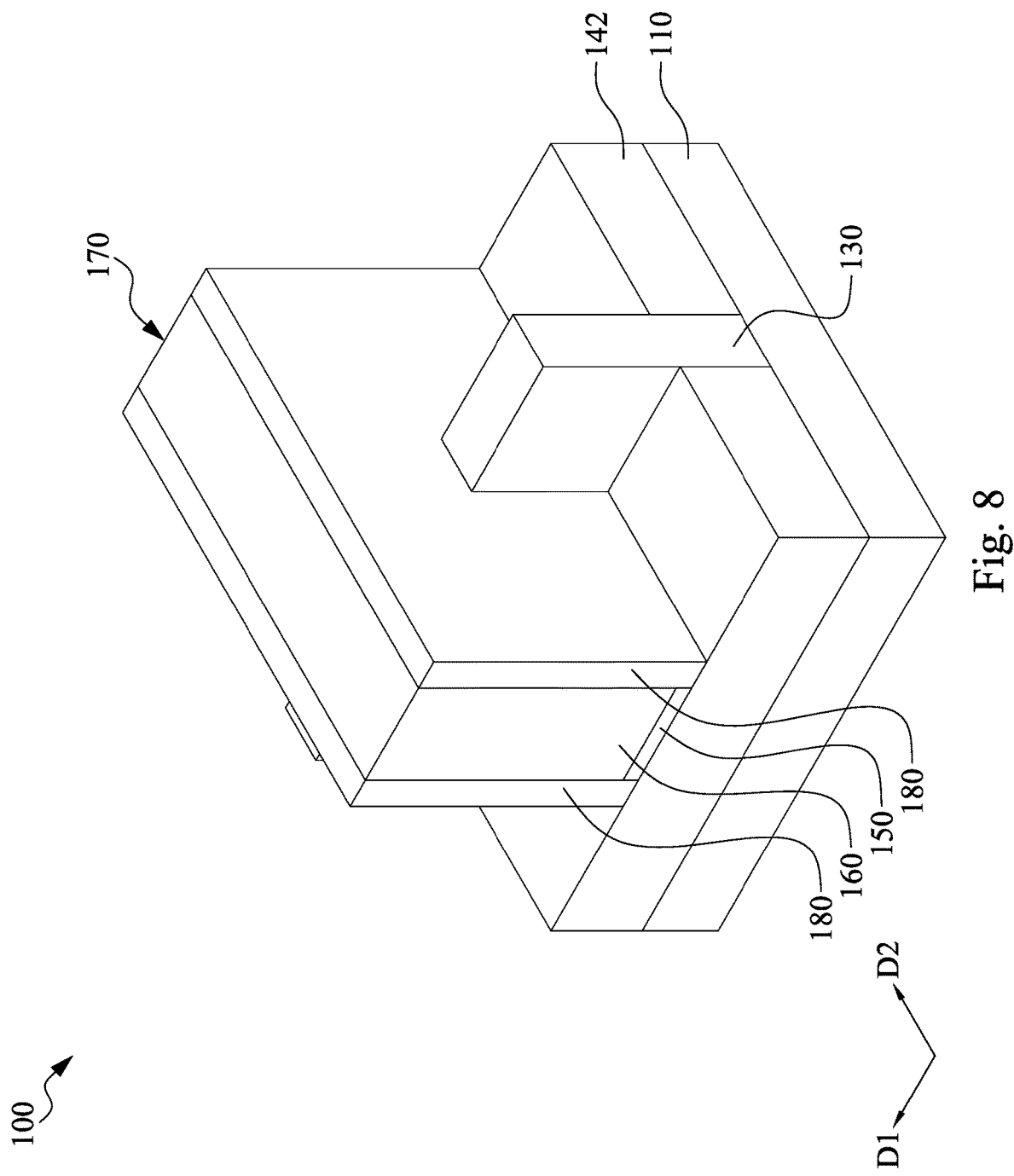

Referring to FIG. 8, gate sidewall spacers 180 are formed on the long sides of the sacrificial gate structure 170. In other words, the gate sidewall spacers 180 extend in an elongate manner along the second direction D2. The gate sidewall spacers 180 are formed by depositing a spacer material over the sacrificial gate structure 170 and thereafter performing a patterning process (for example an anisotropic etching process) on the spacer material to remove horizontal portions of the spacer material, while leaving vertical portions of the spacer material on the sidewalls of the sacrificial gate structure 170. The spacer material may include a dielectric material. The spacer material is different from that the sacrificial gate dielectric layer 150. In some embodiments, the spacer material includes SiN, SiCN, SiOCN, or combinations thereof. The gate sidewall spacers 180 each have a width that is measured in the first direction D1.

Figure 9:
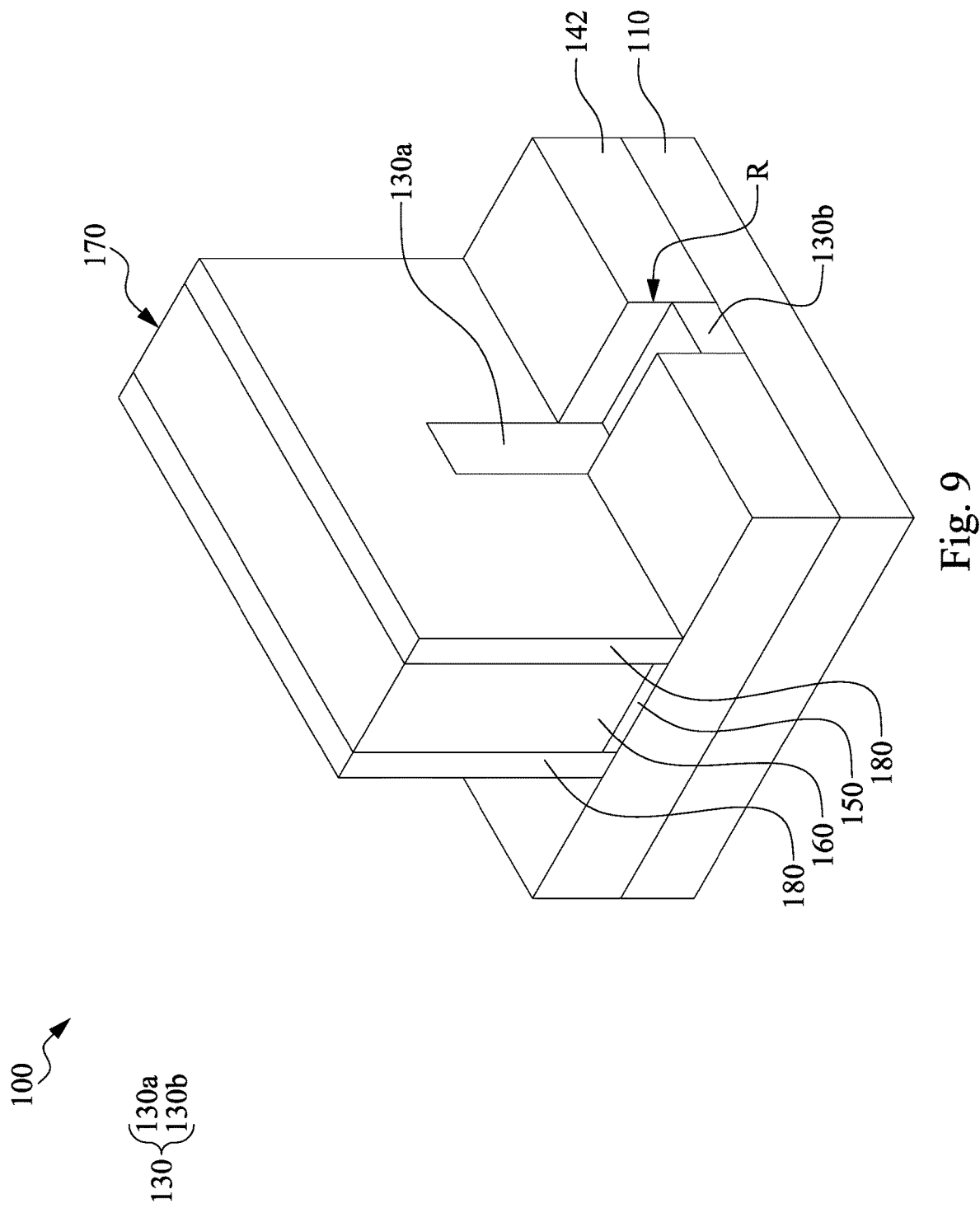

Referring to FIG. 9, portions of the fin structure 130 exposed by the sacrificial gate structure 170 and the gate sidewall spacers 180 are partially removed (or partially recessed) to form a recess R in the fin structure 130. Any suitable amount of material may be removed. The remaining fin structure 130 has a protruding portion 130a protruding above the STI structure 142 and two embedded portions 130b embedded in the STI structure 142. The height of the embedded portions 130b is shorter than the height of the protruding portion 130a. The sacrificial gate structure 170 and the gate sidewall spacers 180 wrap around three sides of the protruding portion 130a, and opposite sidewalls of the protruding portion 130a are exposed by the gate sidewall spacers 180. In some embodiments, the top surface of the embedded portions 130b is lower than the top surface of the STI structure 142, and recesses R are formed in the STI structure 142 and above the embedded portions 130b.

Figure 10:
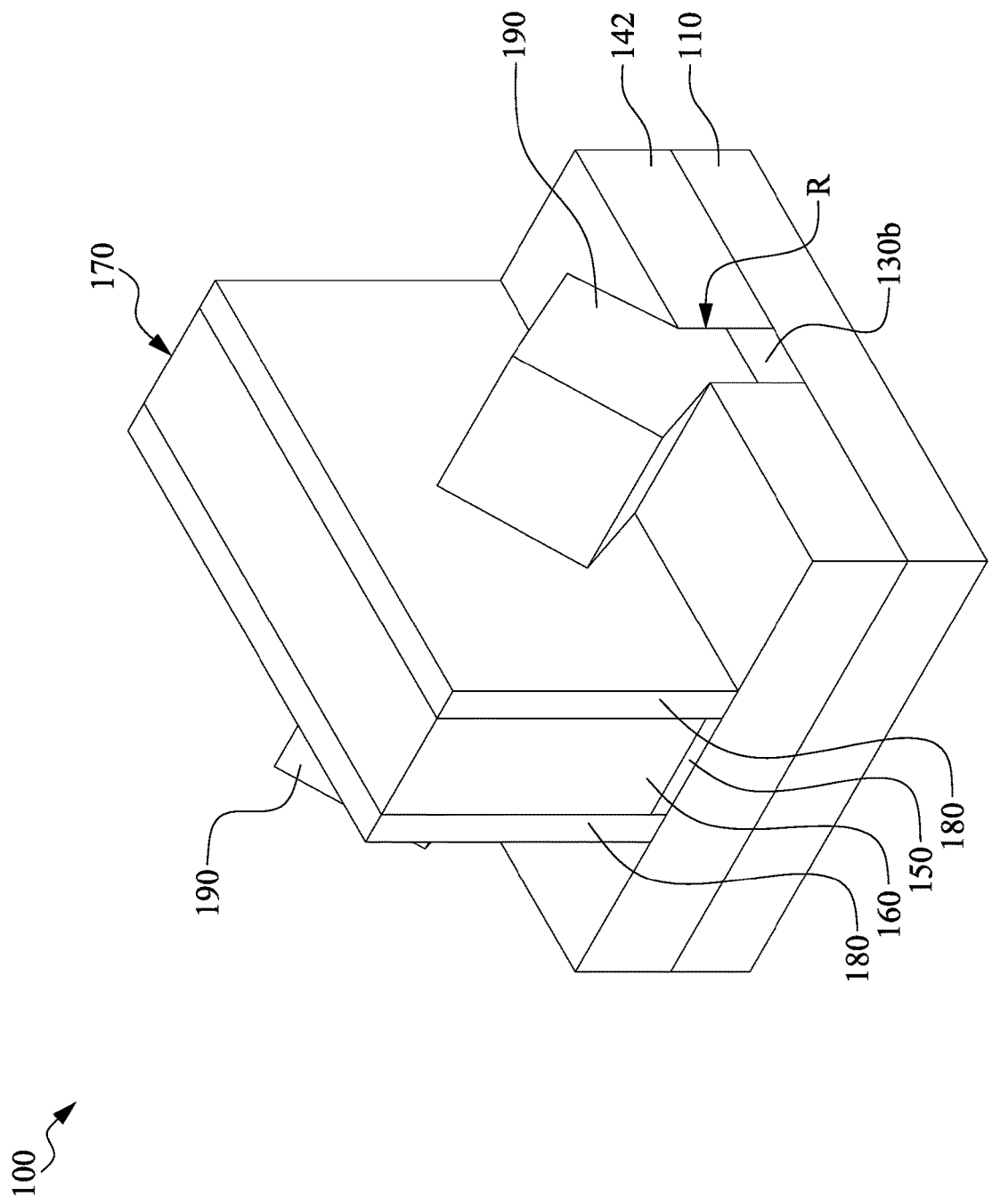

Referring now to FIG. 10, a plurality of epitaxy structures 190 are formed in the recesses R and on the embedded portions 130b of the fin structure 130 (as shown in FIG. 9). The epitaxy structures 190 are protruded from the substrate 110. The epitaxy structures 190 may be formed using one or more epitaxial processes, such that Si features, SiGe features, and/or other suitable features can be formed in a crystalline state on the embedded portions 130b of the fin structure 130. In some embodiments, a lattice constant of the epitaxy structures 190 is different from a lattice constant of the fin structure 130, and thus the channel region in the fin structure 130 are strained and/or stressed by the epitaxy structures 190 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the embedded portions 130b of the fin structure 130 (e.g., silicon). Thus, a strained channel can be achieved to increase carrier mobility and enhance device performance. The epitaxy structures 190 may be in-situ doped. The doping species include p-type dopants, such as boron or $BF_2$; n-type dopants, such as phosphorus or arsenic; and/or other suitable dopants including combinations thereof. If the epitaxy structures 190 are not in-situ doped, an additional implantation process (i.e., a junction implant process) is performed to dope the epitaxy structures 190. One or more annealing processes may be performed to activate the epitaxy structures 190. The annealing processes include rapid thermal annealing (RTA) and/or laser annealing processes. The epitaxy structures 190 at opposite sides of the sacrificial gate structure 170 serve as source and drain regions of the FinFET device 100, and the protruded portion of the fin structure 130 serves as the channel region of the FinFET device 100.

Figure 11:
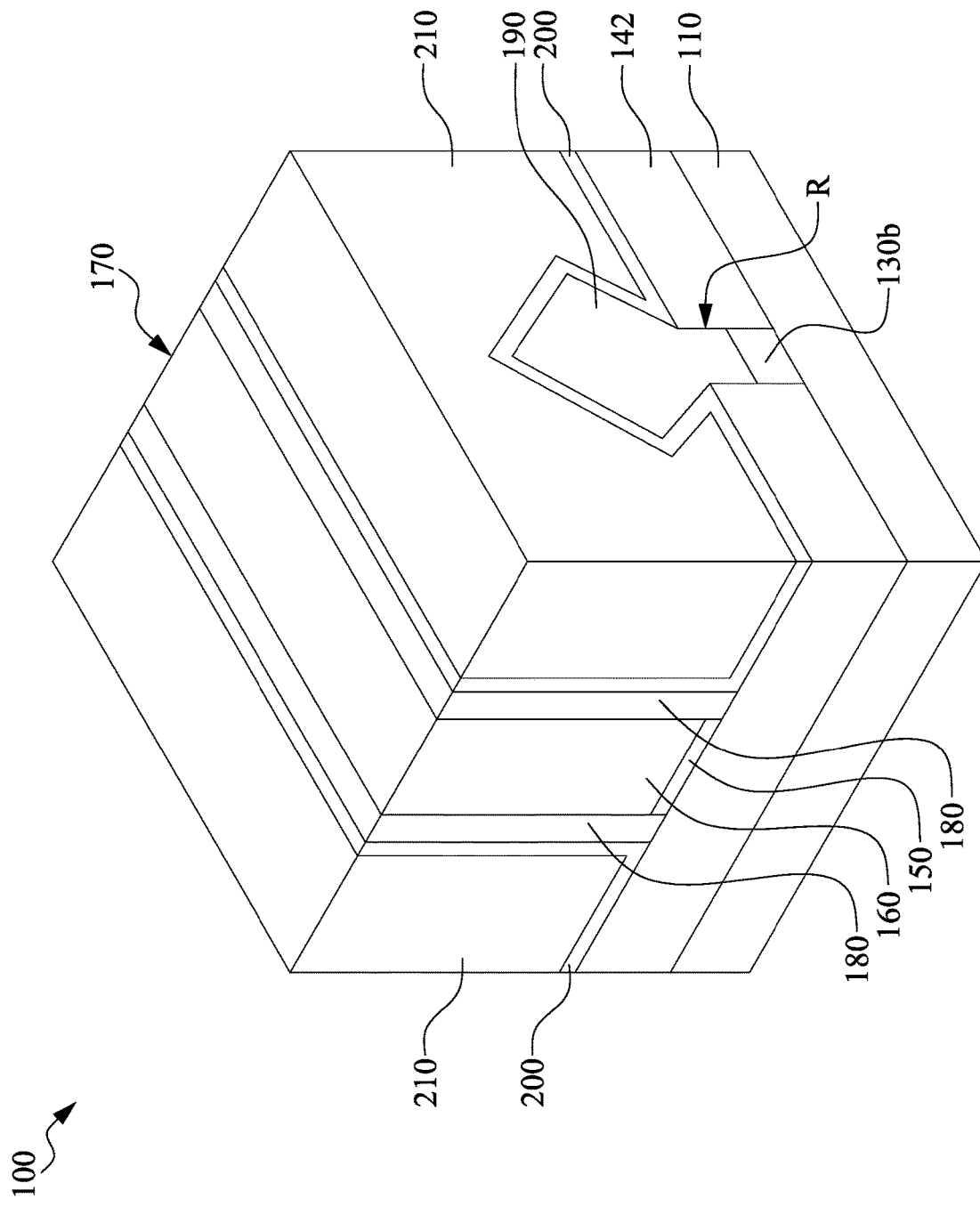

Referring to FIG. 11, a contact etch stop layer (CESL) 200 is formed over the epitaxy structures 190, the STI structures 142, and the gate sidewall spacers 180. The CESL 200 may be made of one or more layers of silicon oxide or silicon nitride based materials such as SiN, SiCN, SiON or SiOCN.

Further, an interlayer dielectric layer (ILD) 210 is formed on the CESL 200. The ILD 210 may include $SiO_2$, SiN, SiON, SiOCN, fluorine-doped silicate glass (FSG), or a low-K dielectric material, and may be made by CVD or other suitable processes. The insulating material for the STI structures 142 may be the same as or different from that for the ILD 210.

Planarization operations, such as an etch-back process and/or a chemical mechanical polishing (CMP) process, are performed, so as to obtain the structure shown in FIG. 11, in which the sacrificial gate structure 170 is exposed from the ILD 210.

Figure 12:
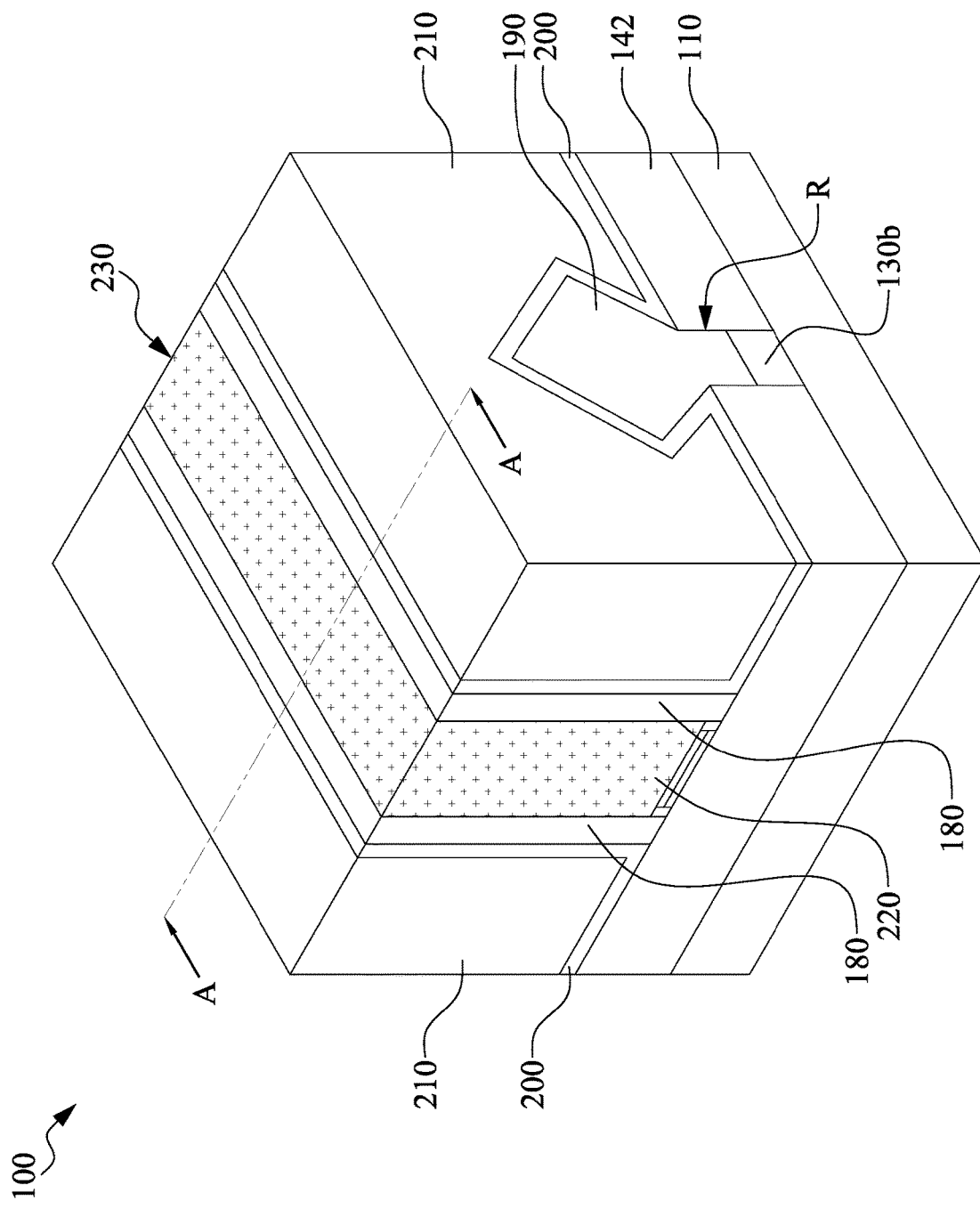

Referring to FIG. 12, the sacrificial gate material layer 160 of the sacrificial gate structure 170 (as shown in FIG. 11) is replaced by a metal gate structure 230 including a metal gate electrode 220 in accordance with some embodiments. Details of the replacing the sacrificial gate structure 170 with the metal gate electrode 220 (hereafter "gate replacement process") are described in FIG. 13 to FIG. 20, which are various cross-sectional views of the gate replacement process at different stages, taken along line A-A in FIG. 12, according to some embodiments of the disclosure. The cross-sectional views of FIG. 13 to FIG. 20 are depicted in a more detailed fashion than the oblique views of FIG. 2 to FIG. 12 to illustrate the detailed structure of a FinFET.

Figure 13:
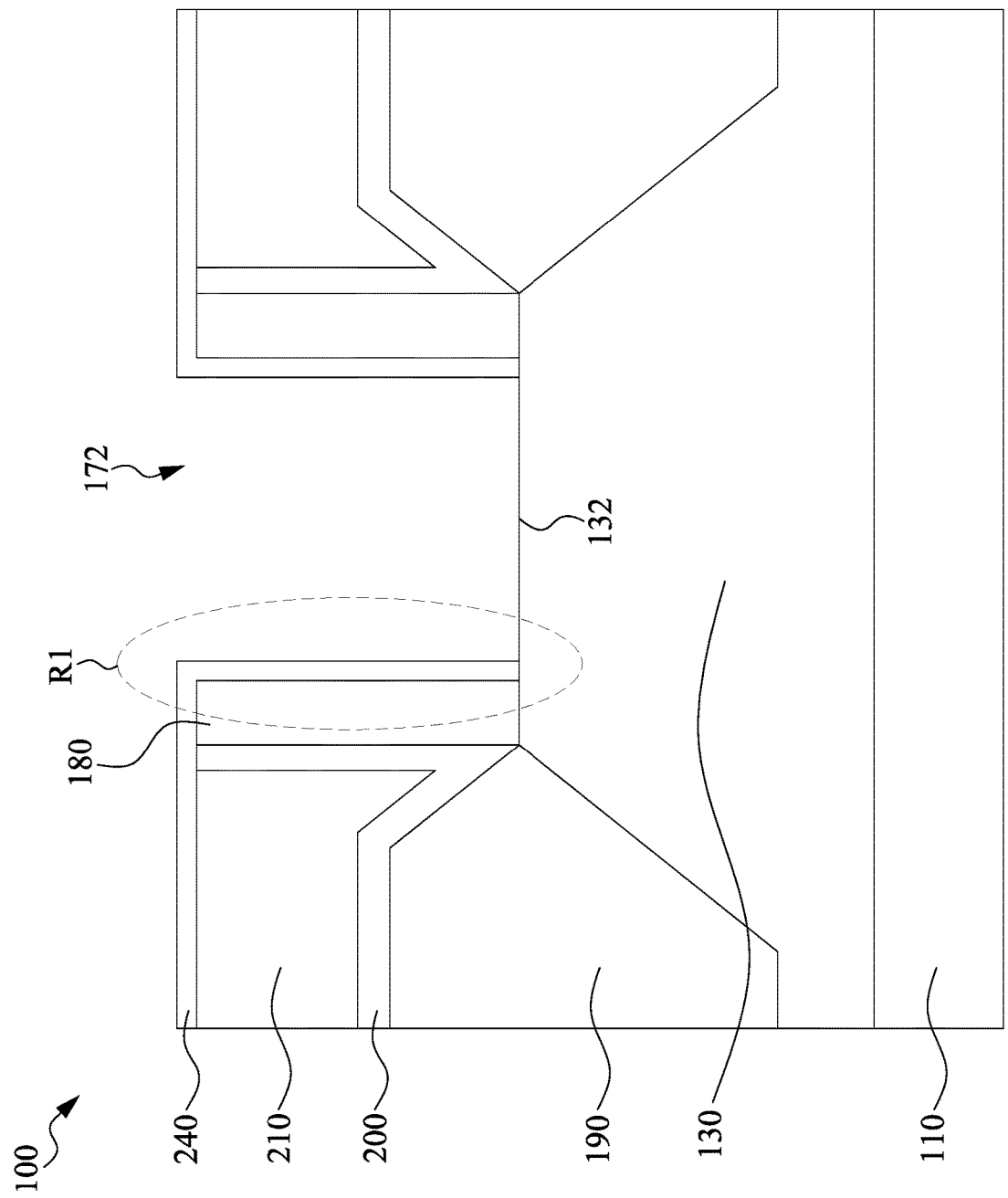
FIG. 13 to FIG. 22 are various cross-sectional views of a FinFET device at different stages of fabrication, according to some embodiments of the disclosure.

Referring to FIG. 13, the sacrificial gate structure 170 (referring to FIG. 12) is removed to form a trench 172 between the gate sidewall spacers 180 to expose a surface of the channel region 132 of the fin structure 130. In some embodiments, the sacrificial gate structure 170 is removed by performing one or more etching processes to remove the sacrificial gate dielectric layer 150 and the sacrificial gate material layer 160 (referring to FIG. 12). In some embodiments, the sacrificial gate structure 170 is removed by performing a first etching process (not shown) and performing a second etching process after the first etching process. In some embodiments, sacrificial gate material layer 160 of sacrificial gate structure 170 is mainly removed by the first etching process, and sacrificial gate dielectric layer 150 is mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or a combination thereof. The wet etching process may be used to fully remove the sacrificial gate dielectric layer 150, such that the metal gate electrode formed afterwards can be directly formed on fin structure 130. In some embodiments, wet etching process includes using dilute HF or buffered HF. The HF etching makes the surface of the channel region 132, such as doped Si surface of the fin structure 130 hydrophobic by hydrogen termination, while the dielectric/insulating surfaces, such as SiN, SiCN, SiOCN surface of the gate sidewall spacers 180 maintains —OH termination, which makes the surfaces hydrophilic.

A hydrophilic surface or hydrophilic means the contact angle of a water droplet on the surface is smaller than about 90 degrees, while a hydrophobic surface or hydrophobic means the contact angle of a water droplet on the surface is equal to or greater than 90 degrees (and less than about 180 degrees).

A self-assembled-monolayer (SAM) 240 is formed on the hydrophilic surfaces of the gate sidewall spacers 180 and the ILD 210, thereby converting the hydrophilic surfaces to hydrophobic surfaces.

Figure 14:
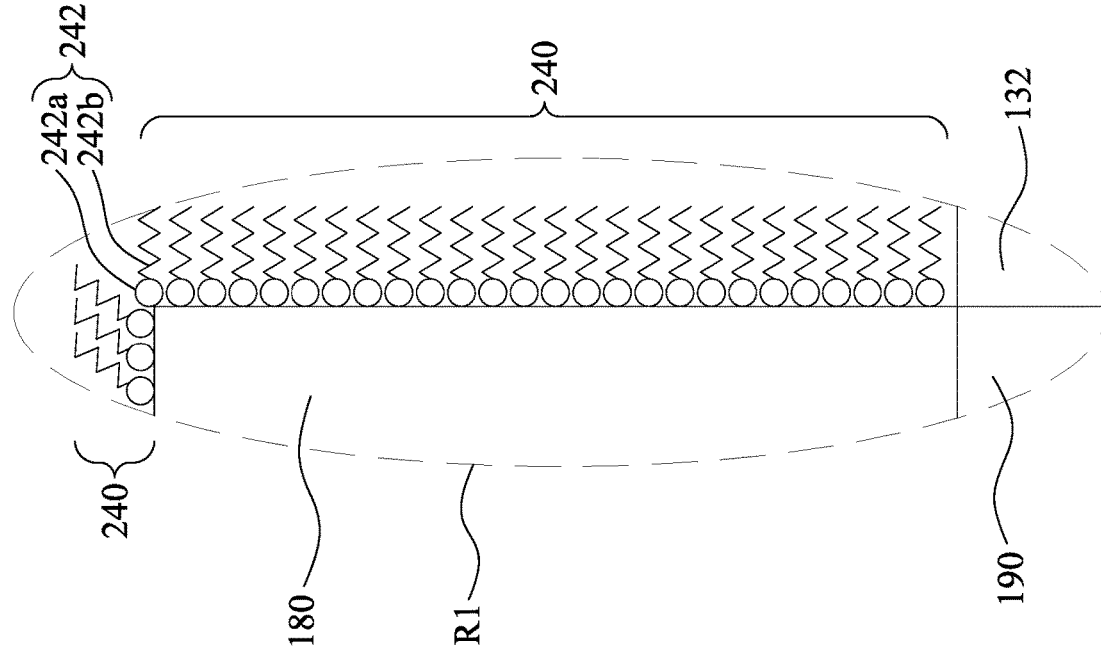

As shown in FIG. 14, which is an enlarged view of the region R1 of FIG. 13, the SAM 240 includes silane based SAM compound 242, the head group 242a of the SAM compound 242 includes —$SiX_3$, in which X can be Cl, Br, I, or $OCH_3$. The tail portion 242b of the SAM compound 242 includes an alkane chain terminated by —$(CH_2)_{x-1}CH_3$, in which x=1-19, —$(CF_2)_{x-1}CF_3$, in which x=1-19, —$(C_6H_4)_{x-1}C_6H_5$ (benzene), or —$(C_6F_4)_{x-1}C_6F_5$ (fluorobenzene). The head group 242a of the compound 242 is attached to the hydrophilic surface of the gate sidewall spacers 180 and the ILD 210 (see FIG. 13), and the tail portion 242b having the alkane chain of the SAM compound 242 faces away from the surface of the gate sidewall spacers 180 and the ILD 210, thereby making the SAM 240 having a hydrophobic surface.

The SAM 240 can be formed either by a wet process or a dry process. In the wet process, a substrate to be treated is dipped into a SAM solution, in which the SAM compound is diluted by water, alcohols (e.g., isopropyl alcohol (IPA), ethanol, methanol), or organic solvents. In the dry process, vaporized SAM material is supplied to the substrate to be treated in a vacuum chamber. The thickness of the formed SAM 240 is in a range from about 0.5 nm to about 3 nm depending on the SAM material.

The SAM 240 is selectively formed on the surface of the dielectric/insulating material layers, such as on the surfaces of the gate sidewall spacers 180 and the ILD 210. After the SAM 240 is formed, the surface of the channel region 132 exposed by the trench remains hydrophobic.

Figure 15:
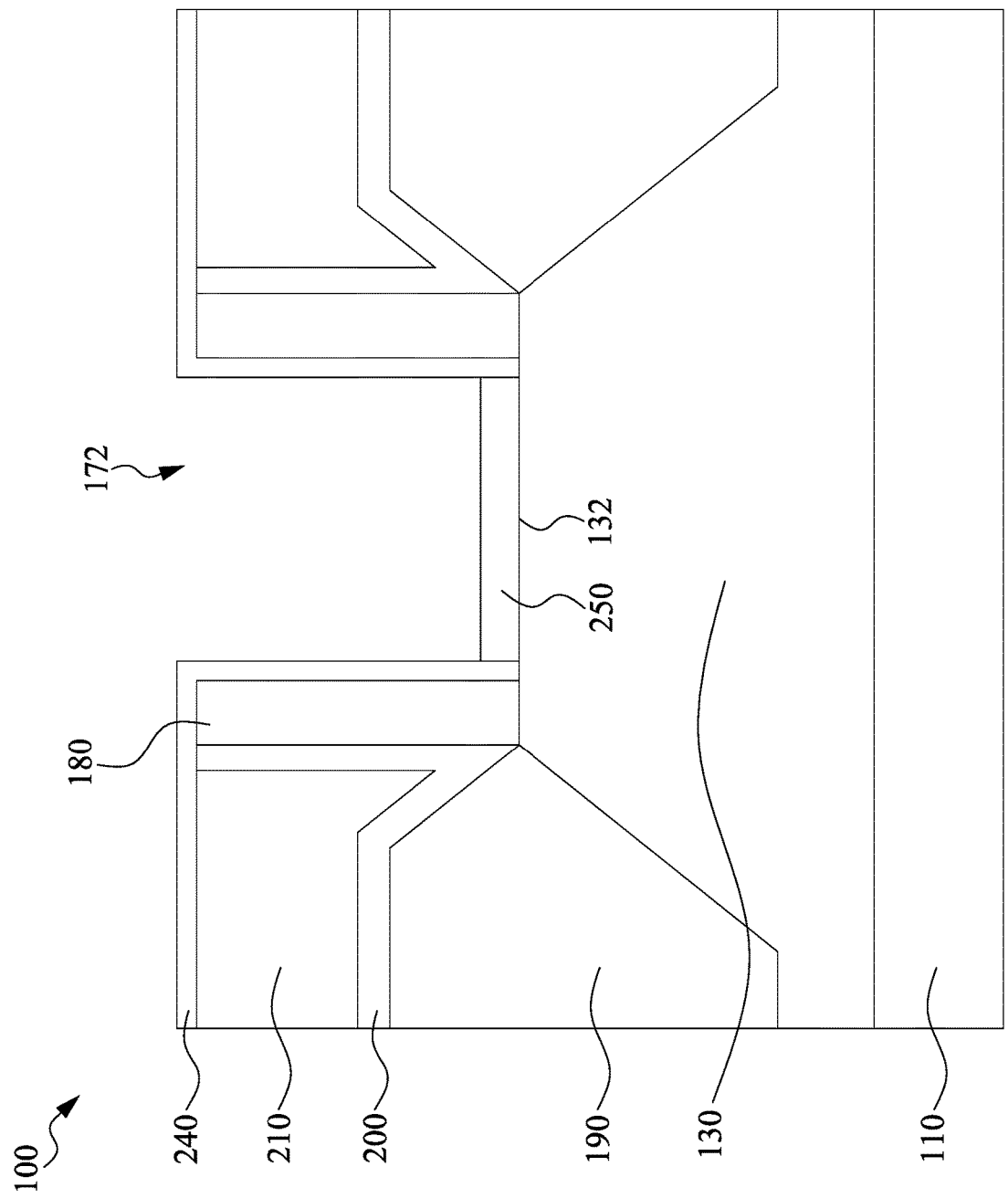

Referring to FIG. 15, an interfacial layer (also referred to as IL) 250 is formed on the surface of the channel region 132. The interfacial layer 250 is formed by using a thermal oxidation or a wet chemical oxidation. In some embodiments where the interfacial layer 250 is formed using a wet chemical oxidation, it can be formed using an aqueous solution containing sulfuric acid ($H_2SO_4$) and hydrogen peroxide ($H_2O_2$) (SPM), ozone water, an aqueous solution containing $NH_4OH$ and $H_2O_2$ (SC1), or an aqueous solution containing HCl and $H_2O_2$ (SC2). By wet chemical oxidation, a thin $SiO_2$ interfacial layer 250 having a thickness of about 0.2 nm to about 2 nm, of which surface is hydrophilic, is formed on the silicon fin 130.

In other embodiments, instead of forming a $SiO_2$ interfacial layer 250, the surface of the channel region 132 can be modified to be hydrophilic by using $H_2O_2$ vapor.

Once a hydrophilic surface ($SiO_2$ interfacial layer 250) is formed, a subsequently formed layer can be substantially selectively formed on the hydrophilic surface by using ALD. In some embodiments, by adjusting a process temperature of ALD, a layer is deposited on the hydrophilic surface at a faster deposition rate than on the hydrophobic surface.

Figure 16:
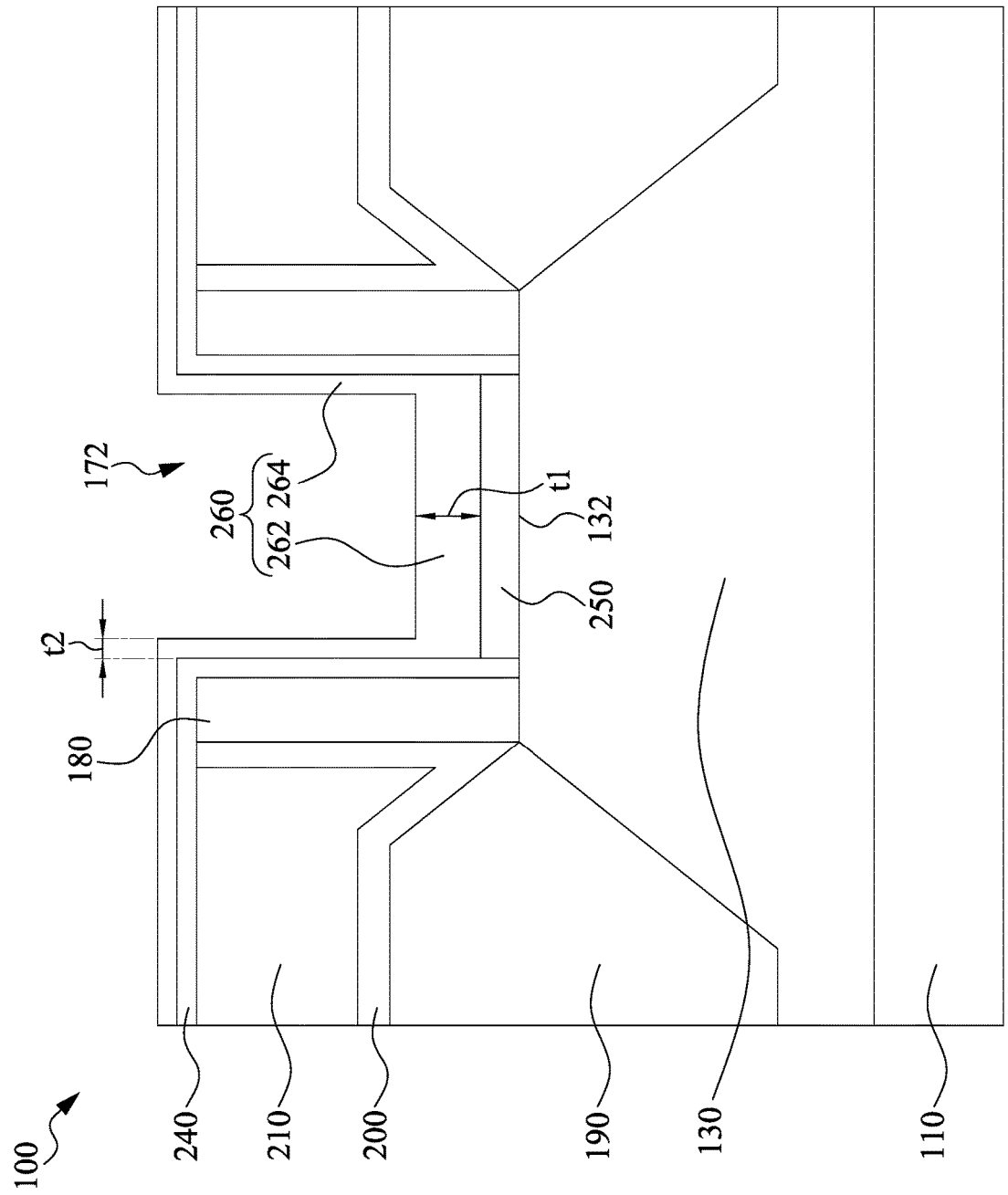

Referring to FIG. 16, after the interfacial layer 250 is formed, a high-k dielectric layer 260 (e.g., a dielectric material having a dielectric constant greater than about 3.9)

is selectively formed on the gate sidewall spacers 180 having the SAM thereon and the interfacial layer 250, by a deposition process. In some embodiments, the high-k dielectric layer 260 is formed by an ALD process, in which the precursor can be TDMAHf, TDEAHf, HfCl$_4$, the processing gas can be Ar or N$_2$, the ratio of the precursor to the processing gas is from about 1 to about 10, the reacting time is about 20 seconds to about 200 seconds, and the reacting temperature is from about 100° C. to about 350° C.

Because the surface of the SAM 240 on the gate sidewall spacers 180 and the ILD 210 is hydrophobic, and the surface of the interfacial layer 250 is hydrophilic, the deposition rate of the high-k dielectric layer 260 on the gate sidewall spacers 180 and the ILD 210 is different from the deposition rate of the high-k dielectric layer 260 on the interfacial layer 250. The difference of the depositions rates depends on the material of the high-k dielectric layer 260 and the number of ALD cycles of forming the high-k dielectric layer 260.

Figure 47:
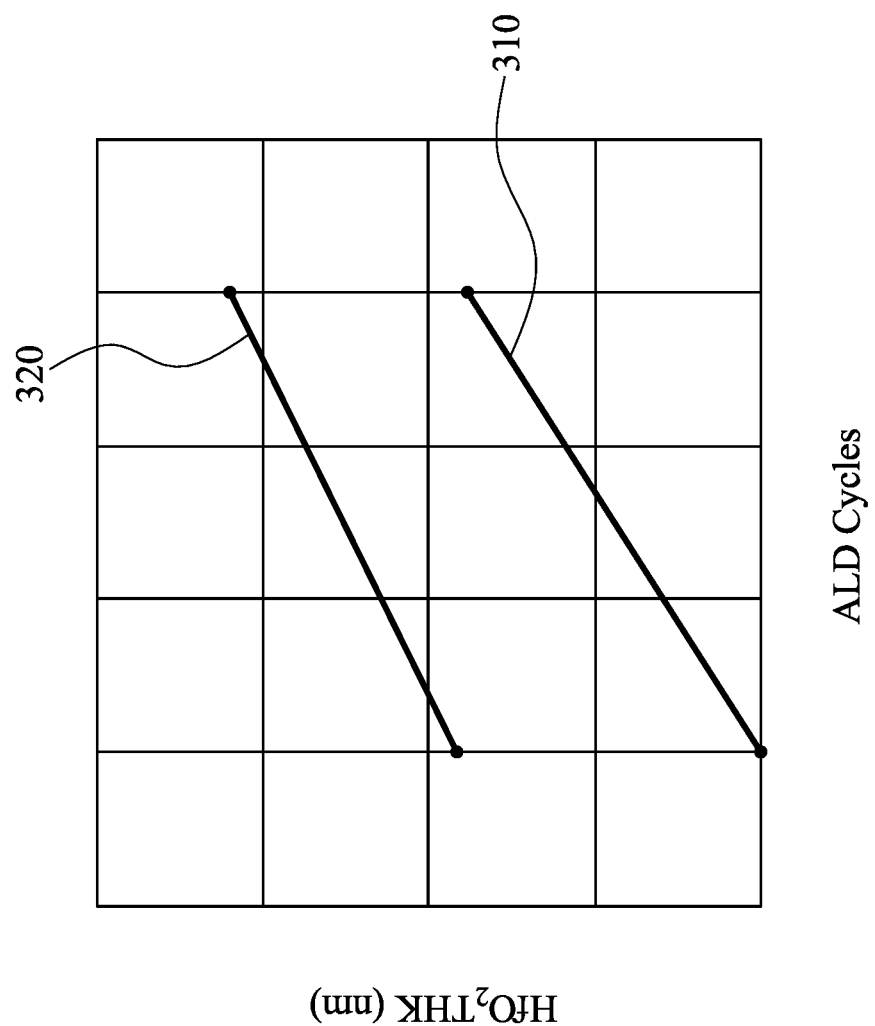
FIG. 47 is a chart that graphically illustrates how the thickness of the high-k dielectric layer varies under different ALD power, according to some embodiments of the disclosure.

FIG. 47 is a chart that graphically illustrates a relation between a number of ALD cycles and the thickness of the resulting high-k dielectric layer, according to some embodiments of the disclosure. The chart is a plot of thickness of high-k dielectric layer (Y-axis) VS ALD cycles (X-axis). In this embodiment, the high-k dielectric layer is made of hafnium oxide (HfO$_2$). The line 310 represents the high-k dielectric layer (HfO$_2$) deposited on the gate sidewall spacers (SiCN, with SAM thereon), and line 320 represents the high-k dielectric layer (HfO$_2$) deposited on the interfacial layer (SiO$_2$).

As shown in the chart, the thickness of the high-k dielectric layer (HfO$_2$) linearly increases on the gate sidewall spacers (SiCN, with SAM thereon) and on the interfacial layer (SiO$_2$). The deposition rate of the high-k dielectric layer (HfO$_2$) on the interfacial layer (SiO$_2$) is faster than deposition rate of the high-k dielectric layer (HfO$_2$) on the gate sidewall spacers (SiCN, with SAM thereon). Therefore, the high-k dielectric layer (HfO$_2$) can be selectively deposited on the interfacial layer (SiO$_2$).

Figure 48:
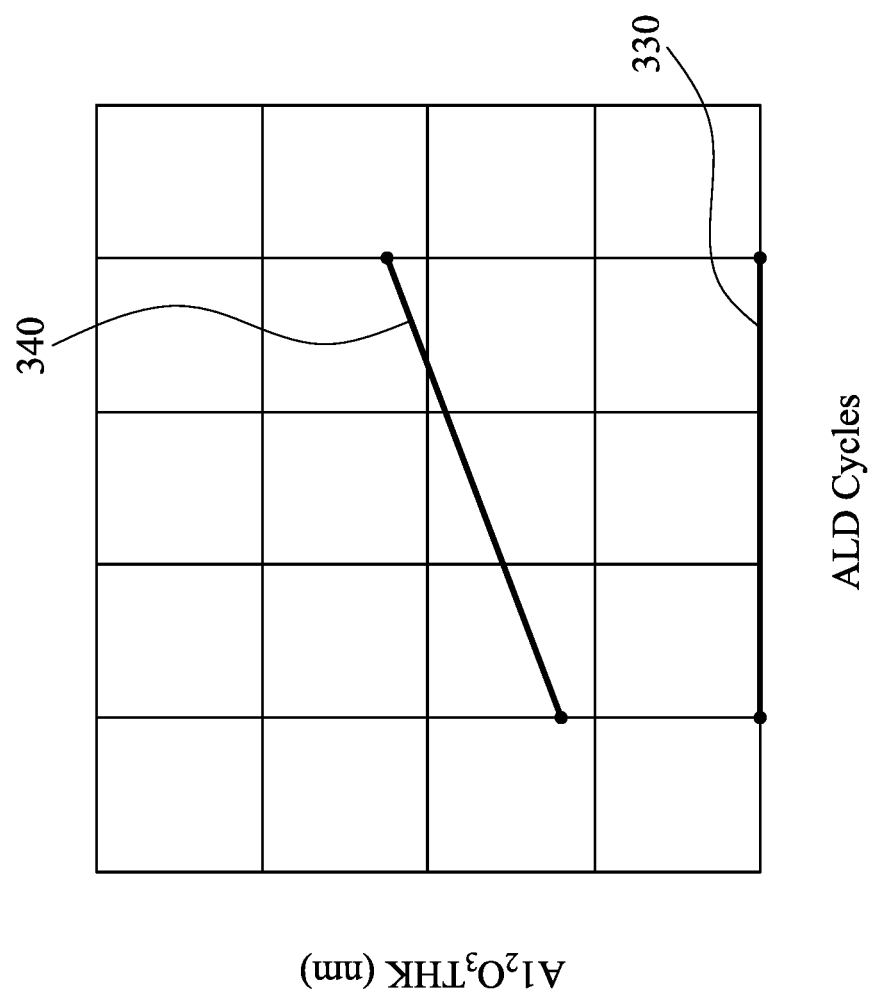
FIG. 48 is a chart that graphically illustrates how the thickness of the high-k dielectric layer varies under different ALD power, according to some other embodiments of the disclosure.

FIG. 48 is another chart that graphically illustrates a relation between a number of ALD cycles and the thickness of the resulting high-k dielectric layer, according to some other embodiments of the disclosure. The chart is a plot of thickness of high-k dielectric layer (Y-axis) VS ALD cycles (X-axis). In this embodiment, the high-k dielectric layer is made of aluminum oxide (Al$_2$O$_3$). The line 330 represents the high-k dielectric layer (Al$_2$O$_3$) deposited on the gate sidewall spacers (SiCN, with SAM thereon), and line 340 represents the high-k dielectric layer (Al$_2$O$_3$) deposited on the interfacial layer (SiO$_2$).

As is shown in the chart, the selectivity of depositing the Al$_2$O$_3$ layer on the gate sidewall spacers (SiCN, with SAM thereon) and on the interfacial layer (SiO$_2$) is greater than the embodiments as shown in FIG. 47, and in particular, no or negligible Al$_2$O$_3$ material is deposited on the gate sidewall spacers (SiCN, with SAM thereon). Stated differently, the Al$_2$O$_3$ layer may exhibit greater deposition selectivity than the HfO$_2$ layer.

In some embodiments, the high-k dielectric layer 260 is not limited to HfO$_2$ and Al$_2$O$_3$, and can be made of other metal oxides, metal nitrides, metal silicates, transition metal-oxides, transition metal-nitrides, transition metal-silicates, or oxynitrides of metals. Examples of the high-k dielectric material include, but are not limited to, hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina (HfO$_2$—Al$_2$O$_3$) alloy, or other applicable dielectric materials.

Reference is made back to FIG. 16. The high-k dielectric layer 260 has a U-shaped cross-section, and the SAM 240 is interposed between the high-k dielectric layer 260 and the gate sidewall spacers 180 and between the interfacial layer 250 and the gate sidewall spacers 180. The thickness of the high-k dielectric layer 260 is not uniform. For example, the high-k dielectric layer 260 has a first portion 262 in the vicinity of the interfacial layer 250 and two second portions 264 extending from opposite ends of the first portion 262 in a direction away from the interfacial layer 250. The first portion 262 is in contact with the interfacial layer 250, and the second portions 264 protrudes from the ends of the first portion 262 and are in contact with the SAM 240 on the gate sidewall spacers 180. That is, the SAM 240 on the gate sidewall spacers 180 has a bottom section in contact with the interfacial layer 250, a middle section in contact with the first portion 262 of the high-k dielectric layer 260, and a top section in contact with the second portions 264 of the high-k dielectric layer 260.

The first portion 262 of the high-k dielectric layer 260 is disposed on the interfacial layer 250 and has a first thickness t1, in which the first thickness t1 is measured from the top surface of the interfacial layer 250 along a direction perpendicular the top surface of the interfacial layer 250. The second portions 264 of the high-k dielectric layer 260 each have a second thickness t2, in which the second thickness t2 is measured from the SAM 240 along a direction parallel with the top surface of the interfacial layer 250 (i.e., perpendicular to a sidewall of the gate spacer 180). The first thickness t1 of the first portion 262 of the high-k dielectric layer 260 is greater than the second thickness t2 of the second portions 264 of the high-k dielectric layer 260, because the high-k dielectric layer 260 is deposited on the interfacial layer 250 at a faster rate than on the gate sidewall spacers 180.

Figure 17:
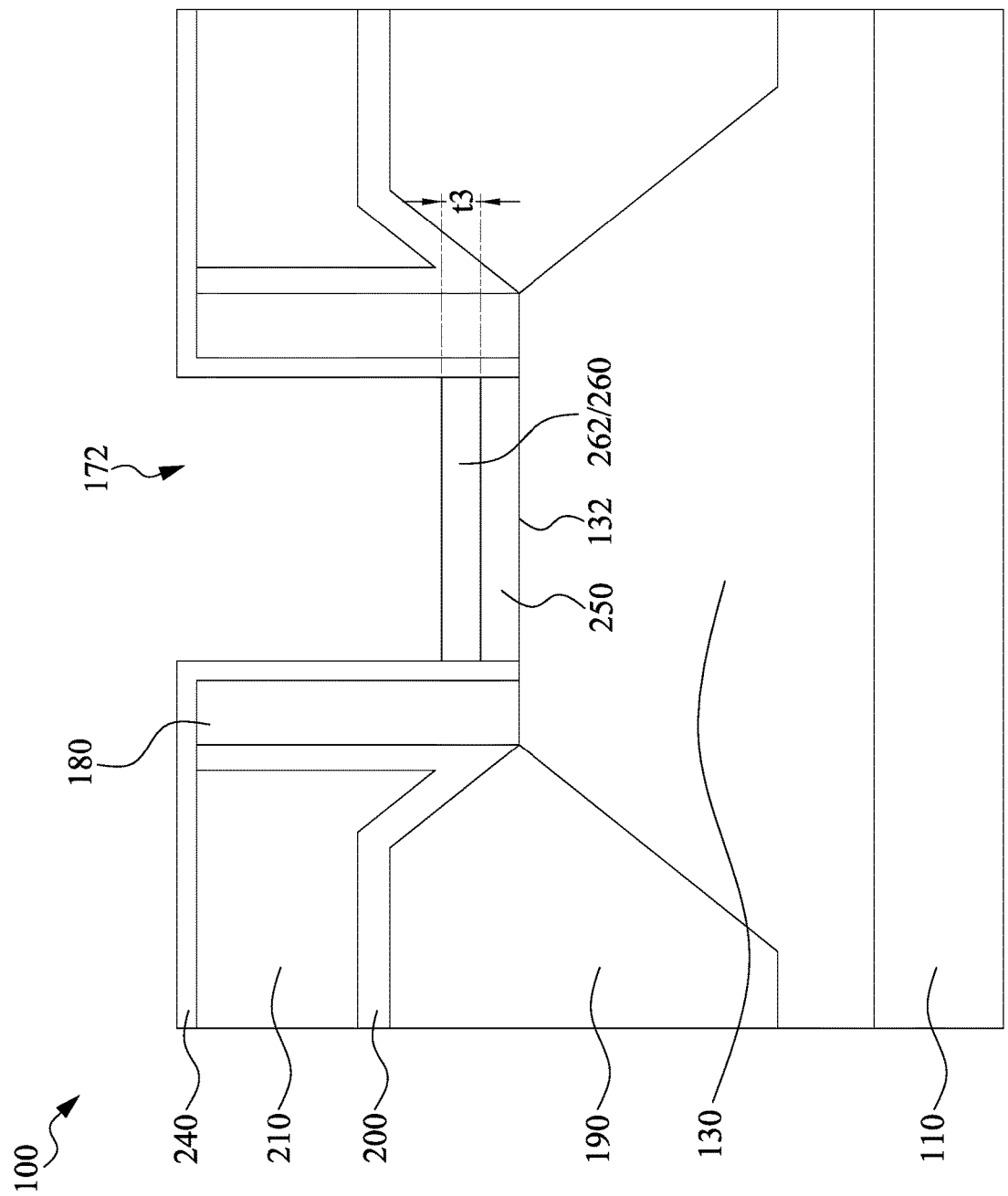

Referring to FIG. 17, an etching process is performed to substantially remove the second portions 264 (as shown in FIG. 16) of the high-k dielectric layer 260 and reduce the thickness of the first portion 262 of the high-k dielectric layer 260. The etching amount of the high-k dielectric layer 260 depends on the etching time and is predictable, such that the etching process is controllable.

Figure 49:
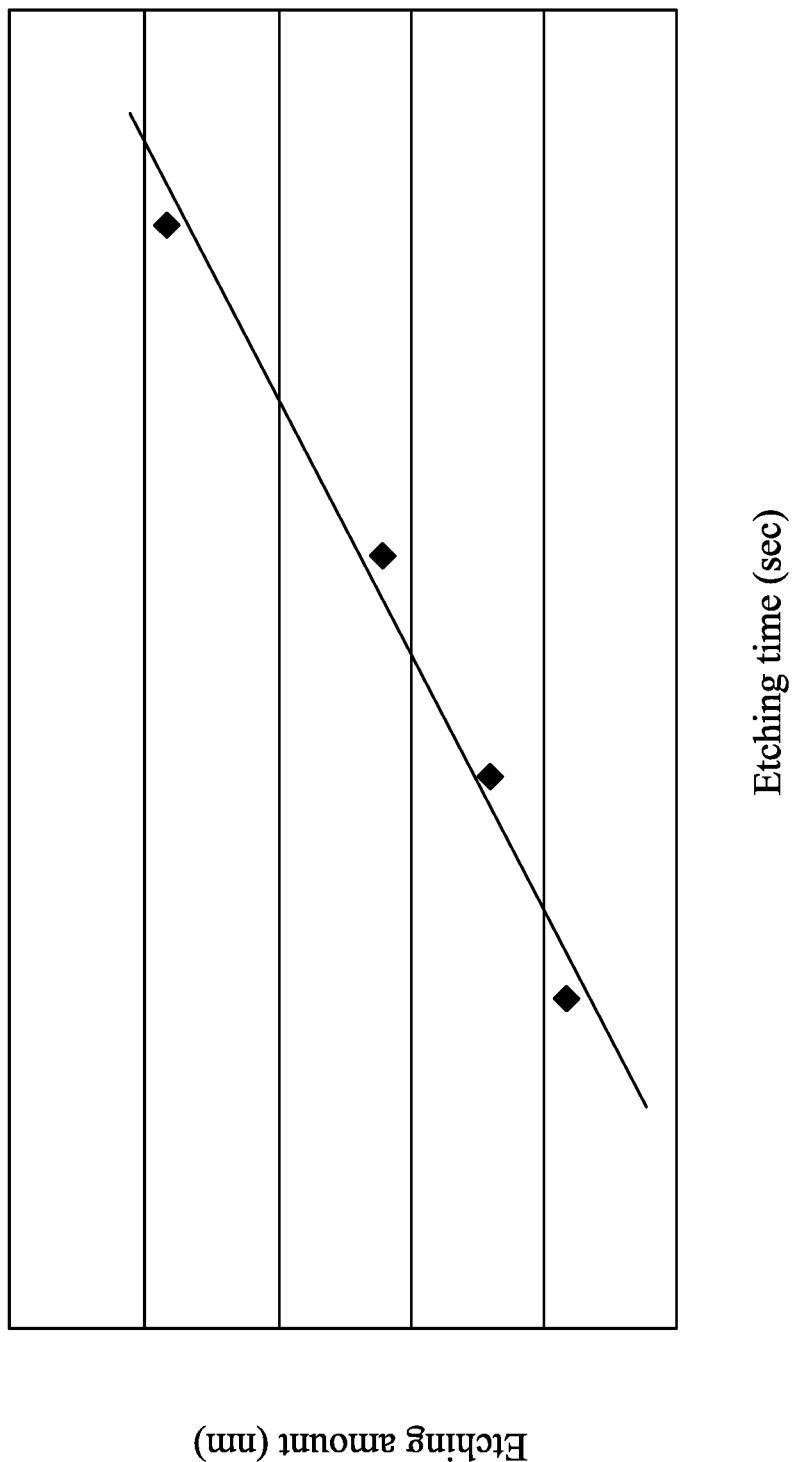
FIG. 49 is a chart that graphically illustrates how the etching amount varies under different etching time, according to some embodiments of the disclosure.

FIG. 49 is a chart that graphically illustrates a relation between the etching amount of the high-k dielectric layer and the etching time, according to some embodiments of the disclosure. The chart is a plot of etching amount (Y-axis) VS etching time (X-axis). As shown in the chart, the relation between the etching amount and the etching time is linear, and the etching amount of the high-k dielectric layer can be controlled by the etching time (interchangeably referred to as time mode).

In some embodiments, the etching chemistry candidates can be the mixture of HF, CF$_4$, CHF$_3$, CH$_2$F$_2$, CH$_3$F, HCl, NH$_3$, N$_2$, O$_2$, Ar, He, or the likes. The pressure of the etching process ranges from about 0.01T to about 3T. The operating temperature of the etching process ranges from about −30° C. to about 200° C. The etching time of the etching process ranges from about 3 seconds to about 120 seconds, depending on the thickness of the second portions 264 of the high-k dielectric layer 260.

Reference is made back to FIGS. 16 and 17. By using the time-mode etching process, the reduction of the thickness (e.g. the etching amount) of the second portions 264 of the high-k dielectric layer 260 is controllable, such that the second portions 264 of the high-k dielectric layer 260 is substantially removed after the etching process by selecting suitable etching time, as discussed above. The reduction of the thickness (e.g. the etching amount) of the first portion 262 of the high-k dielectric layer 260 is substantially equal to that of the second portions 264 of the high-k dielectric layer 260. Because the first portion 262 of the high-k dielectric layer 260 is thicker than the second portions 264 of the high-k dielectric layer 260 before the etching process, the first portion 262 of the high-k dielectric layer 260 still remains on the interfacial layer 250 after the etching process. The remaining first portion 262 has a third thickness t3. The third thickness t3 of the remaining first portion 262 of the high-k dielectric layer 260 is sufficient to prevent current leakage, and can be controlled by the etching time. Stated differently, the etching time (e.g., about 3-120 seconds) is selected to remove the high-k dielectric material from SAM 240 as well as to leave the high-k dielectric material with a sufficient thickness to prevent current leakage.

In some embodiments, etching process has an etching selectivity between the high-k dielectric layer 260 and gate sidewall spacers 180 and ILD 210, such that the gate sidewall spacers 180 and the ILD 210 remain substantially intact when the high-k dielectric layer 260 is etched. In some embodiments, the second portions 264 of the high-k dielectric layer 260 are completely removed by the etching process, and the SAM 240 remains covering the gate sidewall spacers 180 and the ILD 210.

Figure 18:
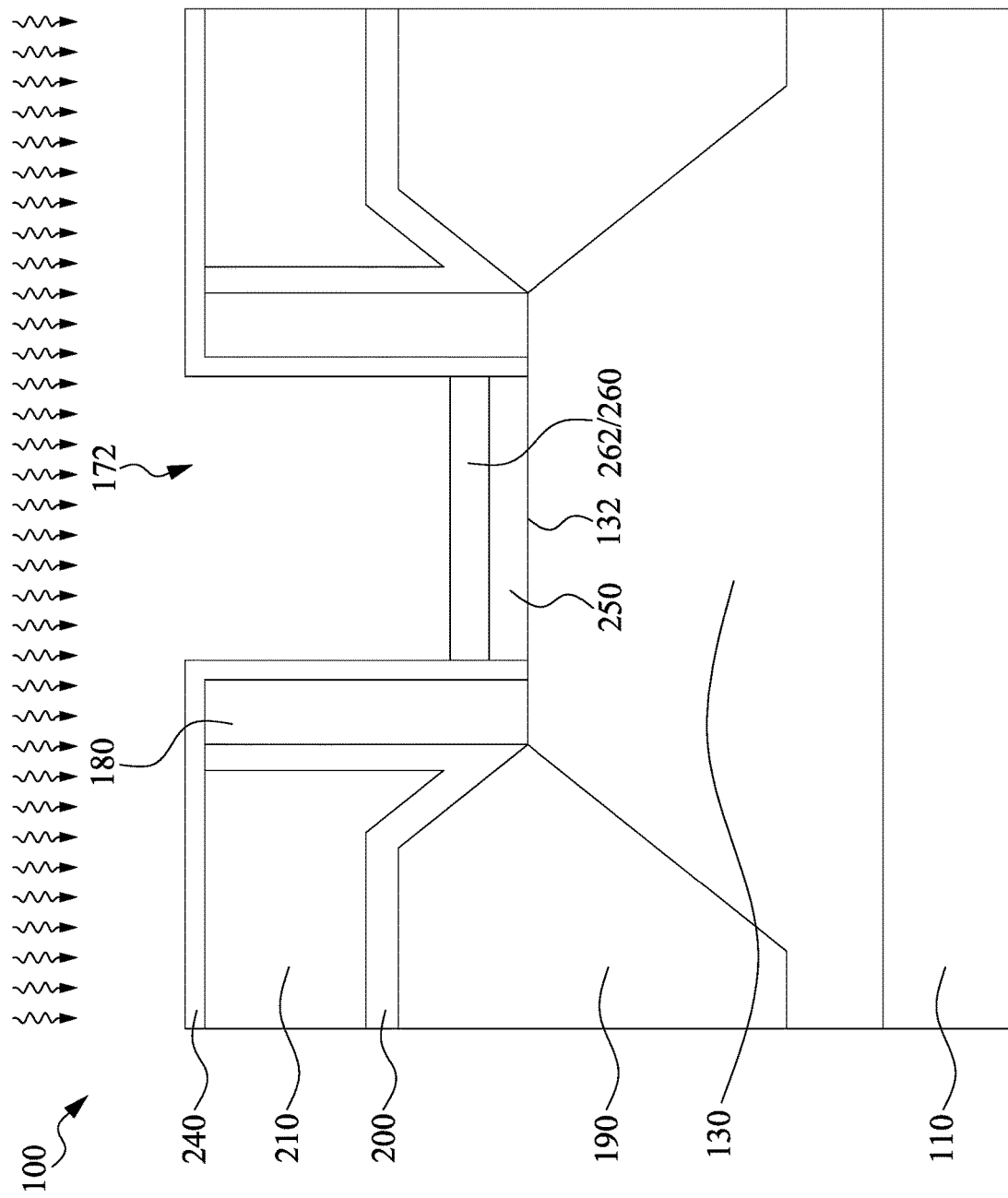

Referring to FIG. 18, a plasma cleaning process is performed to remove the SAM 240. The power of the plasma cleaning process to remove the SAM 240 is in a range from about 1 w to about 600 w, which is sufficient to remove SAM 240 but is not strong enough to remove the high-k dielectric layer 260 or the gate sidewall spacers 180. The gas utilized in the plasma cleaning process can be $Ar/H_2$ or $Ar/O_2$, the percentage ratio of $H_2$ or $O_2$ is about 1% to 100% (pure $O_2$ or $H_2$), the flowrate of the gas is about 1 sccm to about 1000 sccm.

Figure 19:
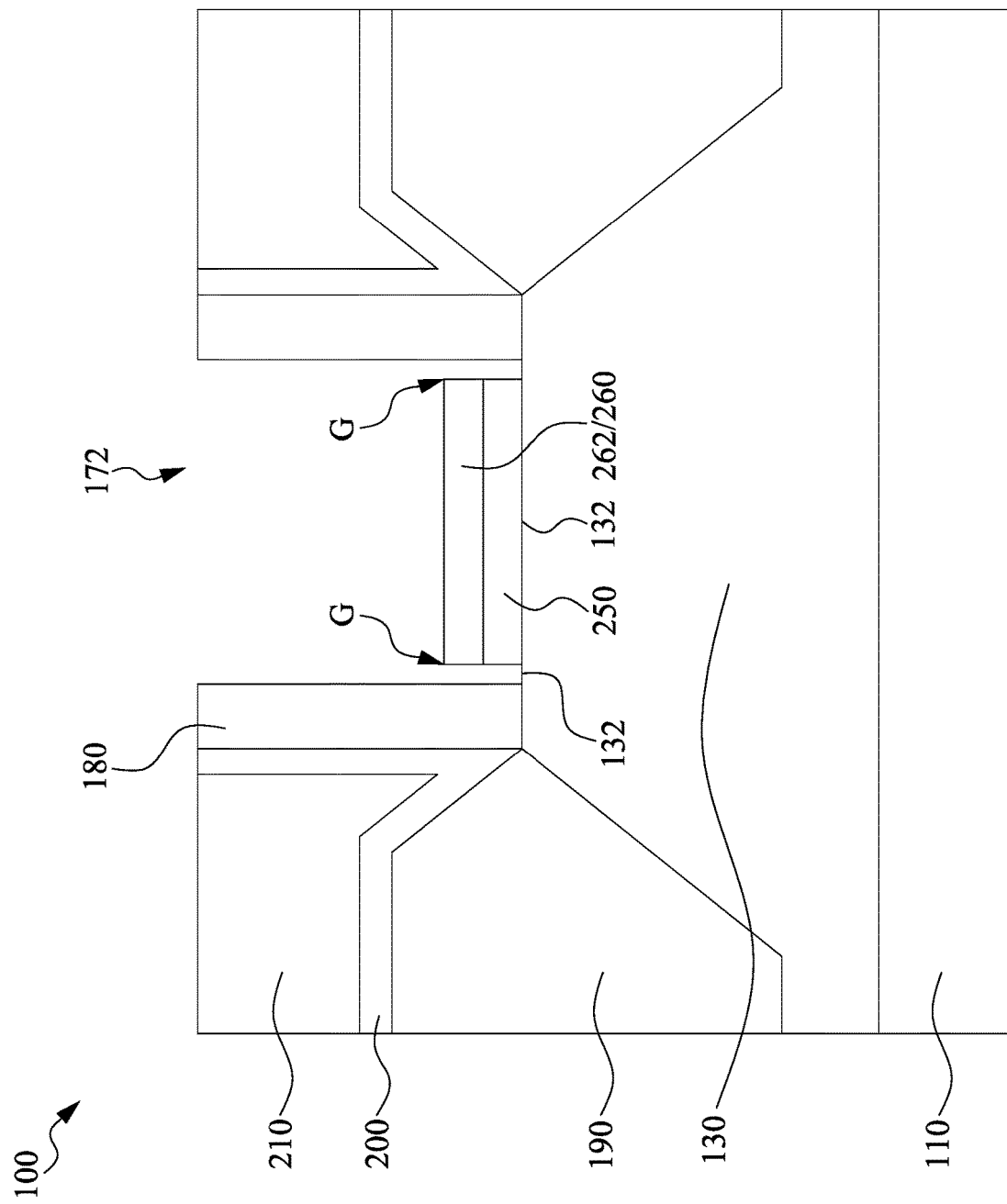

The plasma etching process is performed such that the SAM 240 is removed to expose the gate sidewall spacers 180 and the ILD 210. The resulting structure is illustrated in FIG. 19. Gaps G are formed laterally between the interfacial layer 250 and the gate sidewall spacers 180. In some embodiments, the surface of the channel region 132 of the fin structure 130 is exposed by the gaps G once the plasma cleaning process is complete.

The width of the gaps G is substantially the same as the thickness of the SAM 240, which is about 0.5 nm to about 3 nm. In some embodiments, if the thickness of the SAM 240 is less than 0.5 nm, the gate sidewall spacers 180 cannot become hydrophobic, and the deposition selectivity between the gate sidewall spacers 180 and the interfacial layer 250 of depositing the high-k dielectric layer 260 may be insufficient to create a sufficient thickness difference between the first and second portions 262 and 264 of the high-k dielectric layer 260, as illustrated in FIG. 16. In some embodiments, if the thickness of the SAM 240 is greater than 30 nm, the gaps G between the interfacial layer 250 and the gate sidewall spacers 180 may be excessively wide and thus results in a negative impact on the performance of the resulting FinFET 100.

Figure 20:
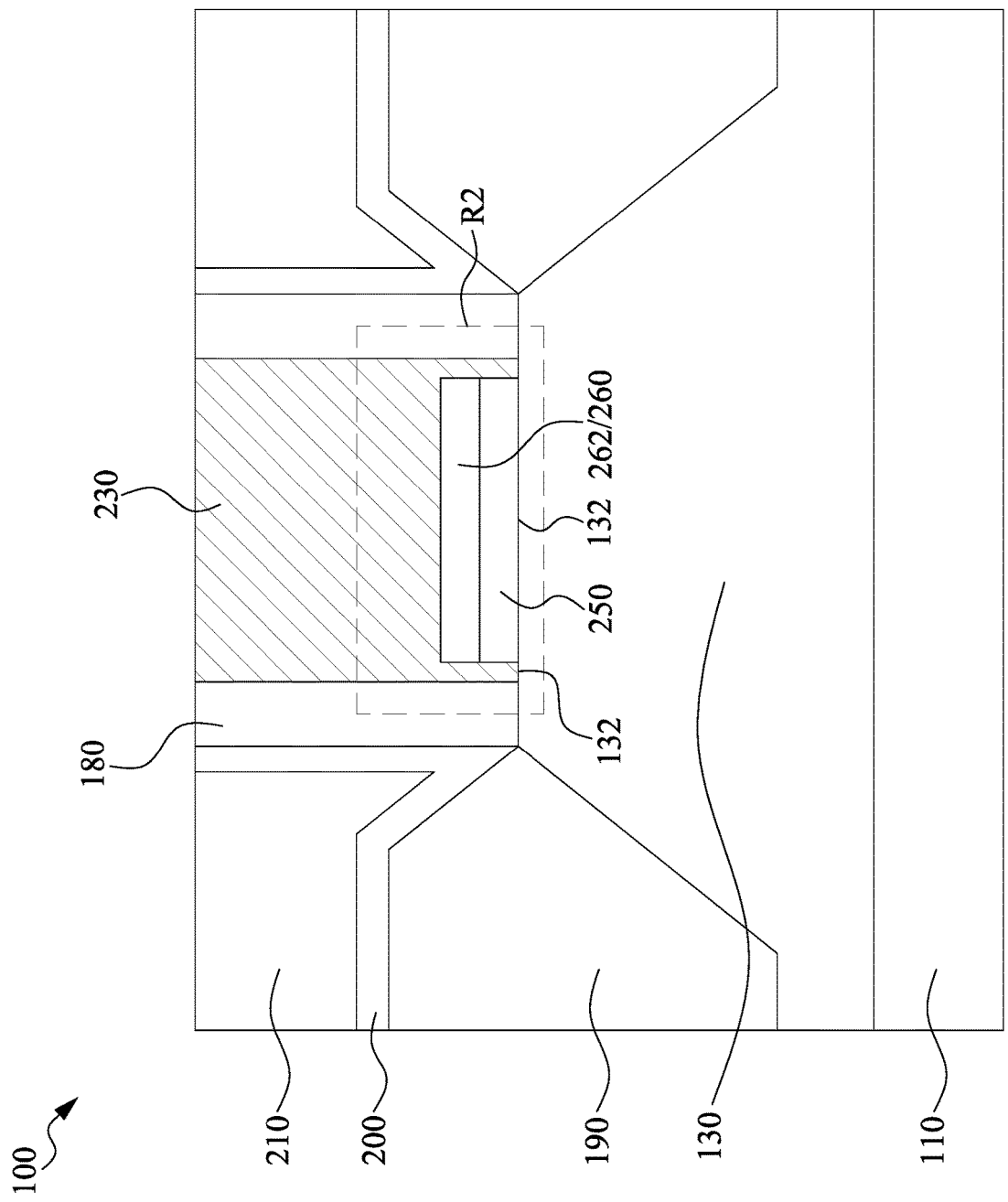
Figure 21:
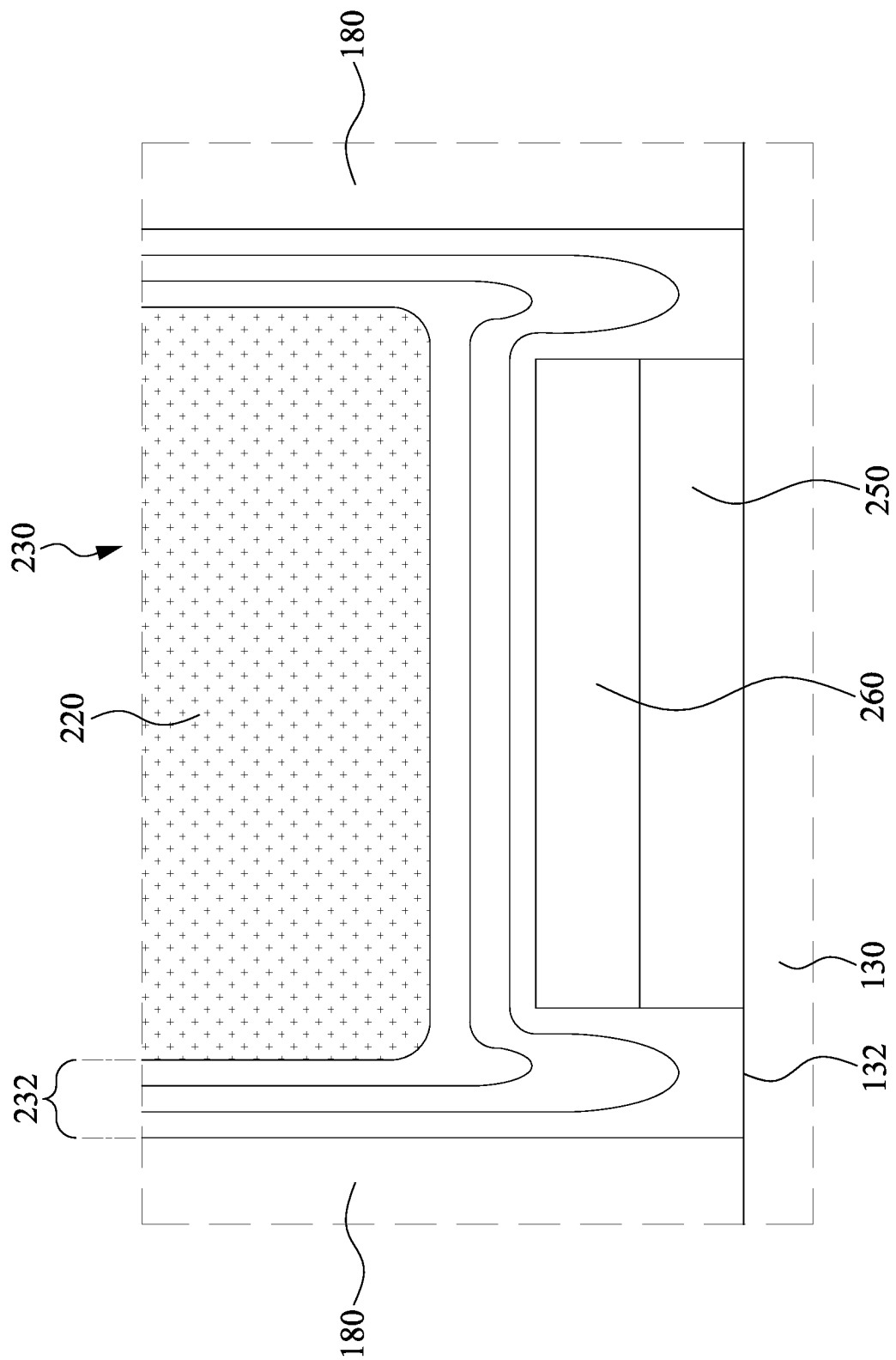
Figure 22:
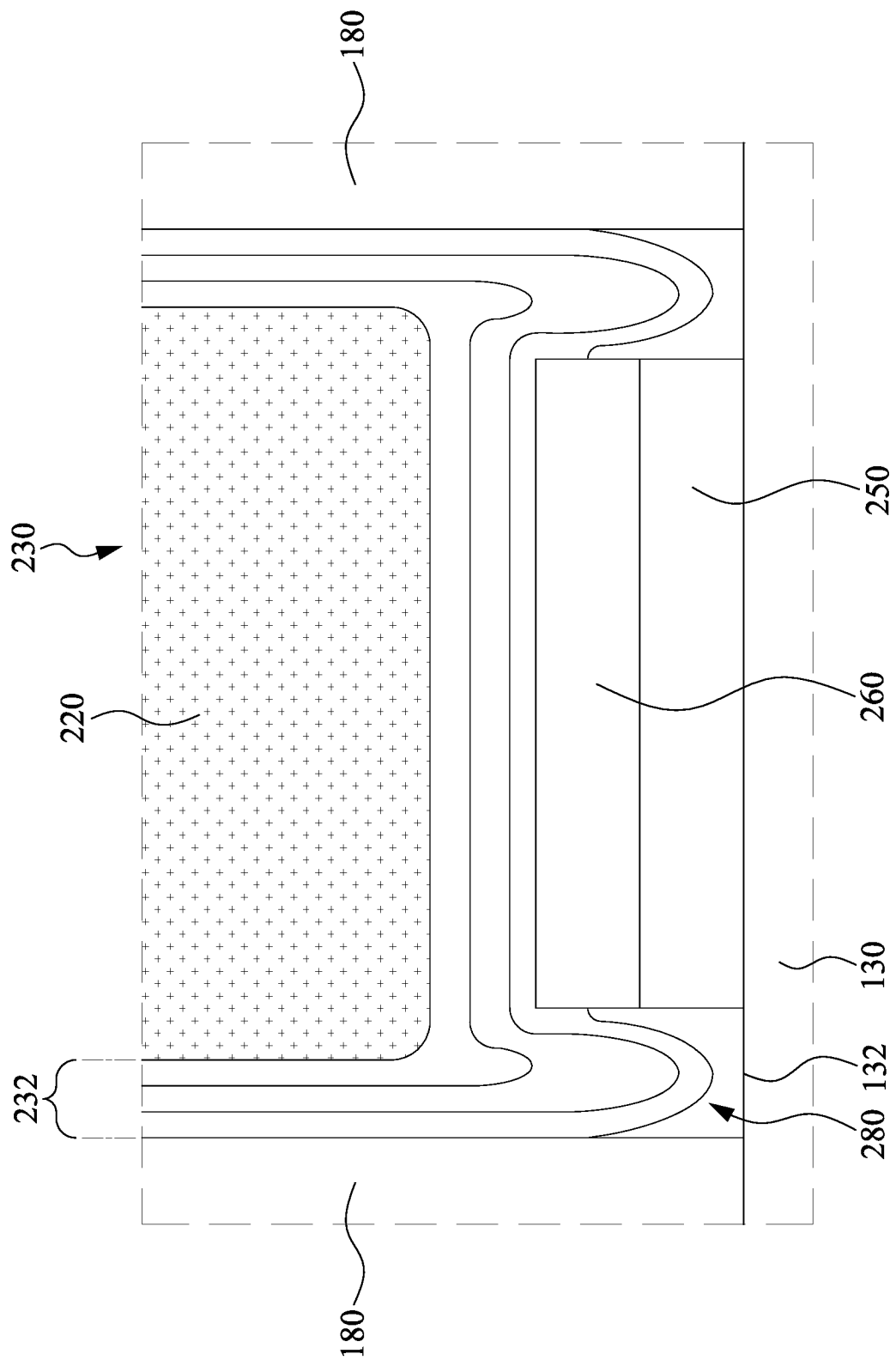

Referring to FIGS. 20-22, a metal gate structure 230 is formed in the trench. The high-k dielectric layer 260 is not the sidewall of the gate sidewall spacers 180. That is, the metal gate structure 230 directly contacts the gate sidewall spacers 180, without the high-k dielectric layer 260 interposed therebetween.

As shown in FIG. 21, which is a partial of the region R2 of FIG. 20, in some embodiments, the metal gate structure 230 includes one or more work function metal layers 232 and a metal gate electrode 220 over the work function metal layers 232. In some other embodiments, the work function metal layers 232 are formed over the high-k dielectric layer 260. The work function metal layers 232 may be formed to provide a proper work function for the resulting gate structure. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

In some embodiments, the metal gate electrode 220 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

As shown in FIG. 21, in some embodiments, the work function metal layers 232 are deposited on the surface of the fin structure 130 between the high-k dielectric layer 260 and the gate sidewall spacers 180, and the gaps G (as shown in FIG. 19) is filled by the work function metal layers 232 and the metal gate electrode 220. A CMP process is then performed to level the metal gate structure 230 with the gate spacers 180.

As shown in FIG. 22, in some other embodiments, the gaps G (as shown in FIG. 19) between the high-k dielectric layer 260 and the gate sidewall spacers 180 is too small such that the work function metal layers 232 are difficult to completely fill the gaps G after the deposition process. Therefore, some voids 280 may present between the metal gate structure 230 and the fin structure 130.

Reference is now made to FIG. 23 to FIG. 38, which are exemplary sequential processes for manufacturing the gate-all-around (GAA) FET device according to some embodiments of the present disclosure. It is understood that additional operations can be provided before, during, and after processes shown by FIG. 23 to FIG. 38, and some of the operations described below can be replaced or eliminated, for additional embodiments of the method. The order of the operations/processes may be interchangeable.

Figure 23:
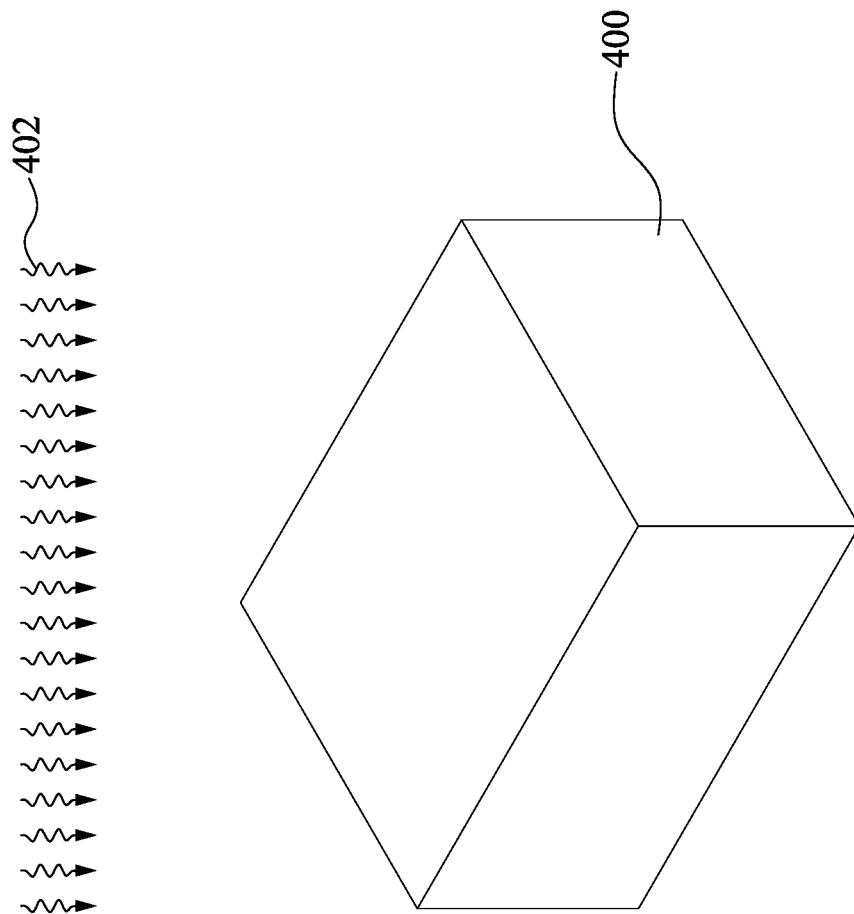
FIG. 23 to FIG. 38 are exemplary sequential processes for manufacturing the gate-all-around (GAA) FET device according to some embodiments of the present disclosure.

Referring to FIG. 23, impurity ions (dopants) 402 are implanted into a substrate 400 to form a well region. The ion implantation is performed to prevent a punch-through effect. In some embodiments, the substrate 400 may include in its surface region, one or more buffer layers (not shown). The buffer layers can serve to gradually change the lattice constant from that of the substrate to that of the source/drain regions. The substrate 400 may include various regions that have been suitably doped with impurities (e.g., p-type or n-type conductivity). The dopants 402 are, for example boron ($BF_2$) for an n-type Fin FET and phosphorus for a p-type Fin FET.

Figure 24:
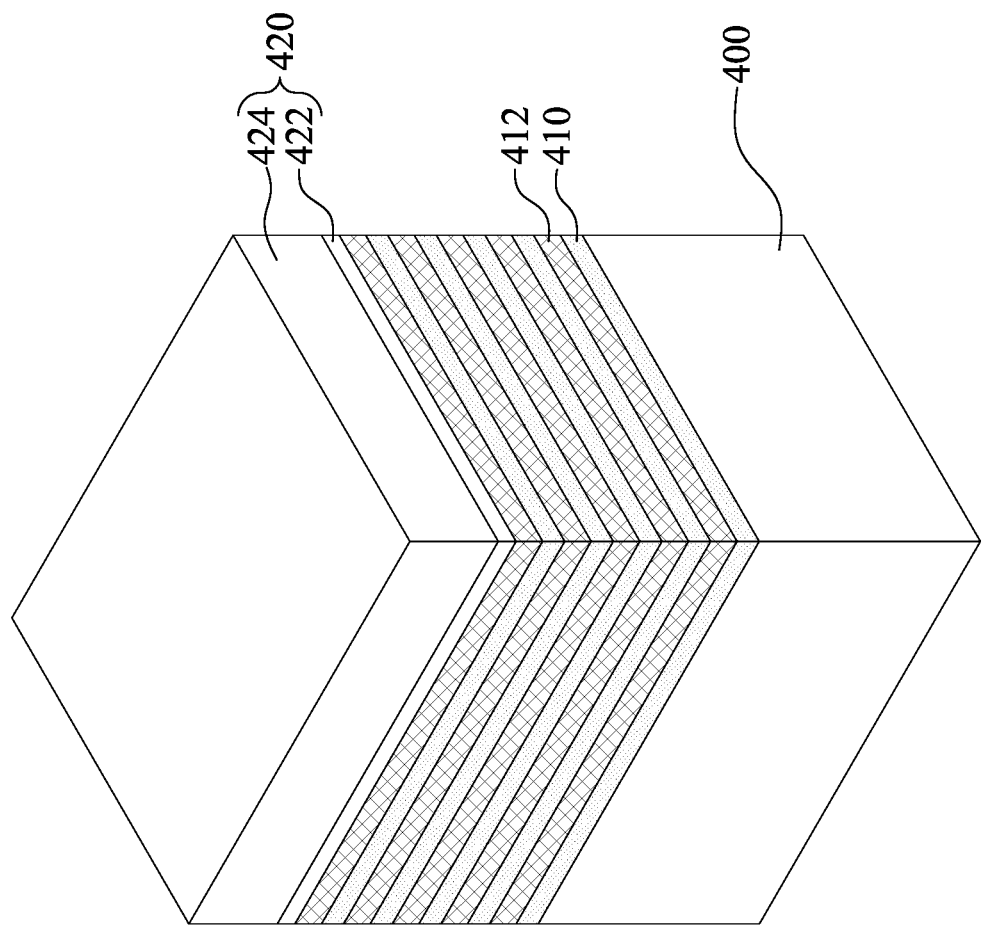

Referring to FIG. 24, stacked semiconductor layers are formed over the substrate 400. The stacked semiconductor layers include first semiconductor layers 410 and second semiconductor layers 412. Further, a mask layer 420 is formed over the stacked layers.

The first semiconductor layers 410 and the second semiconductor layers 412 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 410 and the second semiconductor layers 412 are made of Si, a Si compound, SiGe, Ge or a Ge compound. In FIG. 24, five layers of the first semiconductor layer 410 and five layers of the second semiconductor layer 412 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 410 and the second semiconductor layers 412 are epitaxially formed over the substrate 400. The thickness of the first semiconductor layers 410 may be equal to or greater than that of the second semiconductor layers 412, and is in a range from about 5 nm to about 50 nm in some embodiments, and is in a range from about 10 nm to about 30 nm in other embodiments. The thickness of the second semiconductor layers 412 is in a range from about 5 nm to about 30 nm in some embodiments, and is in a range from about 10 nm to about 20 nm in other embodiments. The thickness of each of the first semiconductor layers 410 may be the same, or may vary. In some embodiments, the bottom first semiconductor layer 410 (the closest layer to the substrate 400) is thicker than the remaining first semiconductor layers 410.

Figure 25:
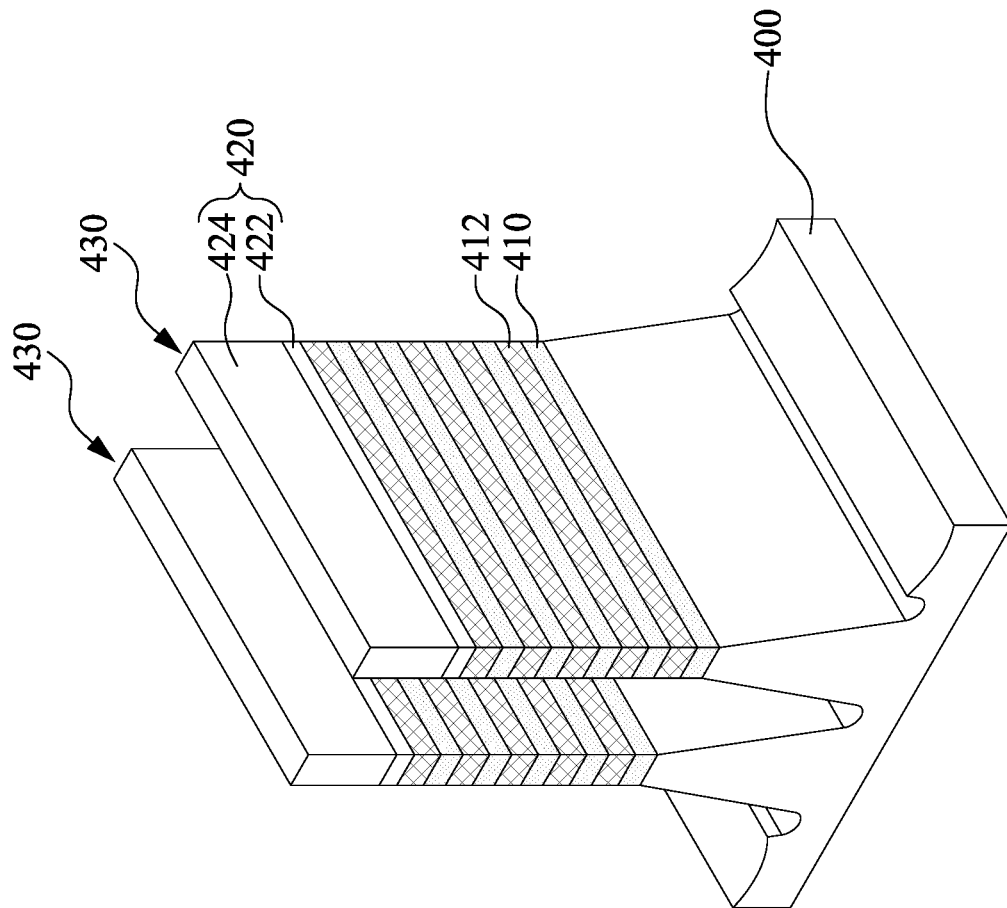

In some embodiments, the mask layer 420 includes a first mask layer 422 and a second mask layer 424. The first mask layer 422 is a pad oxide layer made of a silicon oxide, which can be formed by a thermal oxidation. The second mask layer 424 is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 420 is then patterned into a mask pattern by using patterning operations including photo-lithography and etching. Next, as shown in FIG. 25, the stacked layers of the first and second semiconductor layers 410, 412 are patterned by using the patterned mask layer, thereby the stacked layers are formed into fin structures 430 extending in the X direction. In FIG. 25, two fin structures 430 are arranged in the Y direction. But the number of the fin structures is not limited to, and may be as small as one and three or more. In some embodiments, one or more dummy fin structures are formed on both sides of the fin structures 430 to improve pattern fidelity in the patterning operations.

Figure 26:
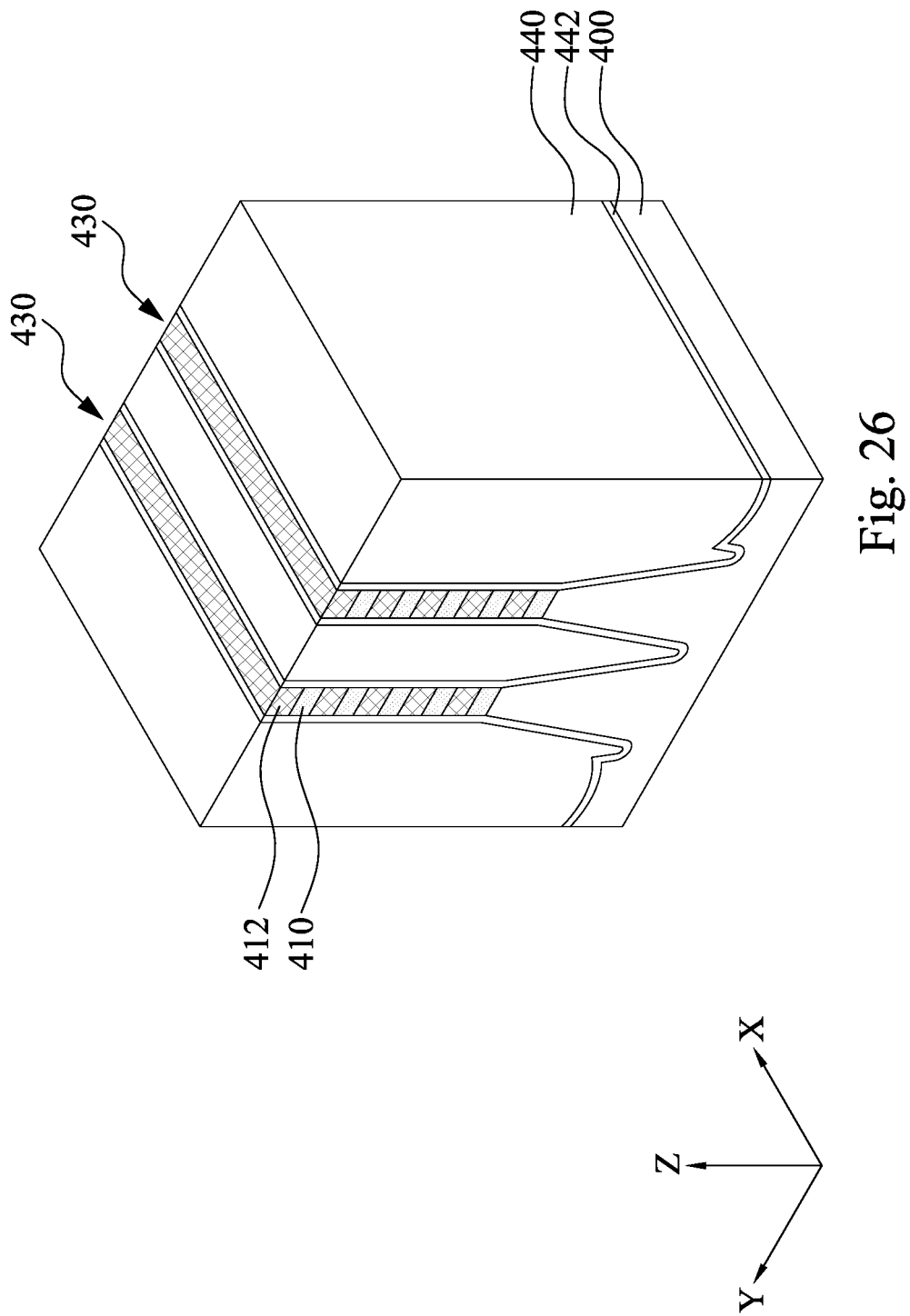

Referring to FIG. 26, after the fin structures 430 is formed, an insulating material layer 440 including one or more layers of insulating material is formed over the substrate so that the fin structures 430 are fully embedded in the insulating material layer 440. The insulating material for the insulating material layer 440 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer 440. Then, a planarization operation, such as a chemical mechanical polishing (CMP) method and/or an etch-back method, is performed such that the upper surface of the uppermost second semiconductor layer 412 is exposed from the insulating material layer 440. In some embodiments, a first liner layer 442 is formed over the structure of FIG. 25 before forming the insulating material layer 440. The first liner layer 442 is made of SiN or a silicon nitride-based material (e.g., SiON, SiCN or SiOCN).

Figure 27:
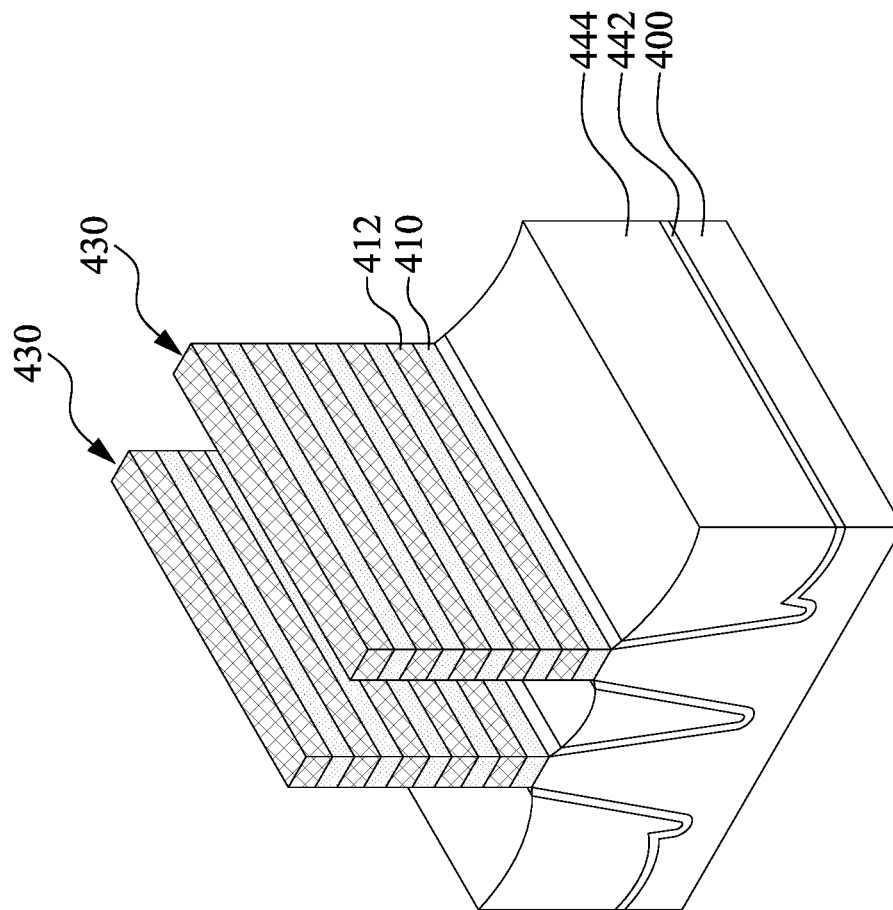

Then, as shown in FIG. 27, the insulating material layer 440 (as shown in FIG. 26) is recessed to form an isolation insulating layer 444 so that the upper portions of the fin structures 430 are exposed. With this operation, the fin structures 430 are electrically insulated from each other by the isolation insulating layer 444, which is also referred to as a STI structure. In some embodiments, the insulating material layer 440 is recessed until the bottommost first semiconductor layer 410 is exposed. The first semiconductor layers 410 are sacrificial layers which are subsequently partially removed, and the second semiconductor layers 412 will serve as channel regions of a GAA FET.

Figure 28:
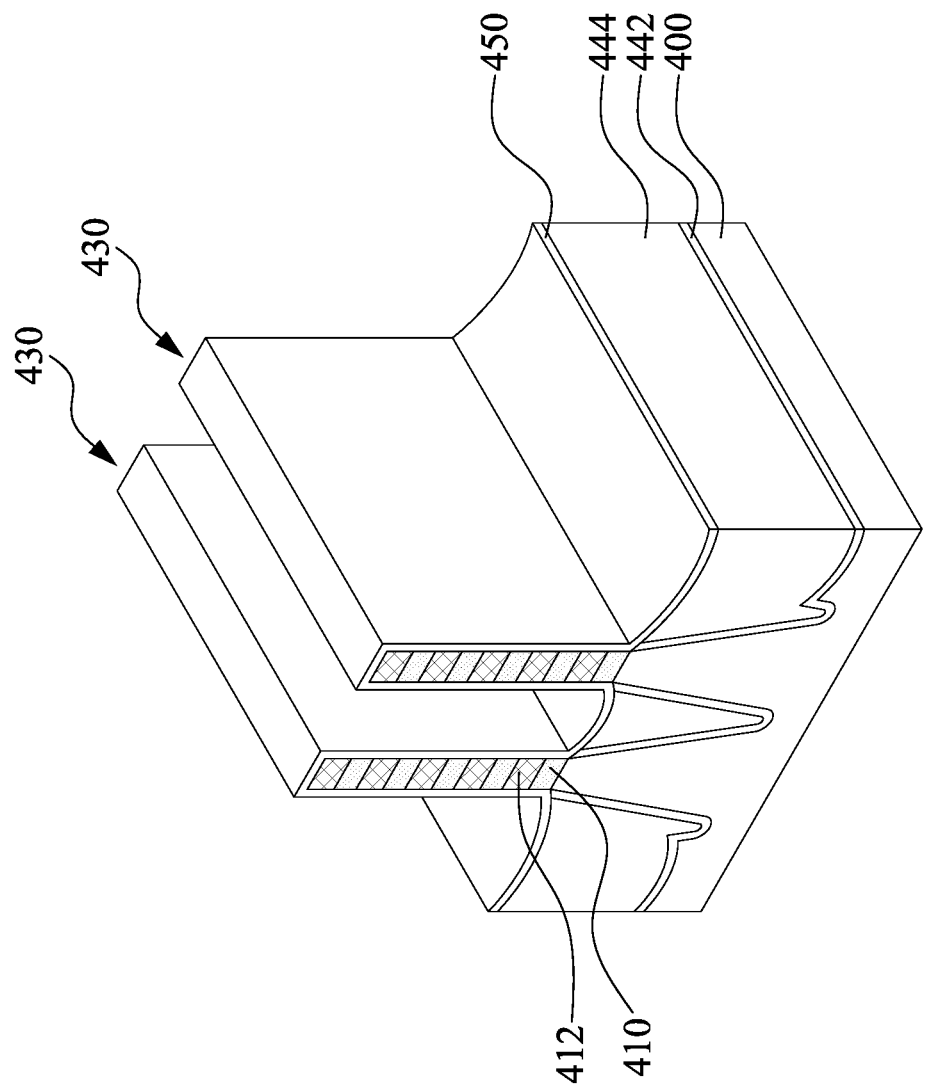
Figure 29:
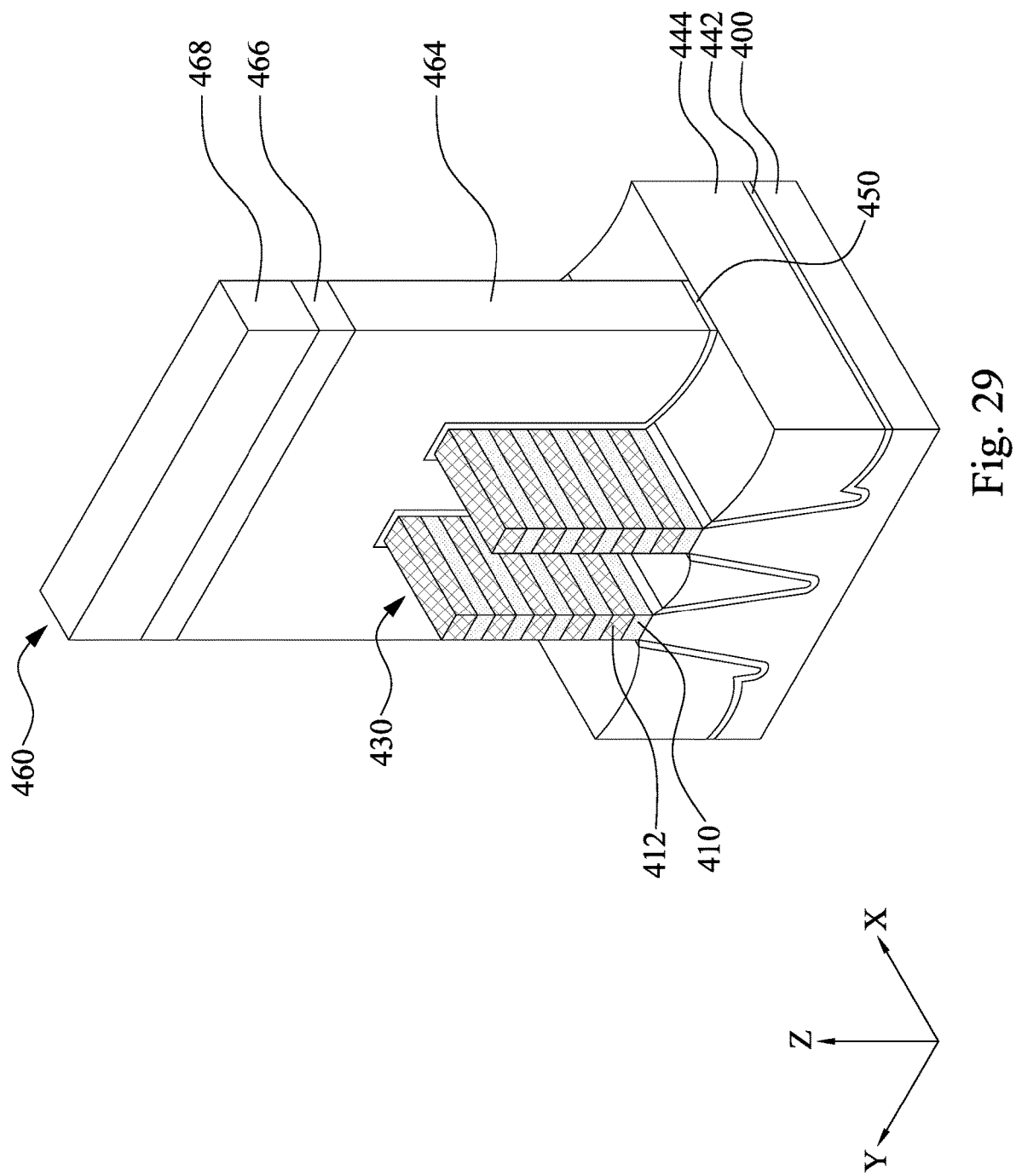

After the isolation insulating layer 444 is formed, a sacrificial gate dielectric layer 450 is formed, as shown in FIG. 28. The sacrificial gate dielectric layer 450 includes one or more layers of insulating material, such as a silicon oxide-based material. In one embodiment, silicon oxide formed by CVD is used. The thickness of the sacrificial gate dielectric layer 450 is in a range from about 1 nm to about 5 nm in some embodiments.

Afterwards, a sacrificial gate layer and a mask layer (e.g., having a pad SiN layer and a silicon oxide mask layer) are formed over the sacrificial gate dielectric layer 450, followed by patterning the mask layer, the sacrificial gate electrode layer and the sacrificial gate dielectric layer 450 into the sacrificial gate structure 460. The sacrificial gate structure 460 includes the sacrificial gate dielectric layer 450, the sacrificial gate electrode layer 464 (e.g., poly silicon), the pad SiN layer 466 and the silicon oxide mask layer 468. The stacked layers of the first and second semiconductor layers 410, 412 are partially exposed on opposite sides of the sacrificial gate structure 460, thereby defining source/drain (S/D) regions. In this disclosure, a source and a drain are interchangeably used and the structures thereof are substantially the same.

Figure 30:
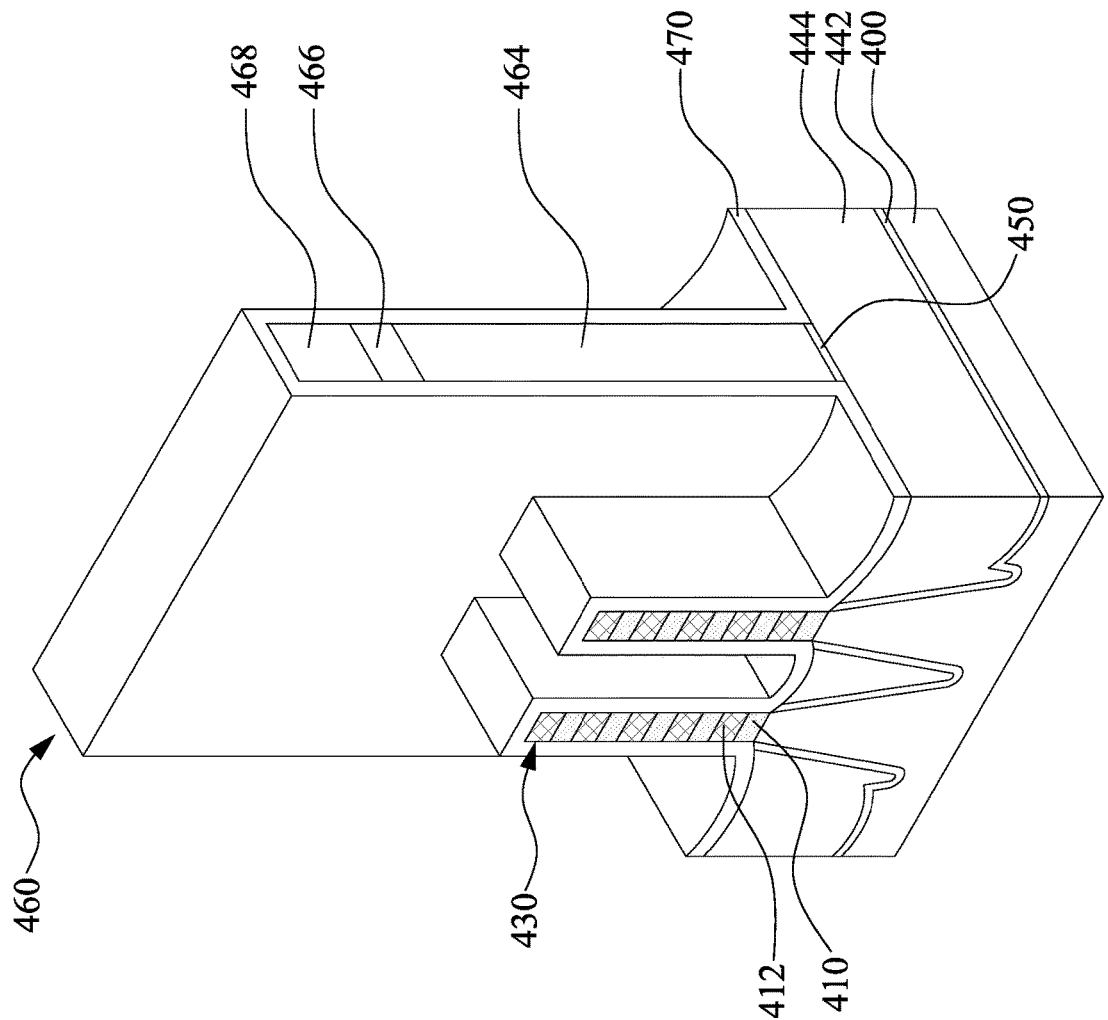

Referring to FIG. 30, after the sacrificial gate structure 460 is formed, a blanket layer 470 of an insulating material for sidewall spacers is conformally formed by using CVD or other suitable methods. The blanket layer 470 is deposited in a conformal manner so that it is formed to have substantially equal thicknesses on vertical surfaces, such as the sidewalls, horizontal surfaces, and the top of the sacrificial gate structure. In some embodiments, the blanket layer 470 is deposited to a thickness in a range from about 2 nm to about 10 nm. In one embodiment, the insulating material of the blanket layer 470 is a silicon nitride-based material, such as SiN, SiON, SiOCN or SiCN and combinations thereof.

Figure 31A:
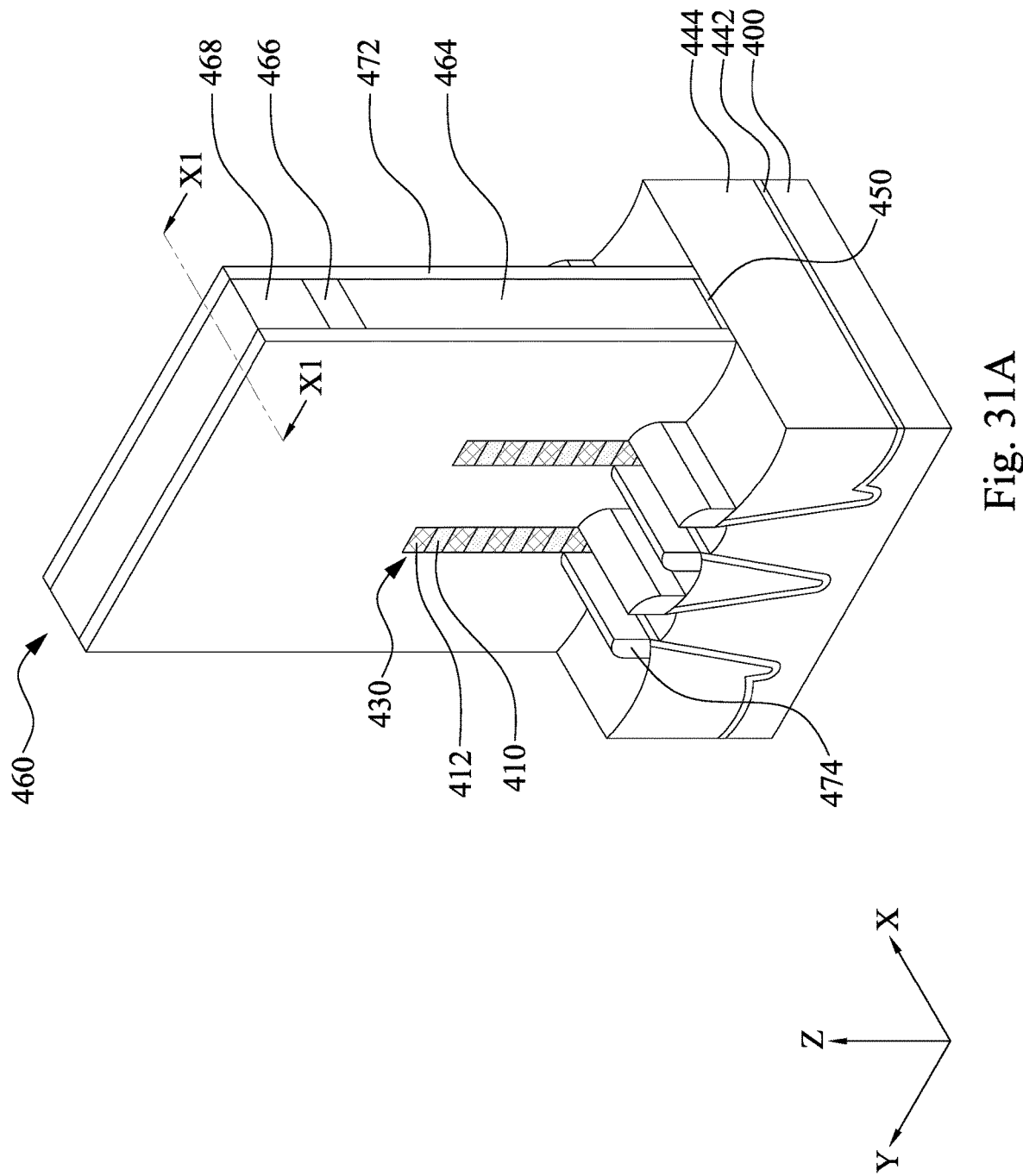
Figure 31B:
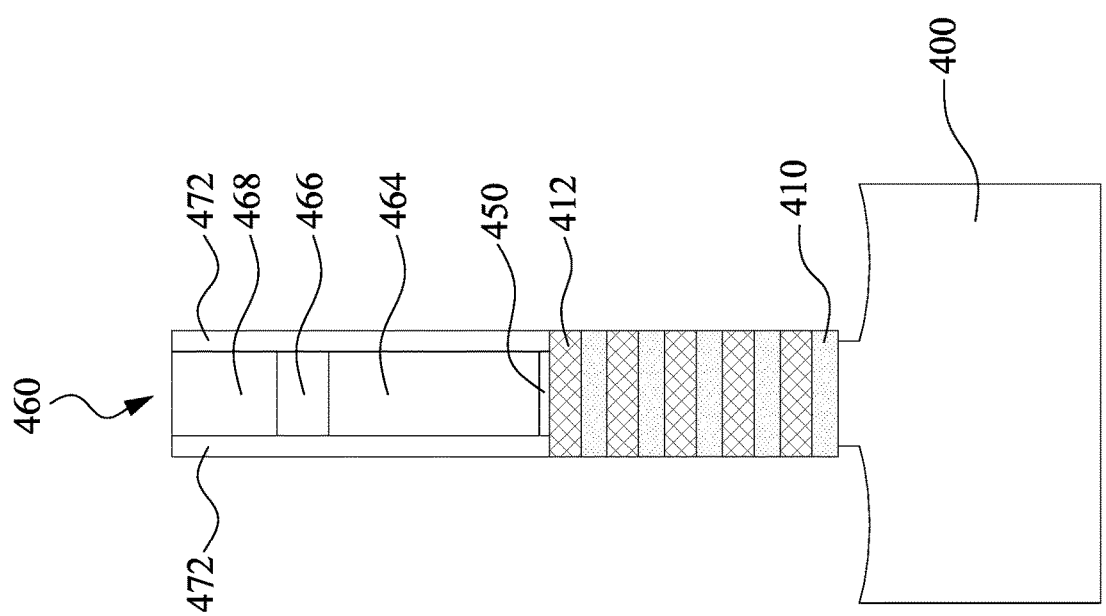

The blanket layer 470 is then etched using an anisotropic process to form gate sidewall spacers 472 on opposite sidewalls of the sacrificial gate structure 460 and fin sidewall spacers 474 on opposite sidewalls of the fin structures 430, followed by etching exposed portions of the fin structures 430 that extend laterally beyond the gate spacers 472. The resulting structure is illustrated in FIGS. 31A and 31B, wherein FIG. 31B is the cross sectional view corresponding to line X1-X1 of FIG. 31A. In FIG. 31B, the cross section of the bottom parts of one sacrificial gate structure 460 is illustrated. In some embodiments, the anisotropic process can be control such that no fin sidewall spacers 474 remain on the STI region 444.

The anisotropic etching performed on the blanket layer 470 can be, for example, reactive ion etching (RIE). During the anisotropic etching process, most of the insulating material is removed from horizontal surfaces, leaving the dielectric spacer layer on the vertical surfaces such as the sidewalls of the sacrificial gate structures 460 and the sidewalls of the exposed fin structures 430. The mask layer 468 may be exposed from the sidewall spacers.

Figure 32A:
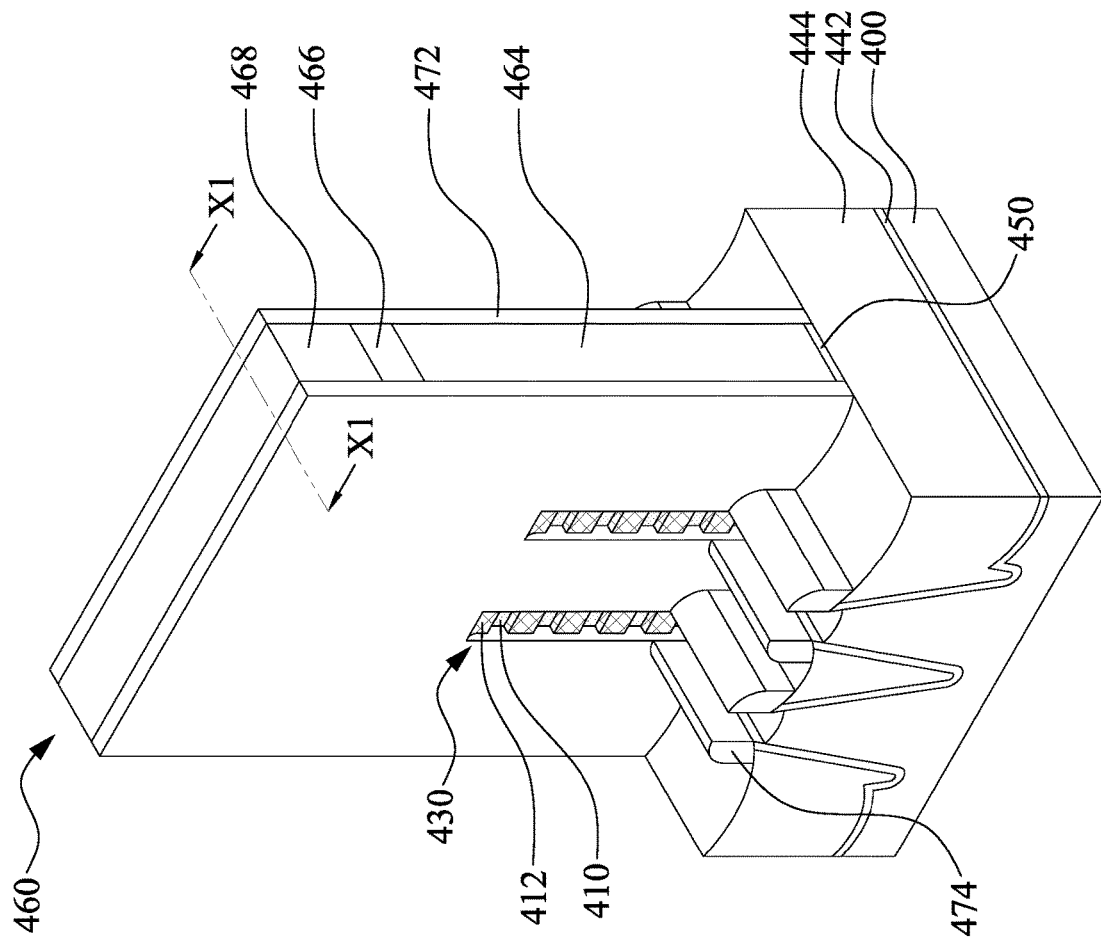
Figure 32B:
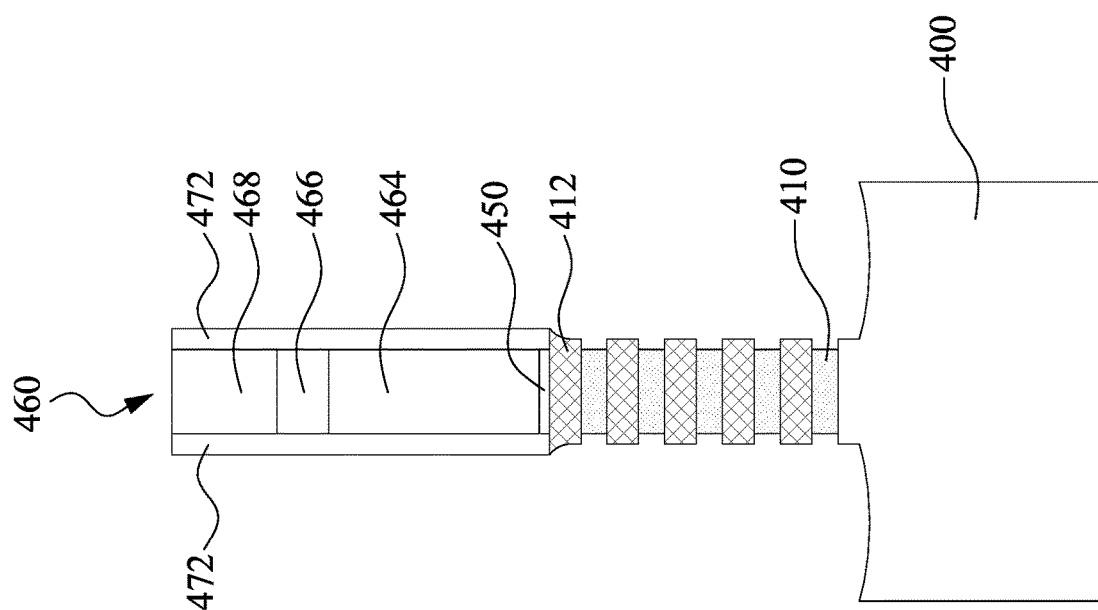

Subsequently, as shown in FIGS. 32A and 32B, the first semiconductor layers 410 are horizontally recessed (etched) so that the second semiconductor layers 412 laterally extend past opposite end surfaces of the first semiconductor layers 410. In some embodiments, as shown in FIG. 32B, end surfaces of the first semiconductor layers 410 may be substantially vertically aligned with the side surfaces of the sacrificial gate electrode layer 464. Here, "substantially vertically alignment" means the horizontal offset is less than about 1 nm.

During the recess etching of the first semiconductor layers 410 as illustrated in FIGS. 32A and 32B, the second semiconductor layers 412 may be also horizontally etched. The recessed amount of the first semiconductor layers 410 is greater than the recessed amount of the second semiconductor layers 412. In this way, the resulting second semiconductor layers 412 can laterally extend past opposite end surfaces of the first semiconductor layers 410.

Figure 33A:
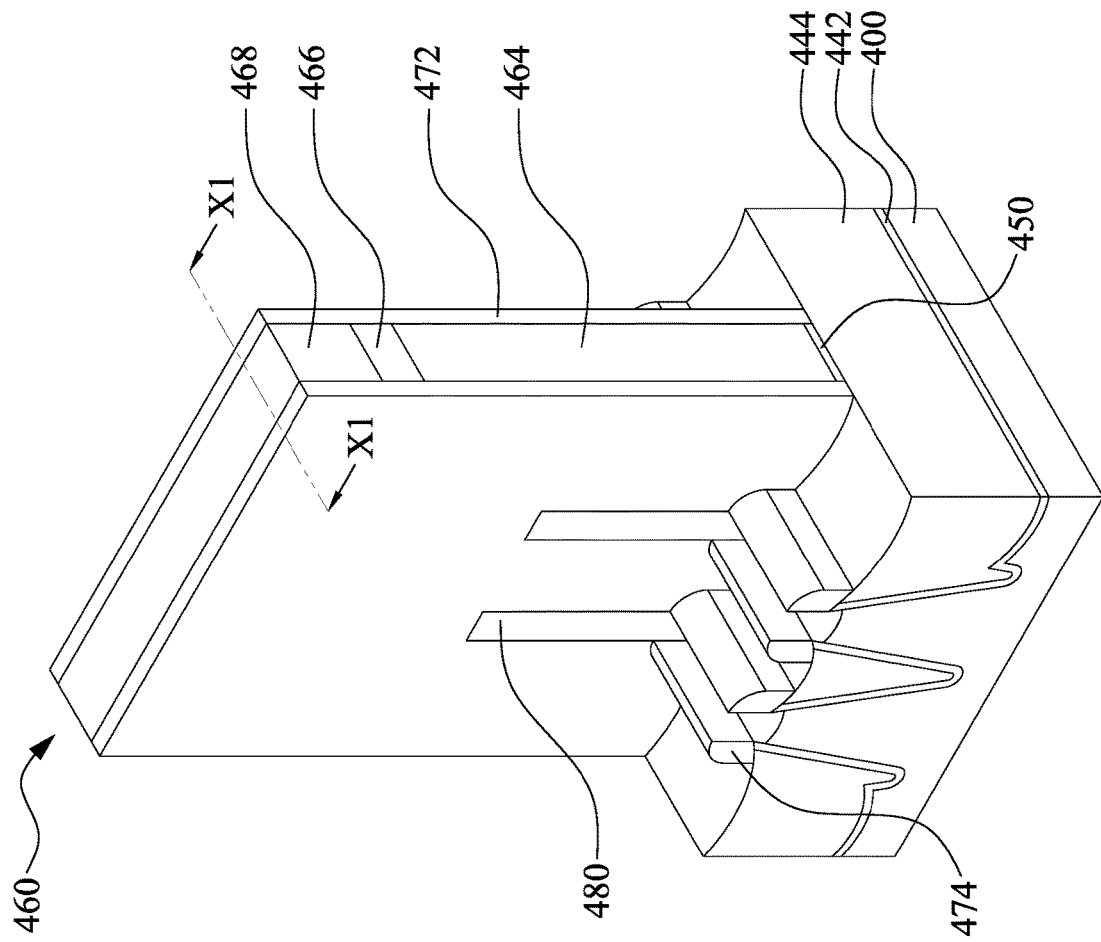
Figure 33B:
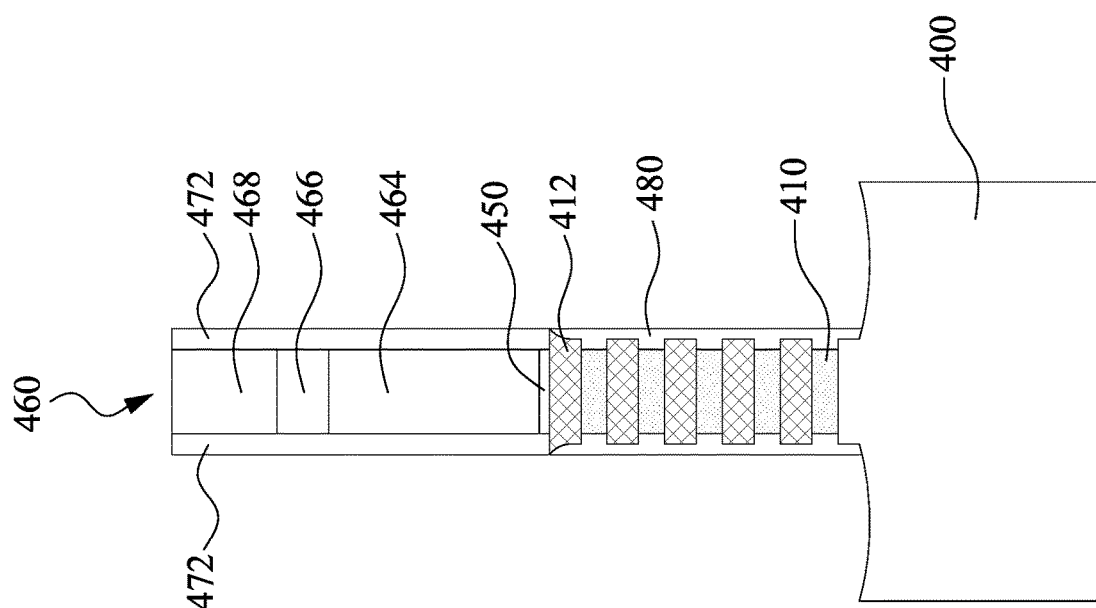

After the first semiconductor layers 410 are horizontally recessed, an inner spacer 480 is formed on the recessed surfaces of the first and second semiconductor layers 410, 412, as shown in FIGS. 33A and 33B. Formation of the inner spacer 480 includes depositing an inner spacer material layer (e.g., silicon nitride), followed by etching back the inner spacer material layer by an anisotropic etching process, to remove the inner spacer material layer from the substrate 400.

In some embodiments, the inner spacer 480 includes insulating material such as silicon nitride or the like. The thickness of the inner spacer 480 on the recessed surface of the first semiconductor layers 410 measured along X-direction is in a range from about 5 nm to about 10 nm, in some embodiments. The thickness of the inner spacer 480 on the recessed surface of the second semiconductor layers 412 measured along X-direction is in a range from about 1 nm to about 4 nm, in some embodiments. The thickness of the inner spacer 480 on the recessed surface of the second semiconductor layers 412 is about 20% to about 60% of the thickness of the inner spacer 480 on the recessed surface of the first semiconductor layers 410, in certain embodiments.

Figure 34:
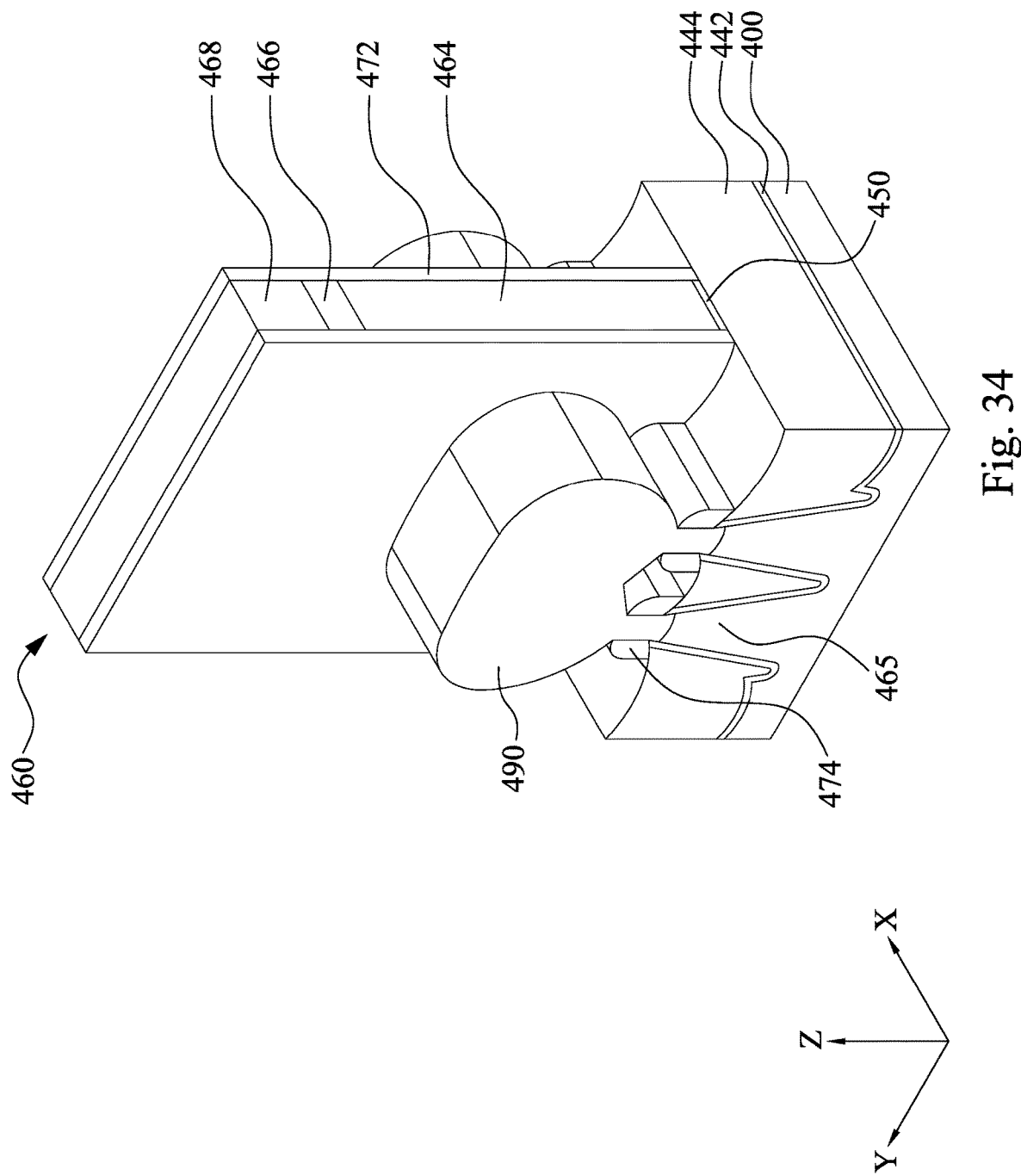

After the inner spacer 480 is formed, source/drain (S/D) epitaxial layers 490 are epitaxially grown from the exposed recessed fins 465 between the fin sidewall spacers 474, as shown in FIG. 34. The S/D epitaxial layer 490 includes one or more layers of Si, SiP, SiC and SiCP for an n-channel FET or Si, SiGe, Ge for a p-channel FET. The S/D layers 490 are formed by an epitaxial growth method using CVD, ALD or molecular beam epitaxy (MBE). In some embodiments, the epitaxial layers 490 grown from neighboring recessed fins 465 of the substrate 400 merge above the STI 444 and form a void in some embodiments. In some other embodiments, the epitaxial layers 490 grown from neighboring recessed fins 465 do not merged.

Figure 35:
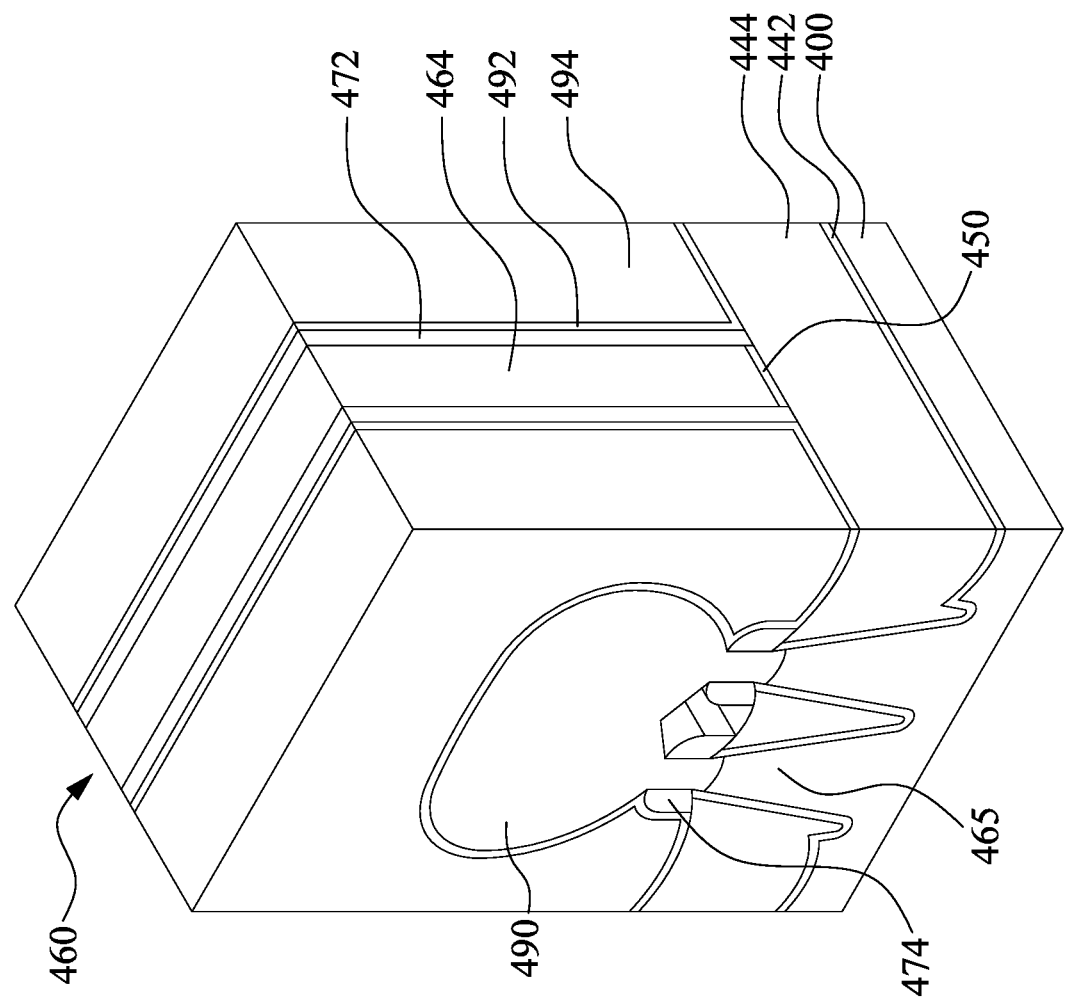

Subsequently, a second liner layer 492 is formed and then an interlayer dielectric (ILD) layer 494 is formed, as shown in FIG. 35. The second liner layer 492 is made of a silicon nitride-based material, such as SiN, and functions as a contact etch stop layer in the subsequent etching operations. The materials for the ILD layer 494 include compounds comprising Si, O, C and/or H, such as silicon oxide, SiCOH and SiOC. Organic materials, such as polymers, may be used for the ILD layer 494.

As shown in FIG. 35, after the ILD layer 494 is formed, a planarization operation, such as CMP, is performed, so that the top portion of the sacrificial gate structure 460 is exposed.

Figure 36:
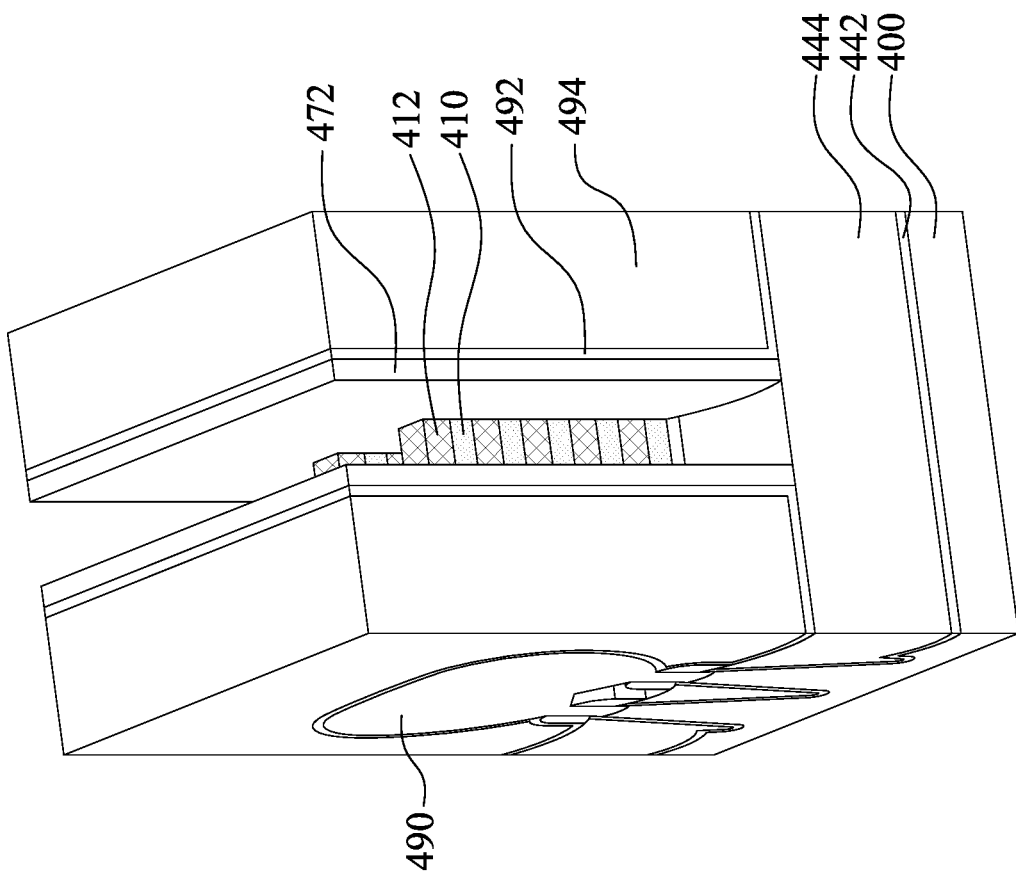

Next, as shown in FIG. 36, the sacrificial gate electrode layer 464 (see FIG. 31B) and sacrificial gate dielectric layer 450 (see FIG. 31B) are removed, thereby exposing the fin stack of the first and second semiconductor layers 410, 412.

The ILD layer 494 protects the S/D structures 490 during the removal of the sacrificial gate structures. The sacrificial gate structures can be removed using plasma dry etching and/or wet etching. When the sacrificial gate electrode layer 464 is polysilicon and the ILD layer 494 is silicon oxide, a wet etchant such as a TMAH solution can be used to selectively remove the sacrificial gate electrode layer 464. The sacrificial gate dielectric layer 450 is thereafter removed using plasma dry etching and/or wet etching.

Figure 37A:
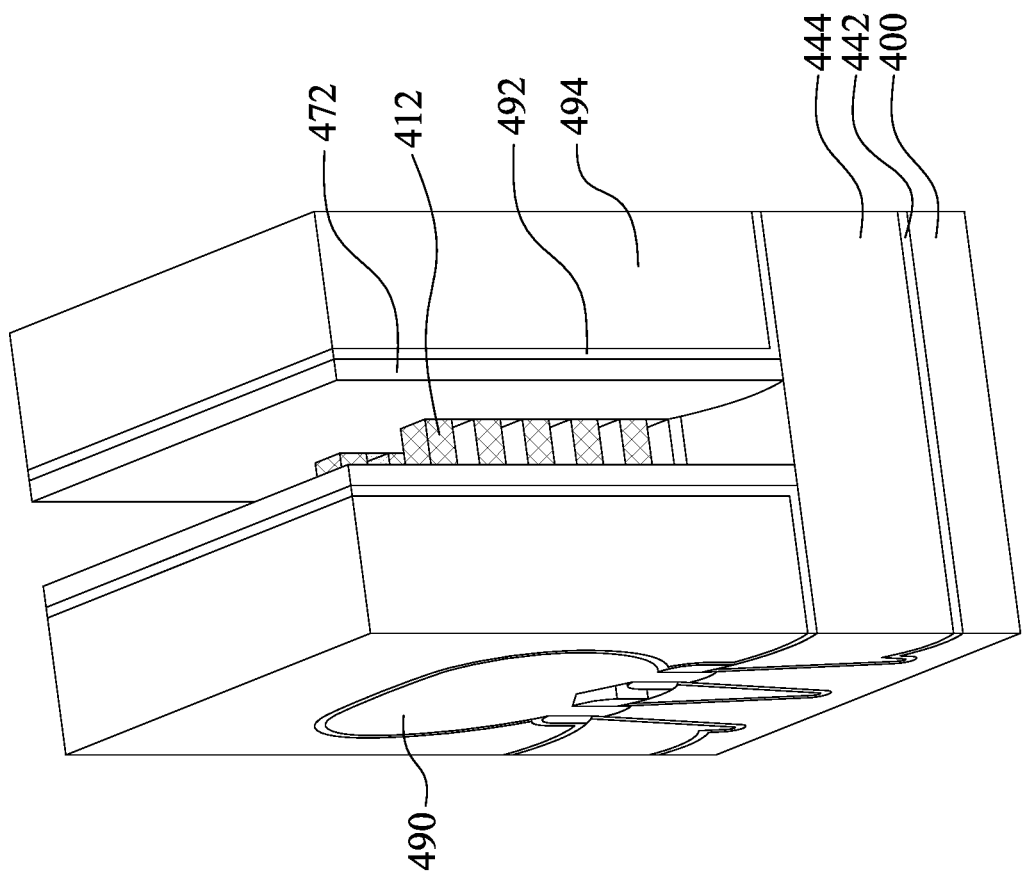
Figure 37B:
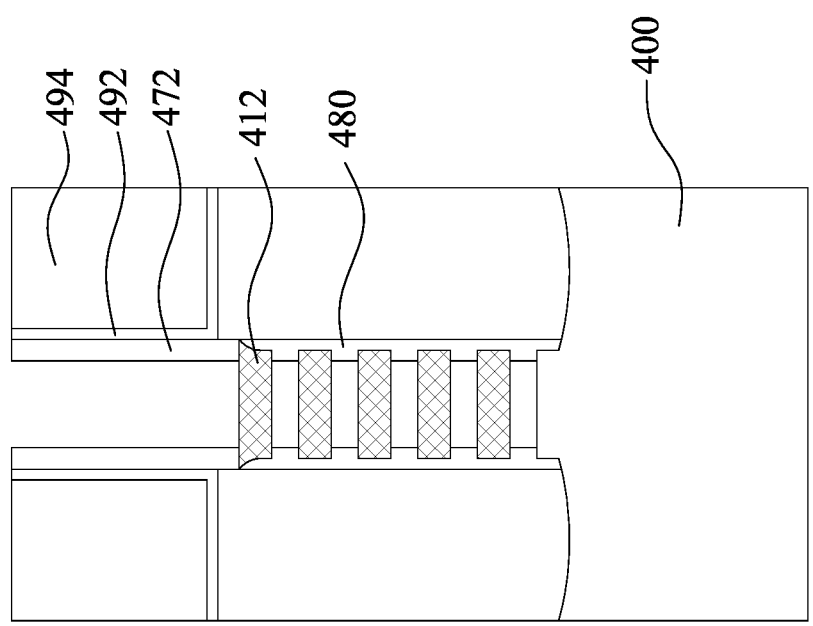

After the sacrificial gate structures are removed, the first semiconductor layers 410 (as shown in FIG. 36) in the fin structures are removed, thereby forming nanowires of the second semiconductor layers 412, as shown in FIGS. 37A and 37B. FIG. 37B is the cross sectional view along the fin structure. The first semiconductor layers 410 can be removed or etched using an etchant that can selectively etch the first semiconductor layers 410 at a faster etching rate than etching the second semiconductor layers 412.

When the first semiconductor layers 410 are Ge or SiGe and the second semiconductor layers 412 are Si, the first semiconductor layers 410 can be selectively removed using a wet etchant such as, but not limited to, ammonium hydroxide (NH4OH), tetramethylammonium hydroxide (TMAH), ethylenediamine pyrocatechol (EDP), or potassium hydroxide (KOH) solution.

When the first semiconductor layers 410 are Si and the second semiconductor layers 412 are Ge or SiGe, the first semiconductor layers 410 can be selectively removed using a wet etchant such as, but not limited to, ammonium hydroxide (NH4OH), tetramethylammonium hydroxide (TMAH), ethylenediamine pyrocatechol (EDP), or potassium hydroxide (KOH) solution.

In the present embodiment, since the inner spacer 480 is made of a material that has etching selectivity to that of the first semiconductor layers 410, the inner spacer can protect the source/drain epitaxial layers 490 from the etchant used in etching the first semiconductor layers 410.

Figure 38:
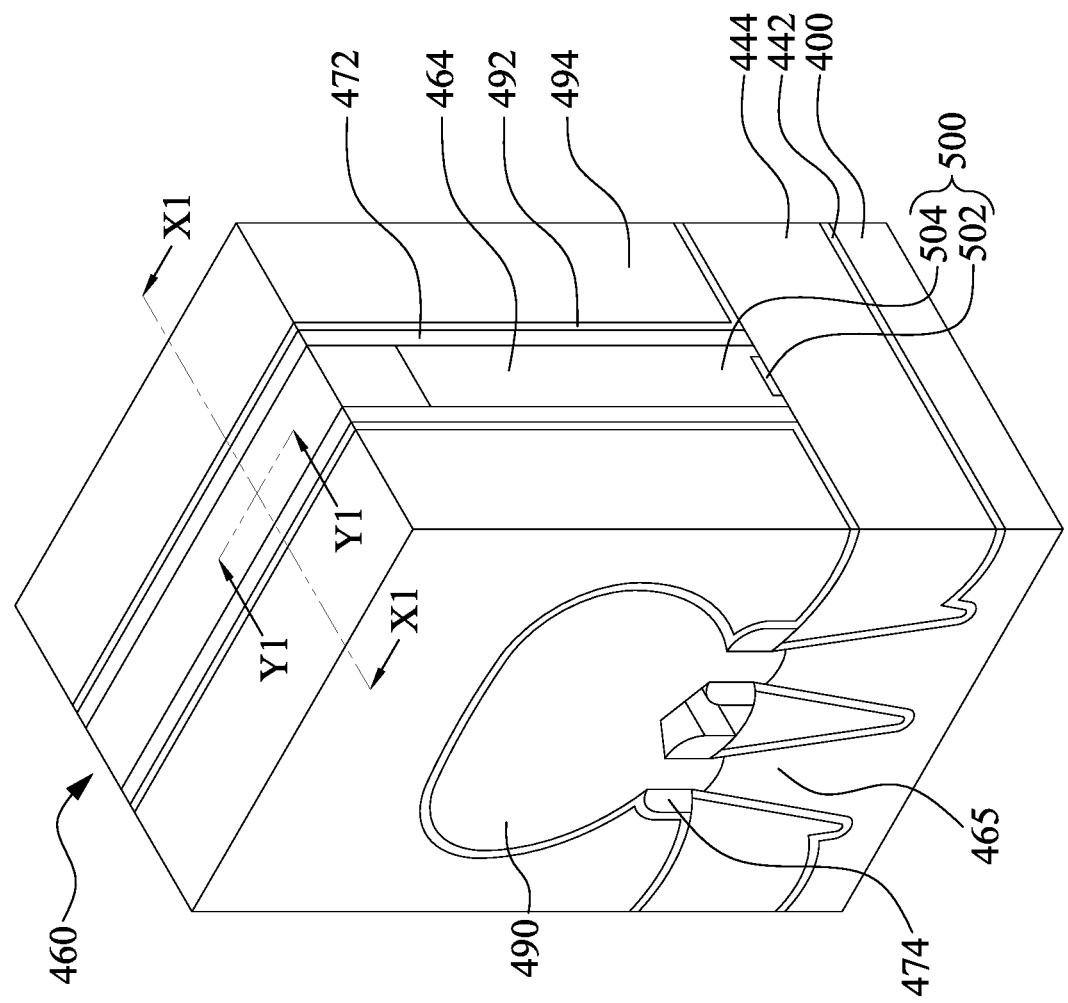

Referring to FIG. 38, after the nanowires of the second semiconductor layers 412 (as shown in FIG. 37B) are formed, a gate dielectric layer 502 is formed around each wires of the second semiconductor layers 412, and a metal gate electrode 504 is formed on the gate dielectric layer 502. The gate dielectric layer 502 and the metal gate electrode 504 are collectively referred as to a metal gate structure 500. The exemplary sequential processes of the formation of the metal gate structure 500 will be discussed in the following figures.

FIG. 39A to FIG. 46B are various cross-sectional views of a GAA device at different stages of fabrication, according to some embodiments of the disclosure, in which "A" are the cross sectional views corresponding to line X1-X1 of FIG.

38, and "B" are the cross sectional views corresponding to line Y1-Y1 of FIG. 38. FIGS. 39A and 39B follow after FIGS. 37A and 37B.

After the first semiconductor layers 410 are removed, a wet etching process including using dilute HF or buffered HF is performed to clean the exposed second semiconductor layers 412, which also serve as the channel regions of the GAA device. The HF etching makes the surface of the semiconductor materials, such as the surface of the second semiconductor layers 412 hydrophobic by hydrogen termination, while the dielectric/insulating surfaces, such as the surface of the gate sidewall spacers 472, the surface of the inner spacer 480, and the surface of the ILD layer 494 maintains-OH termination, which makes the surfaces hydrophilic.

As shown in FIGS. 39A and 39B, a self-assembled-monolayer (SAM) 510 is selectively formed on the hydrophilic surfaces of the gate sidewall spacers 472, the inner spacer 480, and the ILD layer 494, thereby converting the hydrophilic surfaces to hydrophobic surfaces. The surface of the second semiconductor layers 412 is hydrophobic, therefore the SAM 510 would not adhere on the hydrophobic surface.

As shown in FIG. 40A and FIG. 40B, interfacial layers 520 are formed on the surface of the channel region, e.g. the surface of the second semiconductor layers 412, and on the surface of the recessed fin structure 465. The interfacial layers 520 are formed by using a wet chemical oxidation, using an aqueous solution containing sulfuric acid ($H_2SO_4$) and hydrogen peroxide ($H_2O_2$) (SPM), ozone water, an aqueous solution containing $NH_4OH$ and $H_2O_2$ (SC1), or an aqueous solution containing HCl and $H_2O_2$ (SC2). By wet chemical oxidation, thin $SiO_2$ interfacial layers 520 having a thickness of about 0.2 nm to about 2 nm, of which surface is hydrophilic, is formed. The SAM 510 is stably maintained during the wet chemical oxidation.

In other embodiments, instead of forming $SiO_2$ interfacial layers 520, the surface of the second semiconductor layers 412 and the surface of the recessed fin structure 465 can be modified to be hydrophilic by using $H_2O_2$ vapor.

Once the hydrophilic surface, e.g. the $SiO_2$ interfacial layers 520 are formed, a subsequently formed layer can be substantially selectively formed on the hydrophilic surface by using ALD. In some embodiments, by adjusting a process temperature of ALD, a layer is deposited selectively on the hydrophilic surface at a faster deposition rate than on the hydrophobic surface.

Figure 41B:
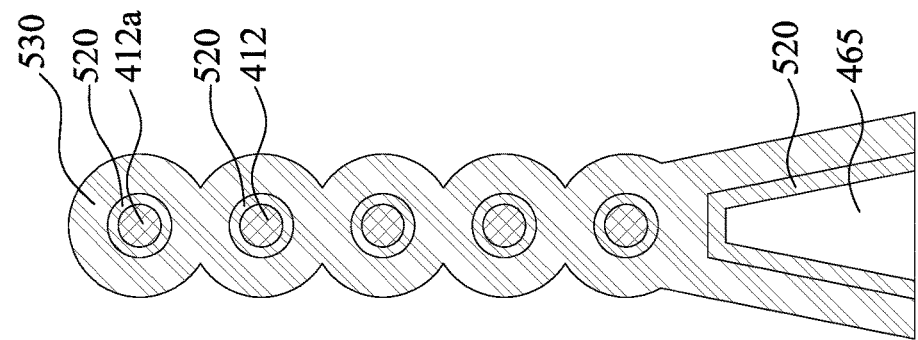
Figure 41A:
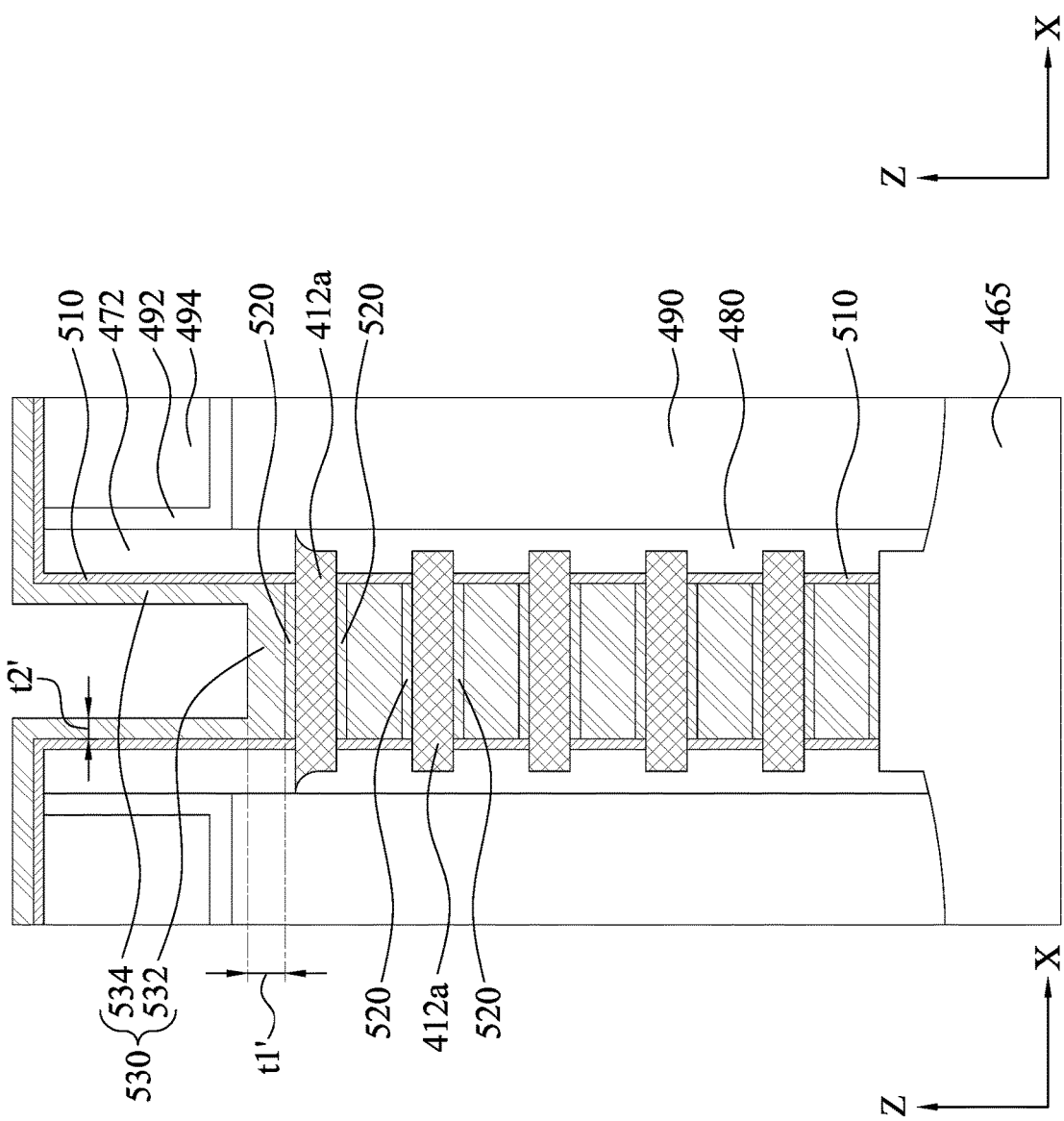

Referring to FIGS. 41A and 41B, after the interfacial layers 520 are formed, a high-k dielectric layer 530 is selectively formed on the gate sidewall spacers 472, the surface of the inner spacer 480, and the surface of the ILD layer 494 having the SAM 510 thereon and the interfacial layer 250, by a deposition process. In some embodiments, the high-k dielectric layer 530 is formed by an ALD process, in which the precursor can be TDMAHf, TDEAHf, $HfCl_4$, the processing gas can be Ar or $N_2$, the ratio thereof is from about 1 to about 10, the reacting time is about 20 seconds to about 200 seconds, and the reacting temperature is from about 100° C. to about 350° C.

Because the surface of the SAM 510 on the gate sidewall spacers 472 is hydrophobic, and the surface of the interfacial layer 520 is hydrophilic, the deposition rate of the high-k dielectric layer 530 on the gate sidewall spacers 472 is different from the deposition rate of the high-k dielectric layer 530 on the interfacial layer 520. The difference of the depositions rates depends on the material of the high-k dielectric layer 530 and the number of ALD cycles.

As a result, the thickness of the high-k dielectric layer 530 is not uniform. For example, the high-k dielectric layer 530 above the topmost second semiconductor layer 412a and between the gate sidewall spacers 472 has a first portion 532 and two second portions 534 connected to the ends of the first portion 532. The first portion 532 is in contact with the interfacial layer 520, and the second portions 534 protrudes from the ends of the first portion 532 and are in contact with the SAM 510 on the gate sidewall spacers 472. That is, the SAM 510 on the gate sidewall spacers 472 has a bottom section in contact with the interfacial layer 520, a middle section in contact with the first portion 532 of the high-k dielectric layer 530, and a top section in contact with the second portions 534 of the high-k dielectric layer 530.

The first portion 532 of the high-k dielectric layer 530 is disposed on the interfacial layer 520 and has a first thickness $t1'$, in which the first thickness $t1'$ is measured from the top surface of the interfacial layer 520 along Z-direction. The second portions 534 of the high-k dielectric layer 530 respectively has a second thickness $t2'$, in which the second thickness $t2'$ is measured from the SAM 510 along X-direction. The first thickness $t1'$ of the first portion 532 of the high-k dielectric layer 530 is greater than the second thickness $t2'$ of the second portions 534 of the high-k dielectric layer 530, because the high-k dielectric layer 530 is deposited at a faster deposition rate on the interfacial layer 520 than on the gate sidewall spacers 472.

Referring to FIGS. 42A and 42B, an etching process is performed to substantially remove the second portions 534 (as shown in FIG. 41A) of the high-k dielectric layer 530 and reduce the thickness of the first portion 532 of the high-k dielectric layer 530. The etching amount of the etching process depends on the etching time and is linear, such that the etching process is controllable.

In some embodiments, the etching chemistry candidates can be the mixture of HF, $CF_4$, $CHF_3$, $CH_2F_2$, $CH_3F$, HCl, $NH_3$, $N_2$, $O_2$, Ar, He, or the likes. The pressure of the etching process ranges from about 0.01T to about 3T. The operating temperature of the etching process ranges from about −30° C. to about 200° C. The etching time of the etching process ranges from about 3 seconds to about 120 seconds, depending on the thickness of the second portions of the high-k dielectric layer.

Reference is made back to FIGS. 41A and 42A. By using the time-mode etching process, the reduction of the thickness (e.g. the etching amount) of the second portions 534 of the high-k dielectric layer 530 is controllable, such that the second portions 534 of the high-k dielectric layer 530 is substantially removed after the etching process. The reduction of the thickness (e.g. the etching amount) of the first portion 532 of the high-k dielectric layer 530 is substantially equal to that of the second portions 534 of the high-k dielectric layer 530. Because the first portion 532 of the high-k dielectric layer 530 is thicker than the second portions 534 of the high-k dielectric layer 530 before the etching process, the first portion 532 of the high-k dielectric layer 530 still remains on the interfacial layer 520 after the etching process and has a third thickness $t3'$. The third thickness $t3'$ of the first portion 532 of the high-k dielectric layer 530 is sufficient to prevent current leakage.

In some embodiments, etching process has an etching selectivity between the high-k dielectric layer 530, and the gate sidewall spacers 472, the inner spacer 480 and the ILD layer 494. That is, the etching rate of etching the high-k dielectric layer 530 is faster that the etching rate of etching the gate sidewall spacers 472, the inner spacer 480, and the ILD layer 494, such that the gate sidewall spacers 472, the inner spacer 480, and the ILD layer 494 remain substantially intact when the high-k dielectric layer 530 is etched. In some embodiments, the second portions 534 of the high-k dielectric layer 530 are completely removed by the etching process, and the SAM 510 remains completely covering the gate sidewall spacers 472, the inner spacer 480, and the ILD layer 494.

Referring to FIGS. 43A and 43B, a plasma cleaning process is performed to remove the SAM 510. The power of the plasma cleaning process to remove the SAM 510 is in a range from about 1 w to about 600 w, which is able to remove SAM 510 but is not strong enough to remove the high-k dielectric layer 530 or the gate sidewall spacers 472 and the ILD layer 494. The gas utilized in the plasma cleaning process can be $Ar/H_2$ or $Ar/O_2$, the ratio thereof is about 1% to 100% (pure $O_2$ or $H_2$), the flowrate of the gas is about 1 sccm to about 1000 sccm.

Referring to FIGS. 44A and 44B, after the plasma etching process, the portions of the SAM 510 on the sidewalls of the gate sidewall spacers 372 (as shown in FIG. 43A) are removed to expose the gate sidewall spacers 472. Gaps G' are formed between the interfacial layer 520 and the gate sidewall spacers 472. The width of the gaps G' is substantially the same as the thickness of the SAM 510, which is about 0.5 nm to about 3 nm. In some embodiments, if the thickness of the SAM 510 is less than 0.5 nm, the gate sidewall spacers 472 cannot become hydrophobic, and the deposition selectivity between the gate sidewall spacers 472 and the interfacial layers 520 while depositing the high-k dielectric layer 530 may be insufficient. In some embodiments, if the thickness of the SAM 510 is greater than 30 nm, the gaps G' between the topmost interfacial layer 520 and the gate sidewall spacers 472 may be excessively wide and thus results in a negative impact on the performance of the GAA device.

In some embodiments, portions of the SAM 510 directly below the topmost second semiconductor layer 412a may be shadowed from the directional plasma ion beams by the topmost second semiconductor layer 412a, and thus remain on the sidewalls of the inner spacer 480 after the plasma etching process is performed. Namely, the portions of the SAM 510 directly below the topmost second semiconductor layer 412a are remained and the portions of the SAM 510 directly above the topmost second semiconductor layer 412a are removed after the plasma etching process is performed. However, the portions of the SAM 510 directly below the topmost second semiconductor layer 412a may be removed by controlling the tilted angle of directional plasma ion beams.

Each of the second semiconductor layers 412 is wrapped by the interfacial layer 520 and the high-k dielectric layer 530. In some embodiments, the high-k dielectric layers 530 deposited from respective interfacial layers 520 are merged.

Referring to FIGS. 45A and 45B, a metal gate structure 540 is formed in the trench between the gate sidewall spacers 472. The high-k dielectric layer 530 wraps around the second semiconductor layers 412 and is disposed between the bottom of the metal gate structure 540 and the topmost second semiconductor layer 412a. The high-k dielectric layer 530 is not present the sidewall of the gate sidewall spacers 472. That is, the metal gate structure 540 directly contacts the gate sidewall spacers 472, without the high-k dielectric layer 530 interposed therebetween.

In some embodiments, the metal gate structure 540 includes one or more work function metal layers and a metal gate electrode over the work function metal layers. In some embodiments, the gaps G' (as shown in FIG. 44A) between the interfacial layer 520 and the gate sidewall spacers 472 can be filled by the metal gate structure 540. In some other embodiments, the gaps G' between the interfacial layer 520 and the gate sidewall spacers 472 are not completely filled and voids remain below the metal gate structure 540.

Figure 46B:
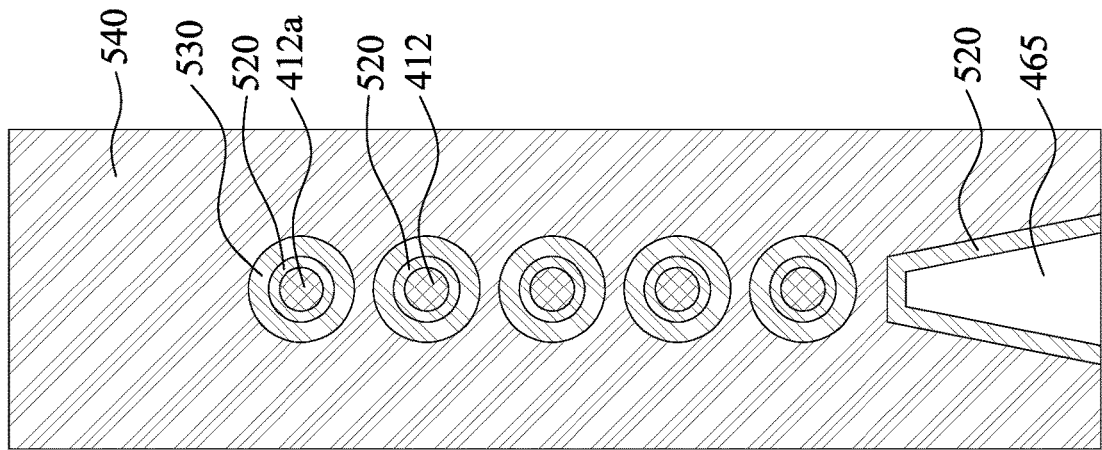
Figure 46A:
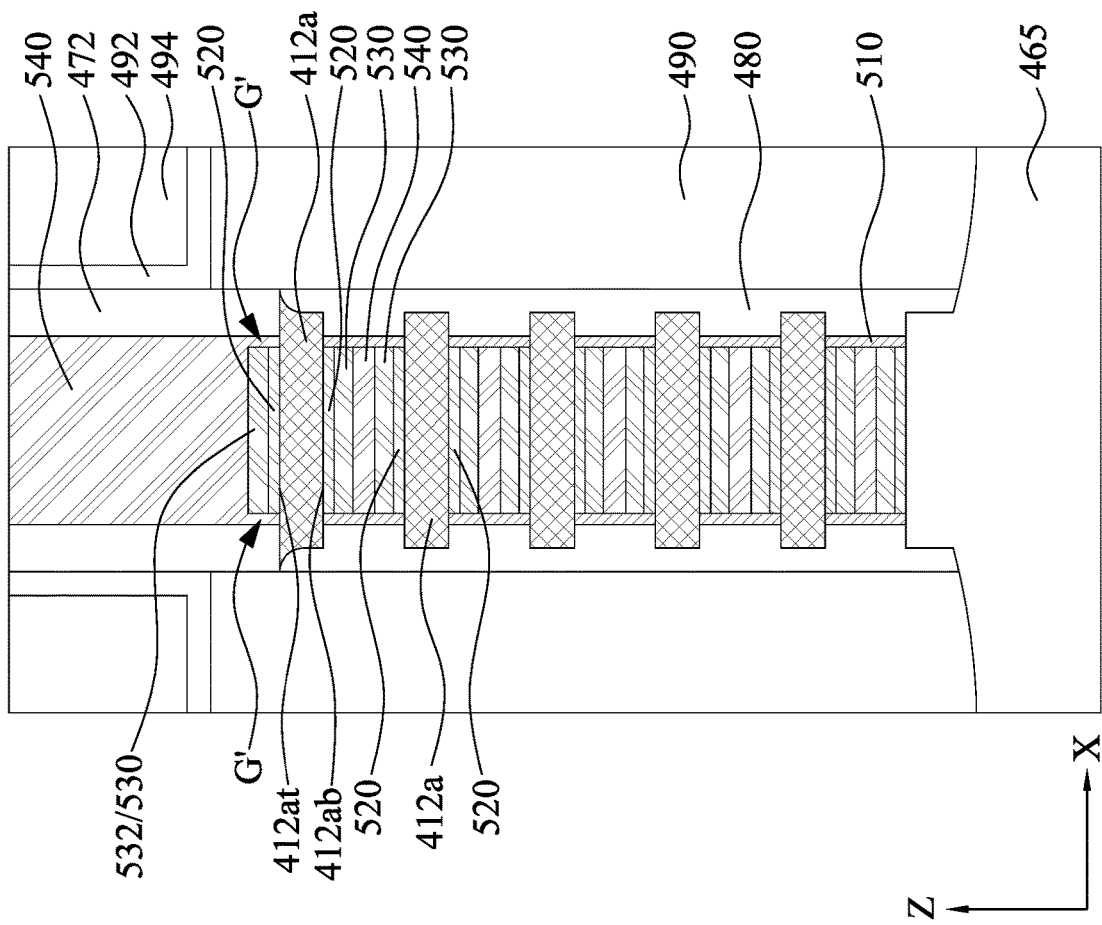

In yet other embodiments, as shown in FIGS. 46A and 46B, the high-k dielectric layers 530 are formed wrapping around the respective second semiconductor layers 412 and are spaced from each other, and thus the metal gate structure 540 is also filled between the second semiconductor layers 412.

Reference is made back to FIG. 45A. Regarding the topmost second semiconductor layer 412a, the interfacial layer 520 and the high-k dielectric layer 530 are formed surrounding the middle portion of the topmost second semiconductor layer 412a. At the top surface 412 at of the topmost second semiconductor layer 412a, portions of the metal gate structure 540 fill the gaps G' between the high-k dielectric layer 530 and the gate sidewall spacers 472. Namely, the metal gate structure 540 is directly in contact with the high-k dielectric layer 530 and the gate sidewall spacers 472, and also in contact with the interfacial layer 520. At the bottom surface 412ab of the topmost second semiconductor layer 412a, SAM 510 remains on the sidewall of the inner spacer 480 and is in between the high-k dielectric layer 530 and the inner spacer 480, and also in contact with the interfacial layer 520.

According to some embodiments of the disclosure, a high-k dielectric layer is deposited at a faster deposition rate on the interfacial layers than on the gate sidewall spacers having self-assembling monolayer thereon, such that the high-k dielectric layer on the interfacial layers is thicker than that on the gate sidewall spacers. The thickness of the high-k dielectric layer is then reduced to expose the gate sidewall spacers, such that the metal gate trench filling can be improved.

According to some embodiments of the disclosure, a method of manufacturing a semiconductor device includes removing a dummy gate structure to form a trench between a pair of spacers, in which a semiconductor fin is exposed. A self-assembling monolayer is formed on inner sidewalls of the spacers. The self-assembling monolayer has a hydrophobic surface. An interfacial layer is formed on the exposed semiconductor fin, in which the interfacial layer has a hydrophilic surface. A high-k dielectric layer is deposited in the trench, wherein a first portion of the high-k dielectric layer on the hydrophilic surface of the interfacial layer is thicker than a second portion of the high-k dielectric layer on the hydrophobic surface of the self-assembling monolayer. The second portion of the high-k dielectric layer is removed, while leaving the first portion of the high-k dielectric layer on the interfacial layer.

According to some embodiments of the disclosure, a semiconductor device includes a fin structure over a substrate, a metal gate structure extending across the fin structure, first and second spacers on opposite sidewalls of the metal gate structure, respectively, and a high-k dielectric layer between the gate structure and the fin structure, wherein the metal gate structure has a first portion laterally between the high-k dielectric layer and the first spacer.

According to some embodiments of the disclosure, a method of manufacturing a semiconductor device includes forming a fin structure comprising alternately stacked first semiconductor layers and second semiconductor layers over a substrate. A sacrificial gate structure is formed over the fin structure. Spacers are formed on either side of the sacrificial gate structure. The sacrificial gate structure is removed to form a trench between the spacers. The first semiconductor layers are removed from the trench, while leaving the second semiconductor layers suspended in the trench. A self-assembling monolayer is formed on sidewalls of the spacers in the trench. Interfacial layers are formed encircling the suspended second semiconductor layers, respectively. A high-k dielectric layer is deposited at a faster deposition rate on the interfacial layers than on the self-assembling monolayer. A metal gate structure is formed over the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of semiconductor layers arranged one above another;
   source/drain epitaxial regions on opposite sides of the plurality of semiconductor layers;
   a gate structure surrounding each of the plurality of semiconductor layers, the gate structure comprising interfacial layers respectively over the plurality of semiconductor layers, a high-k dielectric layer over the interfacial layers, and a gate metal over the high-k dielectric layer; and
   gate spacers spacing apart the gate structure from the source/drain epitaxial regions, wherein a top position of the high-k dielectric layer is lower than top positions of the gate spacers, and the high-k dielectric layer is spaced apart from one of the gate spacers by a void region.

2. The semiconductor device of claim 1, wherein the top position of the high-k dielectric layer is lower than a top position of the gate metal.

3. The semiconductor device of claim 1, wherein end surfaces of the high-k dielectric layer are respectively aligned with end surfaces of the interfacial layers.

4. The semiconductor device of claim 1, further comprising:
   a self-assembled-monolayer below a topmost one of the plurality of semiconductor layers.

5. The semiconductor device of claim 4, wherein the self-assembled-monolayer is in contact with a sidewall of the gate structure.

6. The semiconductor device of claim 1, wherein the high-k dielectric layer continuously extends from a bottommost one of the plurality of semiconductor layers to a topmost one of the plurality of semiconductor layers.

7. The semiconductor device of claim 1, wherein the gate structure comprises a plurality of the high-k dielectric layers respectively over the plurality of semiconductor layers, and the high-k dielectric layers are spaced apart from each other.

8. The semiconductor device of claim 1, wherein the gate metal is in contact with the gate spacers.

9. A semiconductor device, comprising:
   source/drain epitaxial structures over a substrate;
   a plurality of channel layers extending between the source/drain epitaxial structures;
   a gate structure wrapping around the plurality of channel layers, the gate structure comprising a high-k dielectric layer and a gate metal over the high-k dielectric layer;
   a first gate spacer between the gate structure and a first one of the source/drain epitaxial structures; and
   a second gate spacer between the gate structure and a second one of the source/drain epitaxial structures,
   wherein the high-k dielectric layer is spaced apart from the first gate spacer.

10. The semiconductor device of claim 9, wherein the gate metal interposes the high-k dielectric layer and the first gate spacer.

11. The semiconductor device of claim 9, wherein the high-k dielectric layer is spaced apart from the second gate spacer.

12. The semiconductor device of claim 11, wherein the gate metal interposes the high-k dielectric layer and the second gate spacer.

13. The semiconductor device of claim 9, wherein the high-k dielectric layer is spaced apart from the first gate spacer by a void.

14. The semiconductor device of claim 9, wherein the gate metal is in contact with end surfaces of the high-k dielectric layer.

15. A semiconductor device, comprising:
   a source region and a drain region spaced apart in a first direction over a substrate;
   a plurality of channel regions extending between the source region and the drain region;
   a high-k dielectric layer over the plurality of channel regions, wherein in a cross section taken along a second direction perpendicular to the first direction, the high-k dielectric layer continuously extending from below a bottommost one of the channel regions to above a topmost one of the channel regions;
   a gate metal over the high-k dielectric layer, wherein in a cross section taken along the first direction, the gate metal has a top surface higher than a top surface of the high-k dielectric layer; and
   gate spacers interfacing opposite sidewalls of the gate metal, wherein the gate spacers are separated from the high-k dielectric layer by void regions.

16. The semiconductor device of claim 15, wherein the gate spacers are separated from the high-k dielectric layer at least further by the gate metal.

17. The semiconductor device of claim 15, wherein in the cross section taken along the first direction, the gate metal wraps around three sides of the high-k dielectric layer.

18. The semiconductor device of claim 15, wherein in the cross section taken along the first direction, the high-k dielectric layer resembles a linear pattern.

19. The semiconductor device of claim 15, further comprising:
   a self-assembled-monolayer in contact with the plurality of channel regions.

20. The semiconductor device of claim 19, wherein the top surface of the high-k dielectric layer is higher than a top surface of the self-assembled-monolayer.

* * * * *